US009118352B2

(12) United States Patent
Limberg

(10) Patent No.: US 9,118,352 B2
(45) Date of Patent: Aug. 25, 2015

(54) REMEDYING LOW DENSITIES OF ONES IN TRANSMISSION AND RECEPTION OF DIGITAL TELEVISION SIGNALS

(71) Applicant: Allen LeRoy Limberg, Port Charlotte, FL (US)

(72) Inventor: Allen LeRoy Limberg, Port Charlotte, FL (US)

(*) Notice: Subject to any disclaimer, the term of this patent is extended or adjusted under 35 U.S.C. 154(b) by 139 days.

(21) Appl. No.: 13/727,268

(22) Filed: Dec. 26, 2012

(65) Prior Publication Data

US 2014/0177731 A1    Jun. 26, 2014

(51) Int. Cl.
| | |
|---|---|
| H03M 13/00 | (2006.01) |
| H03M 13/15 | (2006.01) |
| H03M 13/37 | (2006.01) |
| H03M 13/27 | (2006.01) |
| H03M 13/29 | (2006.01) |

(52) U.S. Cl.
CPC .......... *H03M 13/618* (2013.01); *H03M 13/152* (2013.01); *H03M 13/1515* (2013.01); *H03M 13/3707* (2013.01); *H03M 13/2721* (2013.01); *H03M 13/2966* (2013.01); *H03M 13/2972* (2013.01)

(58) Field of Classification Search
CPC ...... H03M 7/46; H03M 13/31; H03M 13/618
See application file for complete search history.

(56) References Cited

U.S. PATENT DOCUMENTS

| | | | | |
|---|---|---|---|---|
| 6,201,485 | B1* | 3/2001 | McEwen et al. | 341/59 |
| 6,285,302 | B1* | 9/2001 | McClellan | 341/59 |
| 6,490,243 | B1* | 12/2002 | Tanaka et al. | 370/216 |
| 7,149,955 | B1* | 12/2006 | Sutardja et al. | 714/809 |
| 7,764,323 | B2* | 7/2010 | Choi et al. | 348/723 |
| 8,539,301 | B2* | 9/2013 | Gong et al. | 714/753 |
| 2010/0131824 | A1* | 5/2010 | Kolze | 714/762 |
| 2011/0135039 | A1* | 6/2011 | Limberg | 375/340 |

* cited by examiner

*Primary Examiner* — Steve Nguyen

(57) ABSTRACT

In a DTV transmitter the bits of shortened BCH codewords that exhibit undesirably low densities of ONEs are ONEs' complemented before being further coded, and used to modulate carrier waves. In a DTV receiver the further coding is decoded after demodulation. The results of such decoding are processed to recover successive shortened BCH codewords, some of which are in TRUE form and others of which have had their bits ONEs' complemented. Each shortened BCH codeword is extended to full length with ZEROs, and decoding is attempted. Successful decoding confirms that the shortened BCH codeword was received in TRUE form. If decoding is unsuccessful, the bits of the shortened BCH codeword as received are ONEs' complemented, extended to full length with ZEROs, and decoding is attempted. Successful decoding confirms that the shortened BCH codeword was received in ONEs' complemented form and has subsequently been converted to TRUE form.

21 Claims, 46 Drawing Sheets

Remedying low densities of ONEs in transmission & reception of BCH-coded DTV signals Remedying low densities of ONEs in transmission & reception of BCH-coded DTV signals Remedying low densities of ONEs in transmission & reception of BCH-coded DTV signals Fig. 47 Procedure for Decoding Concatenated Coding Fig. 48 Procedure for Decoding Concatenated Coding Fig. 49 Procedure to Correct RS Codeword Selection

REMEDYING LOW DENSITIES OF ONES IN TRANSMISSION AND RECEPTION OF DIGITAL TELEVISION SIGNALS

The benefit of the filing dates of provisional U.S. Pat. App. Ser. No. 61/631,180 filed 28 Dec. 2011 and of provisional U.S. Pat. App. Ser. No. 61/631,834 filed on 12 Jan. 2012 is claimed.

FIELD OF THE INVENTION

Various aspects of the invention, which concerns remedying low densities of ONEs in packets of digital data for broadcasting, relate to systems of over-the-air broadcasting of digital television (DTV) signals, to transmitters for such systems and to receivers for such systems.

BACKGROUND OF THE INVENTION

DTV broadcasting in the United States of America has been done in accordance with broadcasting standards formulated by an industry consortium called the Advanced Television Systems Committee (ATSC). ATSC published a Digital Television Standard in 1995 that employed 8-level vestigial-sideband amplitude modulation of a single radio-frequency (RF) carrier wave. This DTV transmission system is referred to as 8VSB. In the beginning years of the twenty-first century efforts were made to provide for more robust transmission of data over broadcast DTV channels without unduly disrupting the operation of so-called "legacy" DTV receivers already in the field. These efforts culminated in an ATSC standard directed to broadcasting digital television and digital data to mobile receivers being adopted on 15 Oct. 2009. This subsequent standard also used 8-level vestigial-sideband amplitude modulation of a single RF carrier wave, so the more robust transmission of data could be time-division multiplexed with the transmission of DTV signal to so-called "legacy" DTV receivers already in the field.

DTV broadcasting in Europe has employed coded orthogonal frequency-division multiplexing (COFDM) that employs a multiplicity of RF carrier waves closely spaced across each 6-, 7- or 8-MHz-wide television channel, rather than a single RF carrier wave per television channel. Adjacent carrier waves are orthogonal to each other. Successive multi-bit symbols are selected from a serial data stream and used to modulate respective ones of the multiplicity of RF carrier waves in turn, in accordance with a conventional modulation scheme—such as quaternary phase shift keying (QPSK) or quadrature amplitude modulation (QAM). QPSK is preferably DQPSK, using differential modulation that is inherently insensitive to slowly changing amplitude and phase distortion. DPSK simplifies carrier recovery in the receiver. Customarily, the QAM is either 16QAM or 64QAM using square 2-dimensional modulation constellations. In actual practice, the RF carrier waves are not modulated individually. Rather, a single carrier wave is modulated at high symbol rate using QPSK or QAM. The resulting modulated carrier wave is then transformed in an inverse fast discrete Fourier transform (I-DFT) procedure to generate the multiplicity of RF carrier waves each modulated at low symbol rate.

In Europe, broadcasting to hand-held receivers was done using a system referred to as DVB-H. DVB-H (Digital Video Broadcasting-Handheld) is a digital broadcast standard for the transmission of broadcast content to handheld receivers, published in 2004 by the European Telecommunications Standards Institute (ETSI) and identified as EN 302304. DVB-H, as a transmission standard, specifies the physical layer as well as the elements of the lowest protocol layers. It uses a power-saving technique based on the time-multiplexed transmission of different services. The technique, called "time slicing", allows substantial saving of battery power. Time slicing allows soft hand-over as the receiver moves from network cell to network cell. The relatively long power-save periods may be used to search for channels in neighboring radio cells offering the selected service. Accordingly, at the border between two cells, a channel hand-over can be performed that is imperceptible by the user. Both the monitoring of the services in adjacent cells and the reception of the selected service data can utilize the same front end.

In contrast to other DVB transmission systems, which are based on the DVB Transport Stream adopted from the MPEG-2 standard, the DVB-H system is based on Internet Protocol (IP). The DVB-H baseband interface is an IP interface allowing the DVB-H system to be combined with other IP-based networks. Even so, the MPEG-2 transport stream is still used by the base layer. The IP data are embedded into the transport stream using Multi-Protocol Encapsulation (MPE), an adaptation protocol defined in the DVB Data Broadcast Specification. At the MPE level, DVB-H employs an additional stage of forward error correction called MPE-FEC, which is essentially (255, 191) transverse Reed-Solomon (TRS) coding. This TRS coding reduces the S/N requirements for reception by a handheld device by a 7 dB margin compared to DVB-T. The block interleaver used for the TRS coding creates a specific frame structure, called the "FEC frame", for incorporating the incoming data of the DVB-H codec.

The physical radio transmission of DVB-H is performed according to the DVB-T standard and employs coded orthogonal frequency division multiplexed (COFDM) multi-carrier modulation. DVB-H uses only a fraction (e.g., one quarter) of the digital payload capacity of the RF channel. DVB-H uses two-dimensional Reed-Solomon coding of randomized data followed by convolutional coding in generating signal for mapping to QAM symbol constellations that modulate COFDM carriers. Reed-Solomon (RS) coding is a special case of Bose-Chaudhuri-Hocquenghem (BCH) coding that uses multiple-bit symbols. DVB-T employs COFDM in which an 8 MHz-wide radio-frequency (RF) channel comprises approximately 2000 or approximately 8000 evenly-spaced carriers for transmitting to stationary DTV receivers. DVB-T2, a replacement for DVB-T proposed in 2011, further permits approximately 4000 evenly-spaced carrier waves better to accommodate transmitting to mobile receivers. DVB-T2 uses BCH coding of randomized data followed by low-density parity-check (LDPC) coding to generate signal for mapping to QAM symbol constellations that modulate COFDM carriers.

COFDM has been considered more than once for DTV broadcasting in the United States of America. It was considered as a replacement for 8VSB at the time that the ATSC Digital Television Standard was updated to permit more robust transmissions for reception by mobile receivers. At that time any technical advantages of COFDM were overridden by the need not to obsolete DTV receivers already in the field, lest advertising-supported over-the-air DTV fail as a commercially viable business. The invention, which concerns remedying low densities of ONEs in packets of digital data that are to be coded for broadcasting, can be employed in DTV broadcasting whether COFDM of multiple RF carriers or 8VSB amplitude-modulation of a single RF carrier is used. The detailed description of the invention infra refers particularly to a DTV broadcast system employing COFDM, since it is more likely that COFDM will be reconsidered as a replacement for 8VSB DTV broadcasting in the USA than changes will be made in 8VSB DTV broadcasting which would obsolete DTV receivers already in the field.

Packets of digital data for DTV broadcasting quite often include long sequences of ZEROs. Low densities of ONEs in packets of digital data for DTV broadcasting tend to cause problems with generating codewords with large Hamming distances—i.e., codewords that differ in so many bit-places from each other as to be distinguishable readily one from another. Codewords with large Hamming distances are better received than codewords with smaller Hamming distances during reception over Rayleigh channels. A customary approach taken to overcome low densities of ONEs in digital data is to exclusive-OR a pseudo-random binary sequence of some length with the digital data in serial-bit form. Such procedure converts long sequences of ZEROs in packets of digital data to mixed ONEs and ZEROs. Packets of digital data for DTV broadcasting are unlikely to be particularly correlated with the pseudo-random binary sequence that they are exclusive-ORed with, so the resulting randomized digital data is unlikely to include long sequences of ZEROs.

Any long sequences of ZEROs that do remain, however, can be eliminated by ONEs' complementing just the packets of digital data containing them. If the bits of only selected packets of digital data are ONEs' complemented, the transmitter has to signal the receiver which packets of digital data have their bits ONEs' complemented. It would be desirable that such signaling use as little as possible of the digital bandwidth available for transmissions, but at the same time provide signaling that is highly reliable.

The reader should note that COFDM transmitters broadcasting according to DVB-T and DVB-H standards employ (204, 188) Reed-Solomon coding of digital data packets as an outer coding procedure performed before byte-interleaving and subsequent inner coding. This is analogous to the (207, 187) Reed-Solomon coding of digital data packets as an outer coding procedure that 8VSB DTV transmitters employ before byte-interleaving and subsequent inner coding. The RS coding of digital data packets as an outer coding procedure prior to byte-interleaving and subsequent inner coding is an essential ingredient in the remedy for low densities of ONEs in packets of digital data that is to be described.

Reed-Solomon codewords that are not shortened have an interesting property in that, when all their bits are ONEs' complemented, other Reed-Solomon codewords result. So, if the channel symbols have been inverted somewhere along the line, the RS decoders will still operate. The result of decoding will be the complement of the original data. This code property, which has been referred to as "transparency", is lost when the Reed-Solomon (RS) code is shortened. The "missing" or "virtual" bits in a RS shortened code need all to be filled either by ONEs or by ZEROs, depending on whether the data is ONEs' complemented or not. To put it more precisely, if the symbols in a shortened RS code are inverted, then the "virtual" bits that were ZEROs need to be inverted to "virtual" bits that are ONEs when decoding the shortened RS codes. Conventional wisdom is that therefore it is mandatory that the sense of the data (i.e., TRUE or complemented) be resolved before decoding shortened RS codes.

Unless shortened, BCH codewords in general are "transparent", so that when all their bits are ONEs' complemented, other BCH codewords result. "Transparency" is lost when the BCH code is shortened. In order to regenerate a full and complete BCH codeword for decoding purposes, the "missing" or "virtual" bits in a shortened BCH code need all to be filled either by ONEs or by ZEROs, depending on whether the data is ONEs' complemented or not. To put it more precisely, if the symbols in a shortened BCH code are inverted, then the "virtual" bits that were ZEROs need to be inverted to "virtual" bits that are ONEs when decoding the shortened RS codes. Still more generally considered, the "virtual" bits in a shortened BCH code can be any binary code or the ONEs' complement of that binary code, depending on whether the data is ONEs' complemented or not. In this specification and its claims, filling all the "missing" or "virtual" bits in a shortened BCH code by ZEROs is referred to as "ZEROs-fill technique", and filling all the "missing" or "virtual" bits in a shortened BCH code by ONEs is referred to as "ONEs-fill technique".

SUMMARY OF THE INVENTION

A DTV transmitter embodying an aspect of the invention determines which packets of digital data need to have their bits ONEs' complemented to raise the densities of ONEs therein. The transmitter defers ONEs' complementing of the bits of each packet in such need until after the data packet has been BCH-coded and is part of a shortened BCH codeword. Then, ONEs' complementing of the bits of the data packet is done as part of the ONEs' complementing of the bits of the entire shortened BCH codeword. The "virtual" bits that the receiver will need to join with the shortened BCH codeword in order to correct it signals the receiver as to whether or not the bits of a packet of data are ONEs' complemented. Such "virtual" signaling does not further reduce the payload in the digital transmission. The shortened BCH codewords are shortened RS codewords in DTV transmitters embodying the invention in certain of its aspects.

A DTV receiver embodying an aspect of the invention attempts to decode shortened BCH codewords that are recovered from transmissions made by a DTV transmitter as described in the previous paragraph. The DTV receiver employs both ZEROs-fill and ONEs-fill techniques to extend the shortened BCH codewords to full-length BCH codewords for decoding. The bits of data packets from full-length BCH codewords that can be successfully decoded are then ONEs' complemented or not, depending on whether decoding was successfully accomplished using ONEs-fill technique or using ZEROs-fill technique.

Alternative DTV receivers embodying further aspects of the invention attempt to decode shortened BCH codewords that are recovered from transmissions made by a DTV transmitter as described supra, but do not attempt to decode those codewords using a ONEs-fill technique. A ZEROs-fill technique is used to extend the shortened BCH codewords to full-length BCH codewords for decoding. At least those shortened BCH codewords that cannot thus be successfully decoded have their bits ONEs' complemented and subsequently using a ZEROs-fill technique are extended to full-length BCH codewords for decoding. Presuming the shortened BCH codewords were not corrupted during their transmission, one or the other of these procedures for decoding the shortened BCH codewords will generate decoding results that are indicated to be correct. The decoding results that are indicated to be correct are forwarded for further processing within the DTV receiver.

BRIEF DESCRIPTION OF THE DRAWING FIGURES

FIGS. 1 and 2 together provide a schematic diagram of a portion of a COFDM transmitter for a DTV system, which transmitter is capable of transmitting turbo-coded data packets twice, at times separated by a second or more, for iterative-diversity reception by stationary DTV receivers.

FIGS. 3 and 4 together provide a schematic diagram of a further portion of the COFDM transmitter for a DTV system, which transmitter is capable of transmitting FEC-coded data packets twice, at times separated by a second or more, for iterative-diversity reception by mobile and hand-held DTV receivers.

Figure 1:
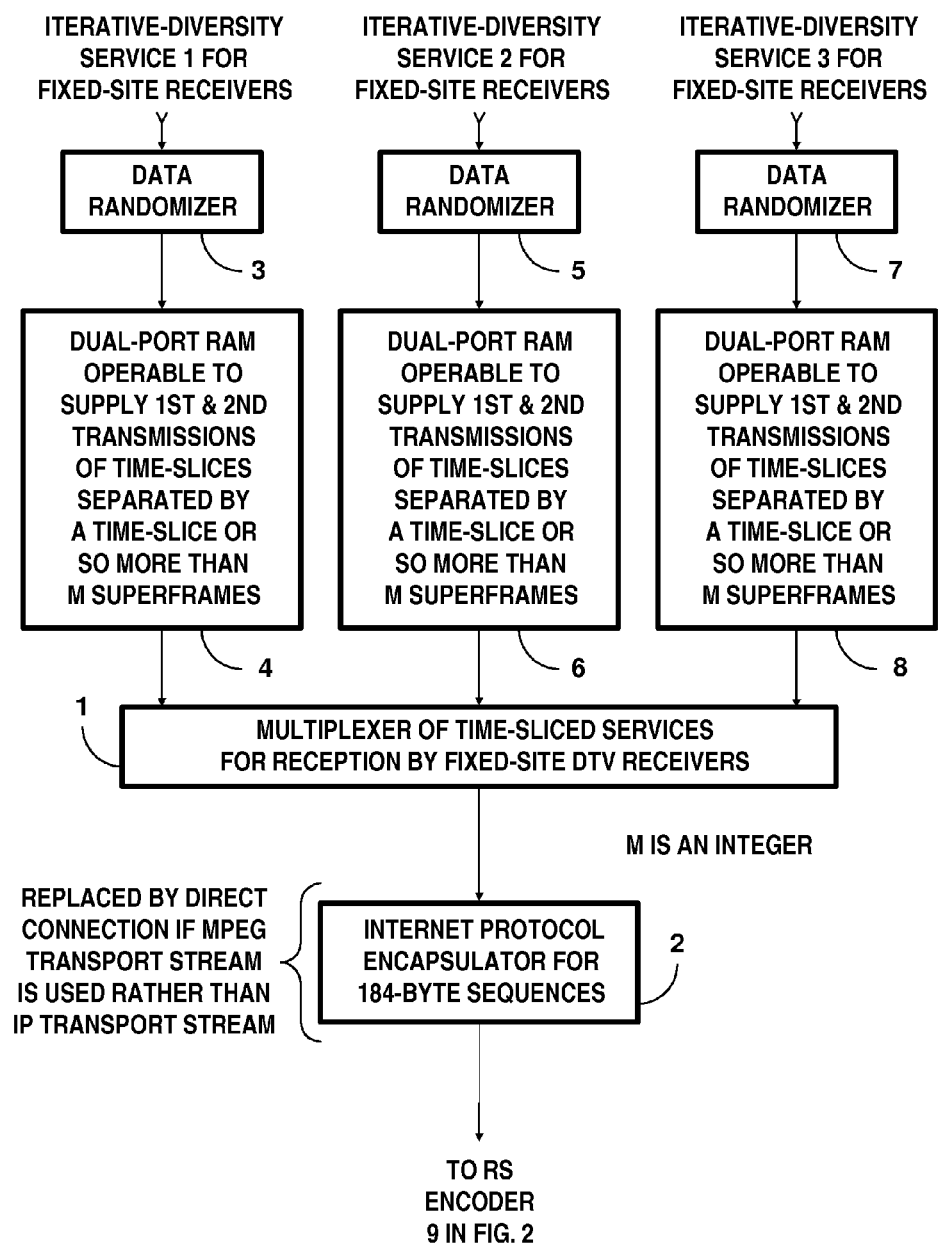
Figure 2:
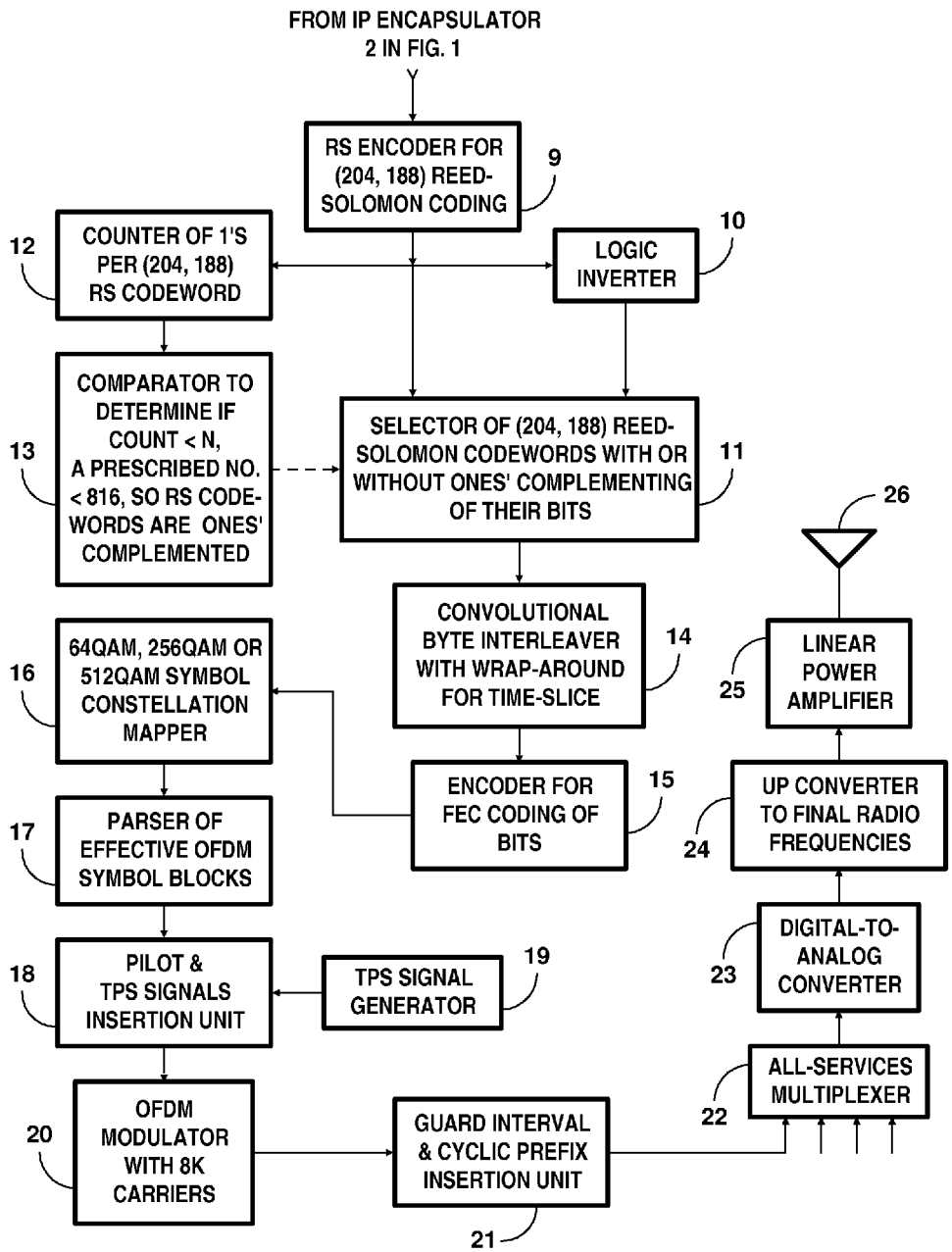
Figure 11:
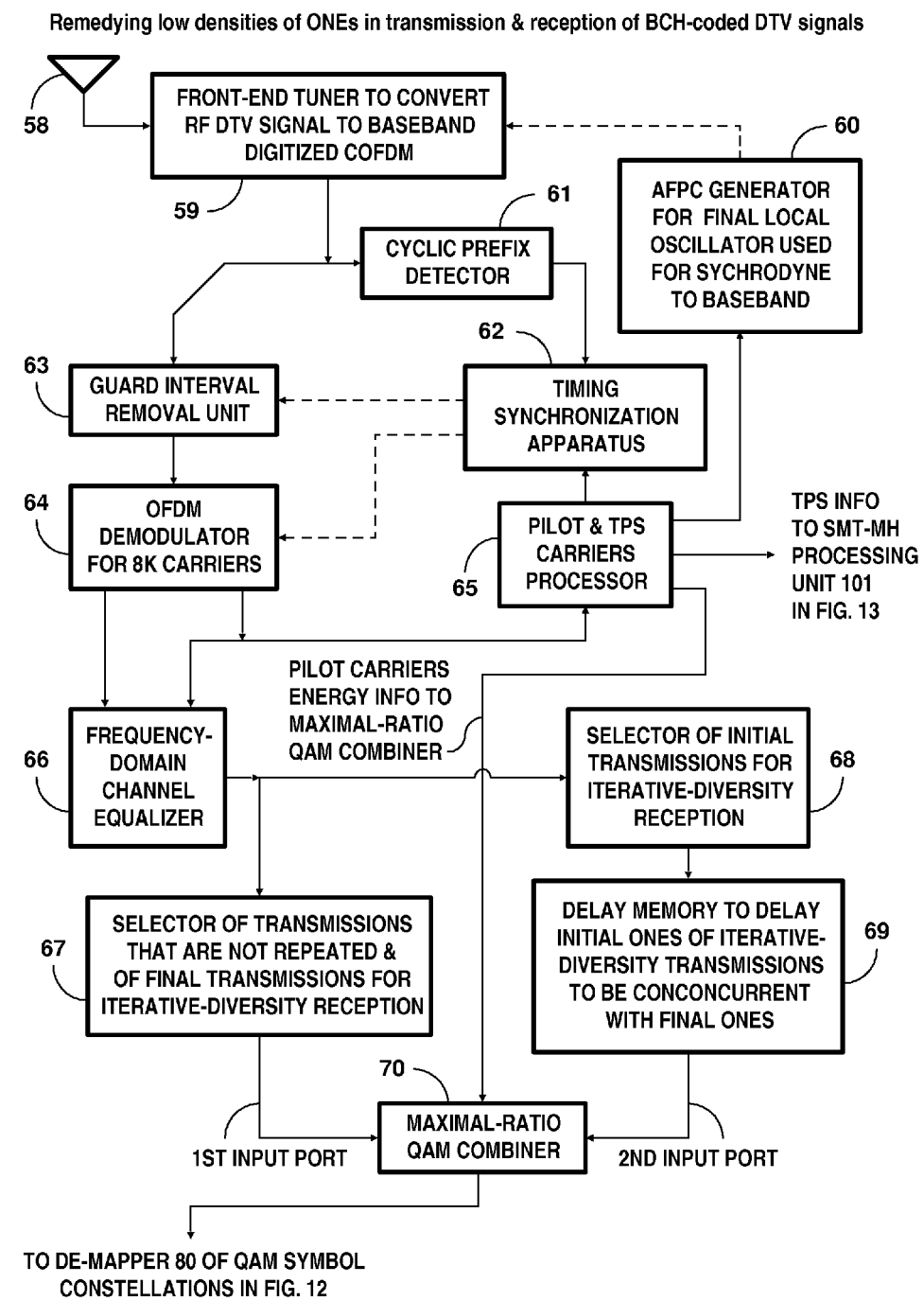
Figure 12:
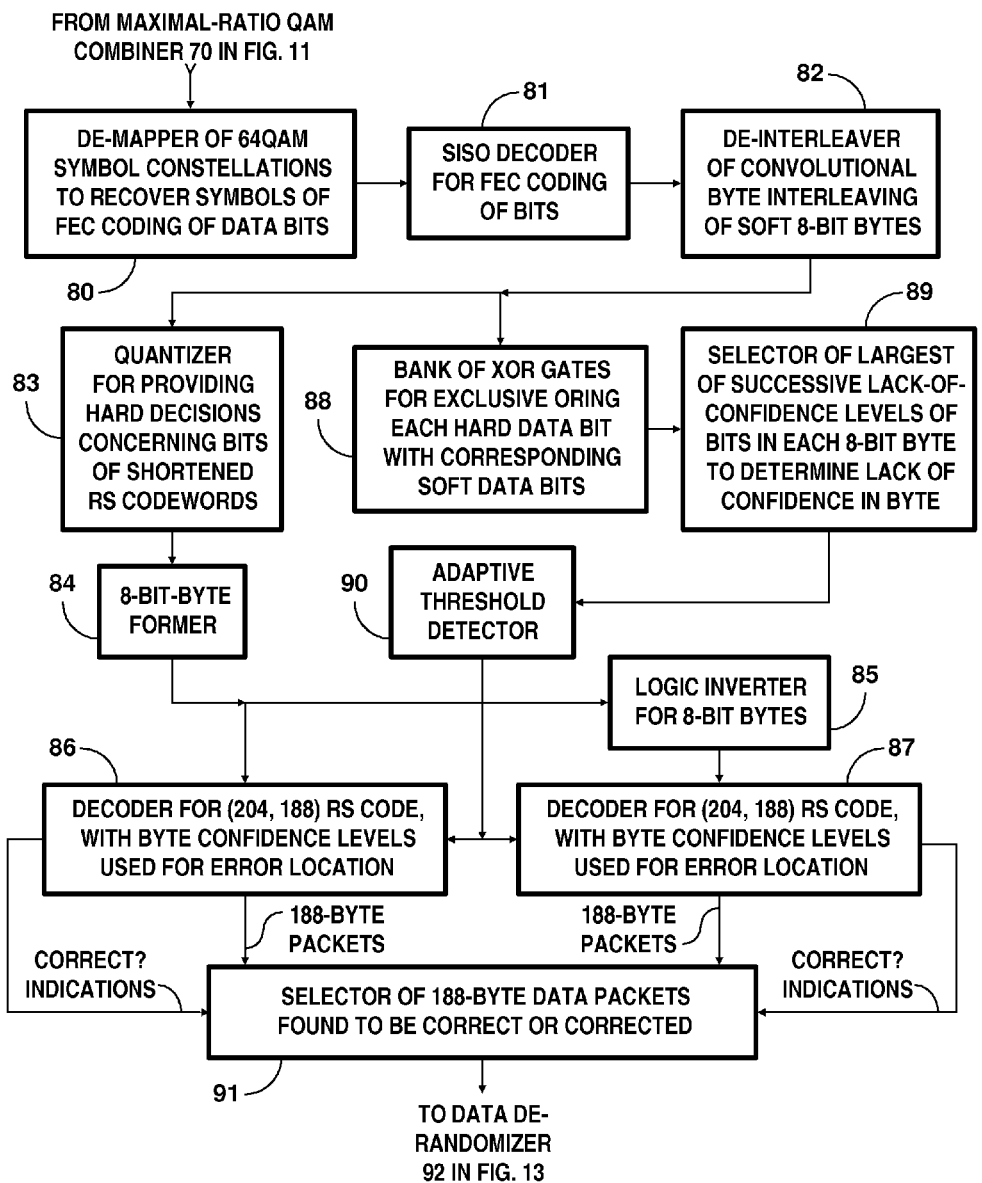
Figure 13:
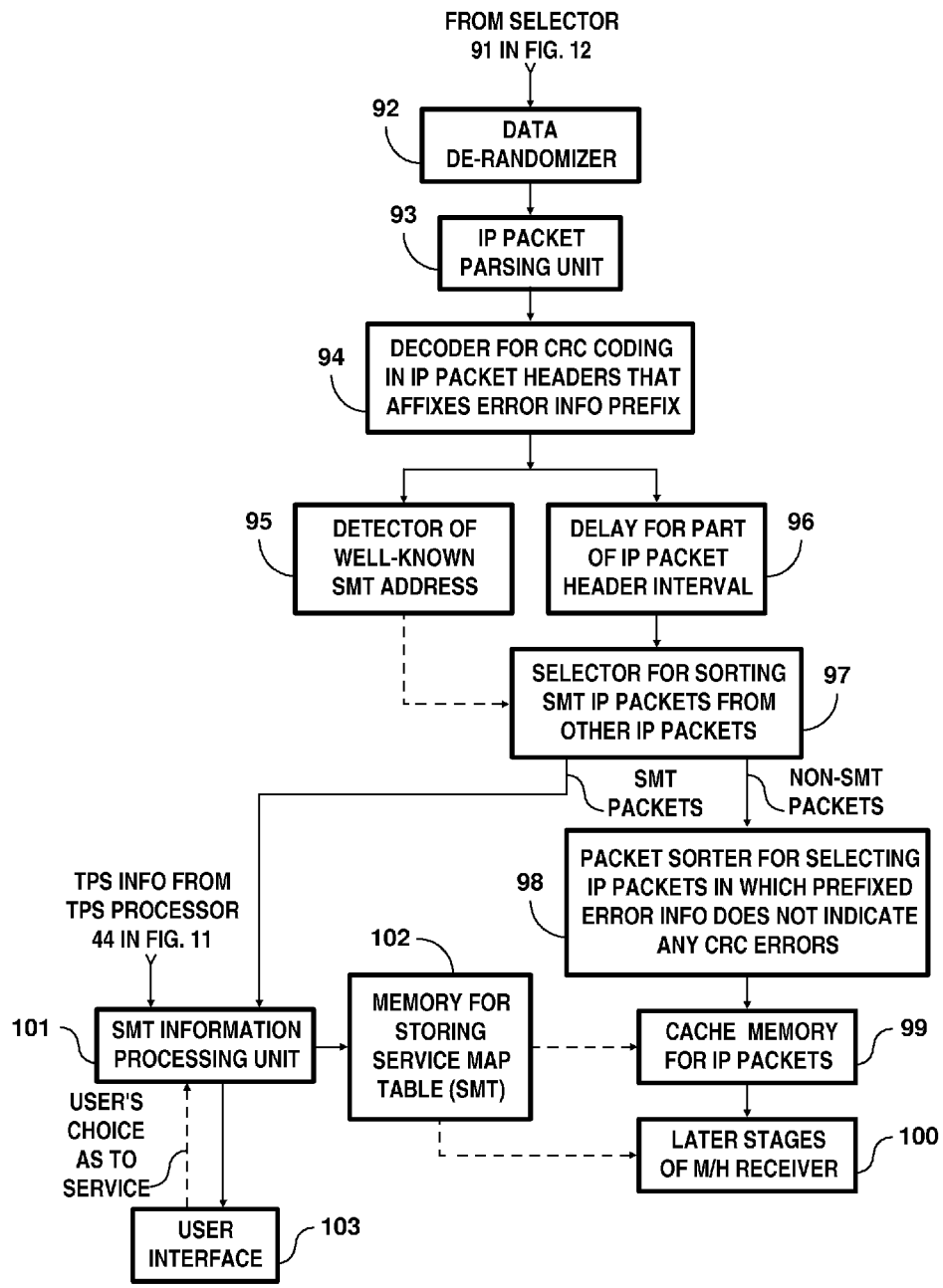

FIGS. 11, 12 and 13 successively combine to provide a generic schematic diagram of receivers for iterative-diversity reception of COFDM signals as transmitted by a DTV transmitter as depicted in FIG. 1, FIG. 2 and any one of FIGS. 5 through 9, which receivers are designed for stationary reception and embody aspects of the invention.

Figure 3:
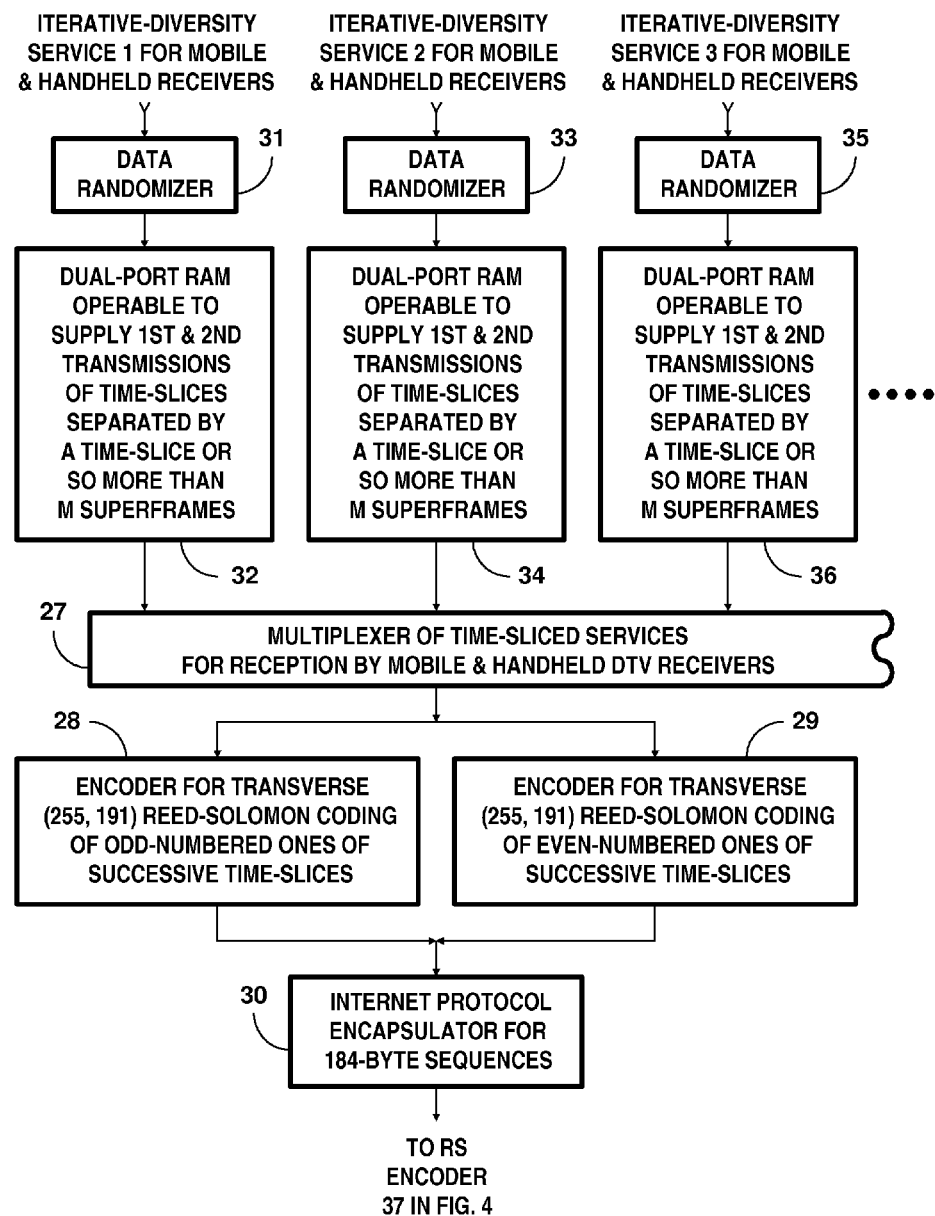
Figure 4:
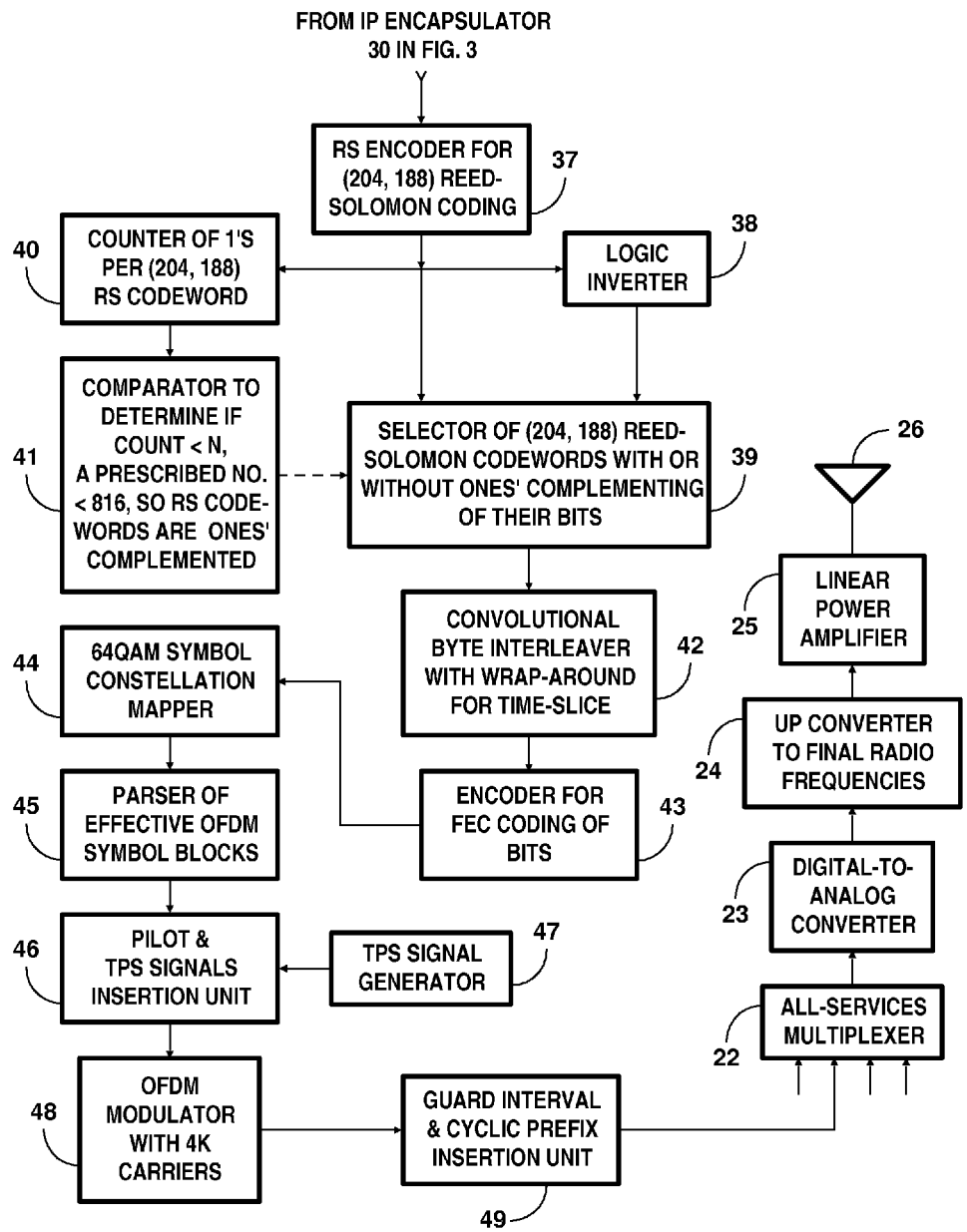

FIGS. 14, 15, 16 and 13 successively combine to provide a generic schematic diagram of receivers for iterative-diversity reception of COFDM signals as transmitted by a DTV transmitter as depicted in FIG. 3, FIG. 4 and any one of FIGS. 5 through 9, which receivers are designed for mobile reception and embody aspects of the invention.

Figure 14:
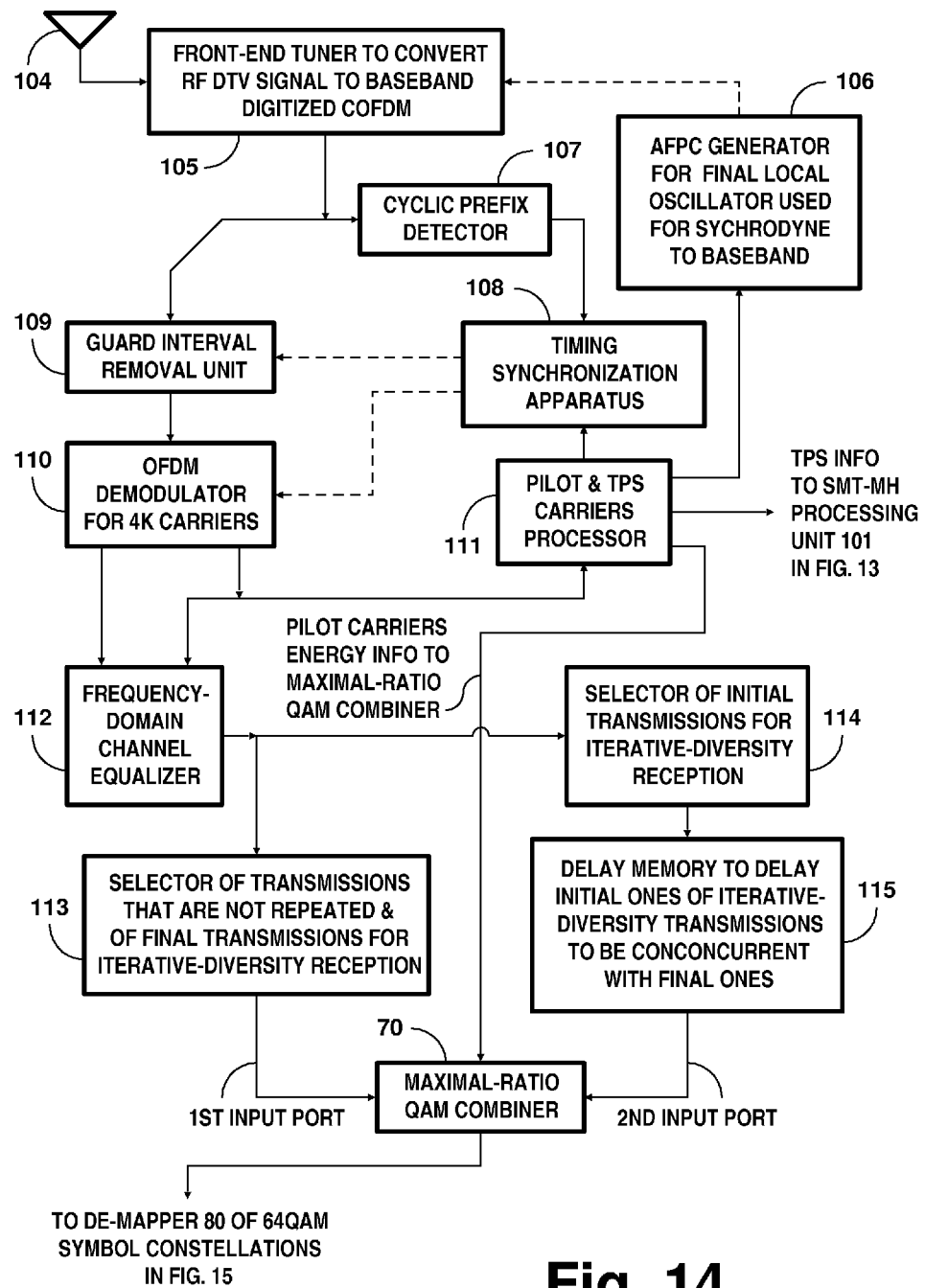
Figure 17:
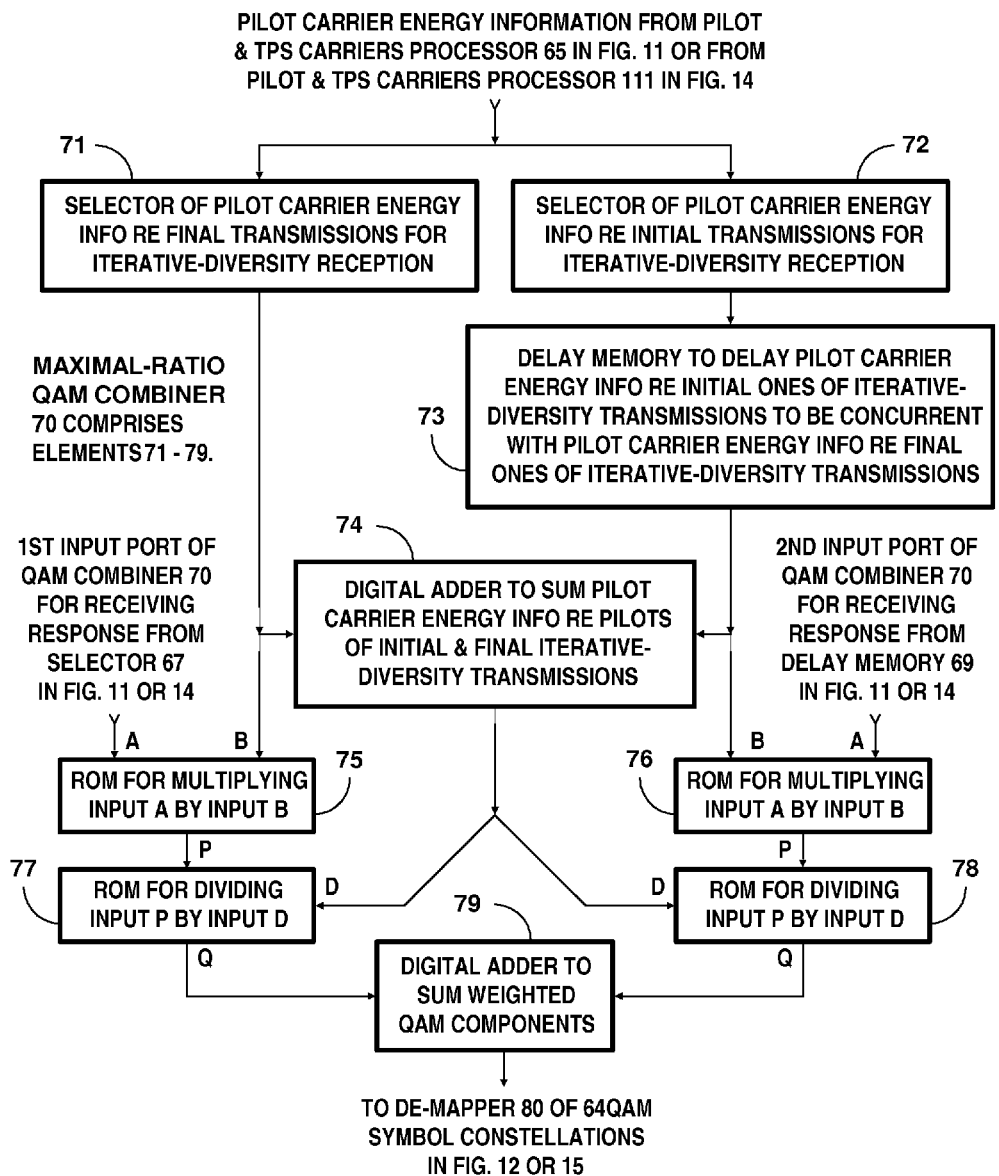

FIG. 17 is a detailed schematic diagram of a maximal-ratio QAM combiner shown in FIG. 11 and in FIG. 14, which QAM combiner is used during iterative-diversity reception to combine complex coordinates of 64QAM symbol constellations from initial and final transmissions of DTV data.

Figure 18:
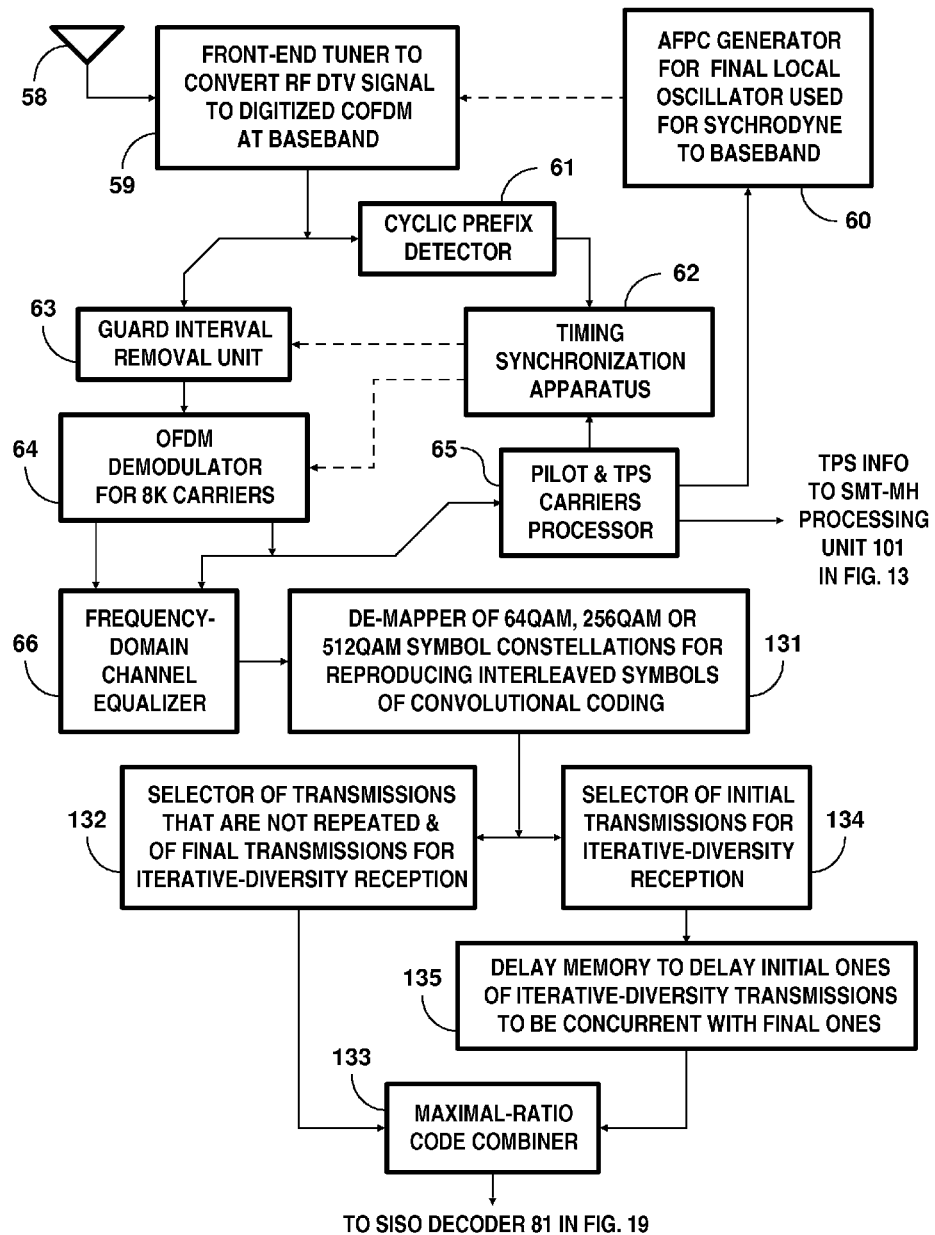
Figure 19:
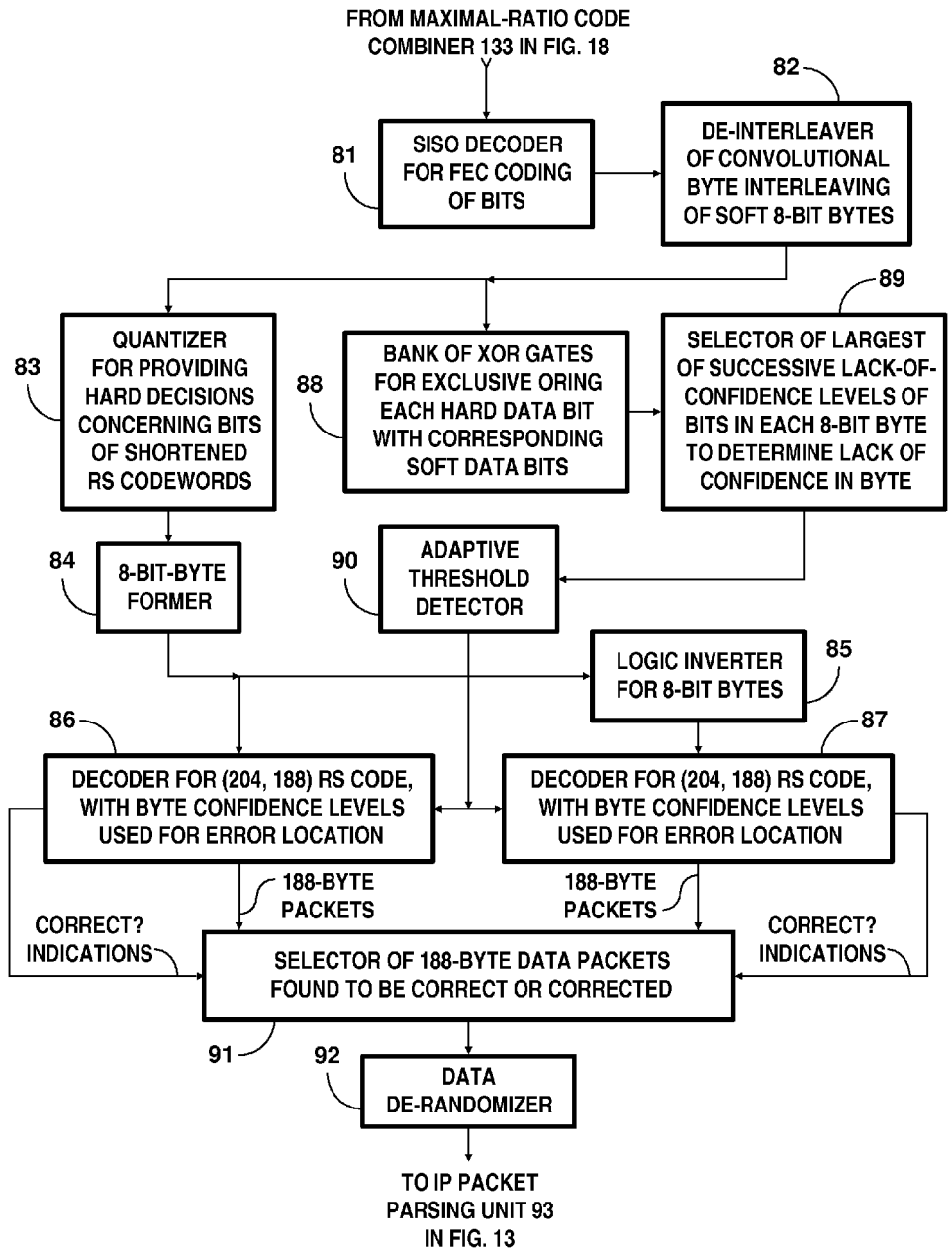

FIGS. 18 and 19 successively combine with FIG. 13 thereafter to provide a generic schematic diagram of further receivers for iterative-diversity reception of COFDM signals as transmitted by a DTV transmitter as depicted in FIG. 1, FIG. 2 and any one of FIGS. 5 through 9, which receivers are designed for stationary reception and embody aspects of the invention.

Figure 16:
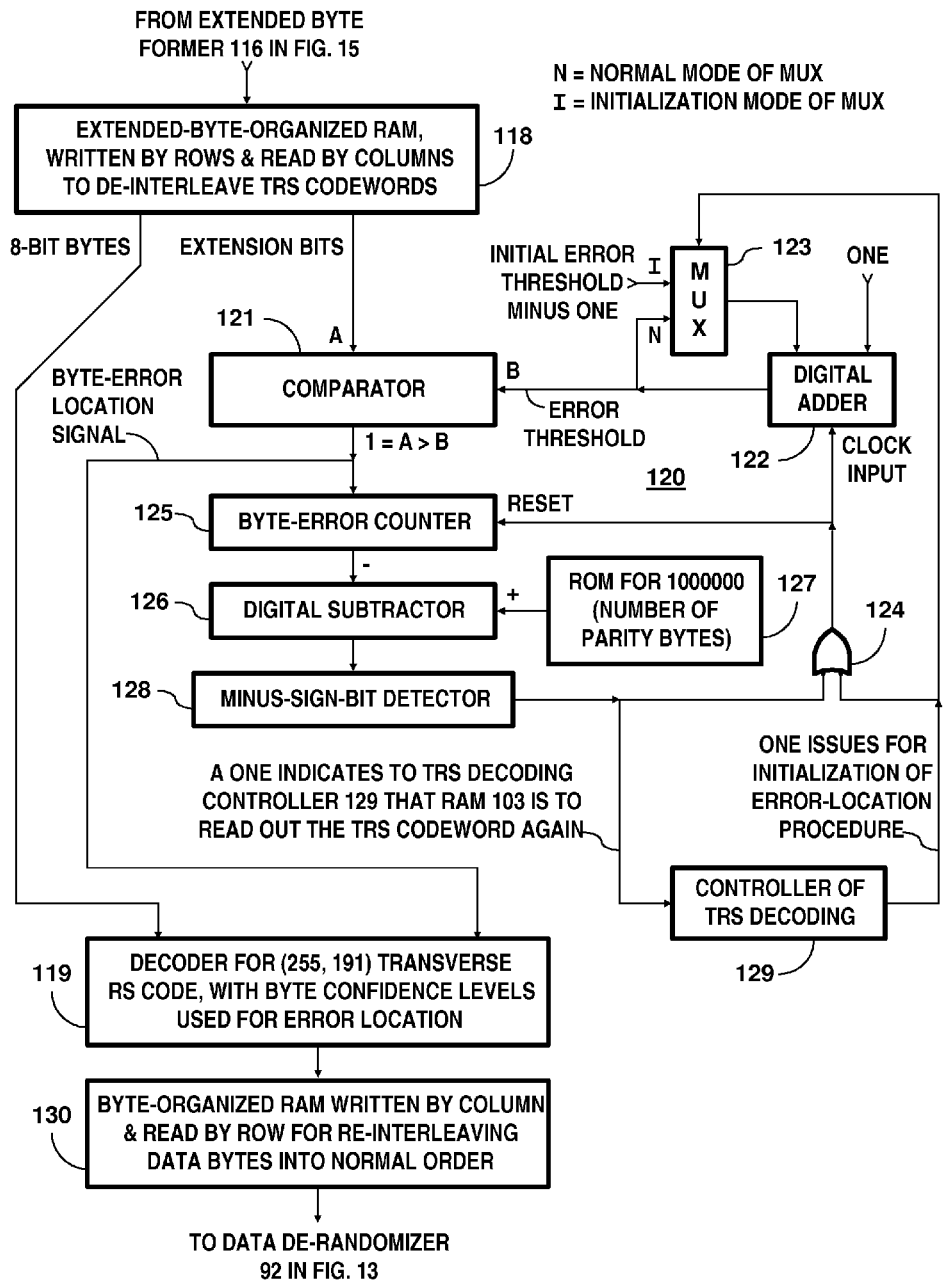
Figure 20:
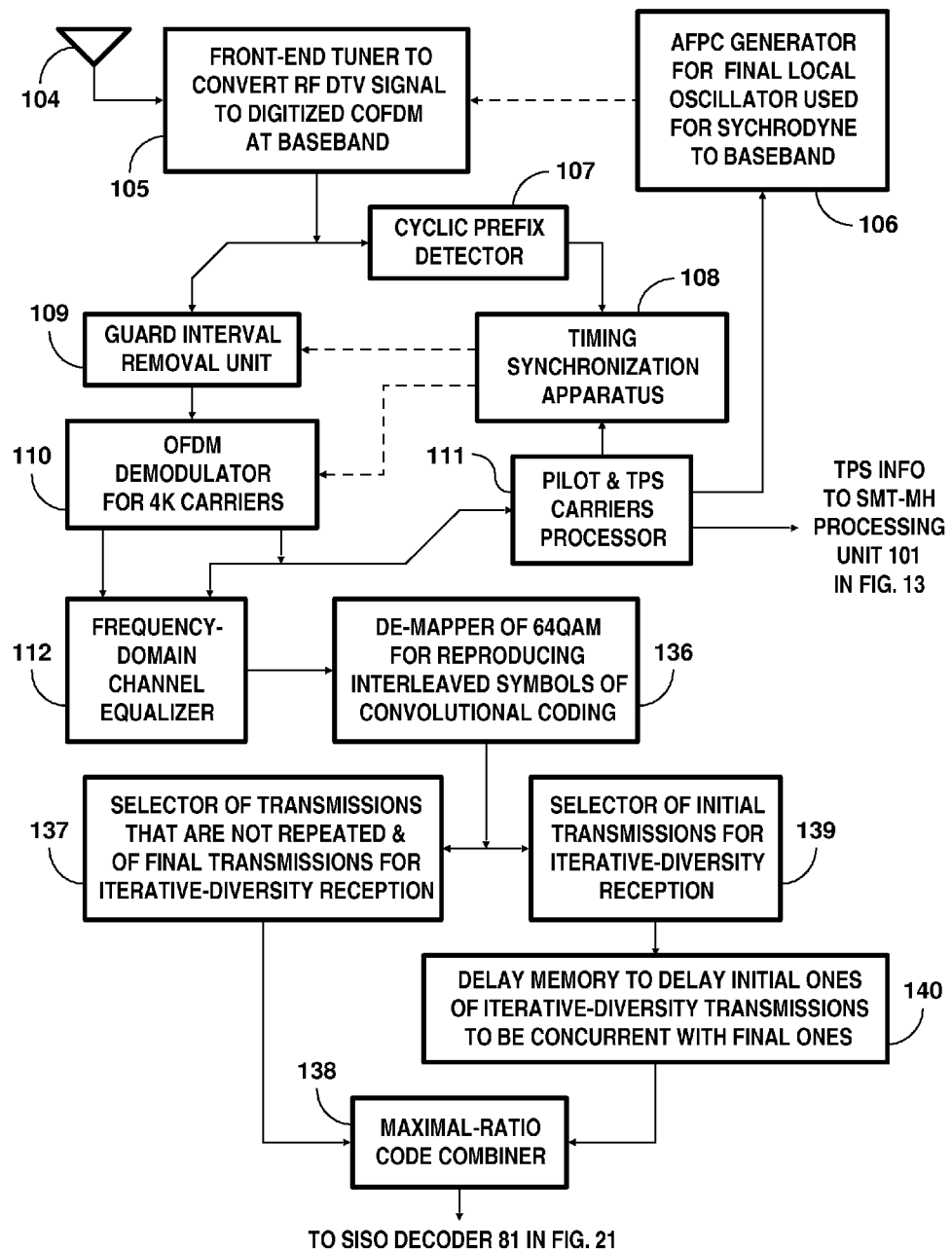
Figure 21:
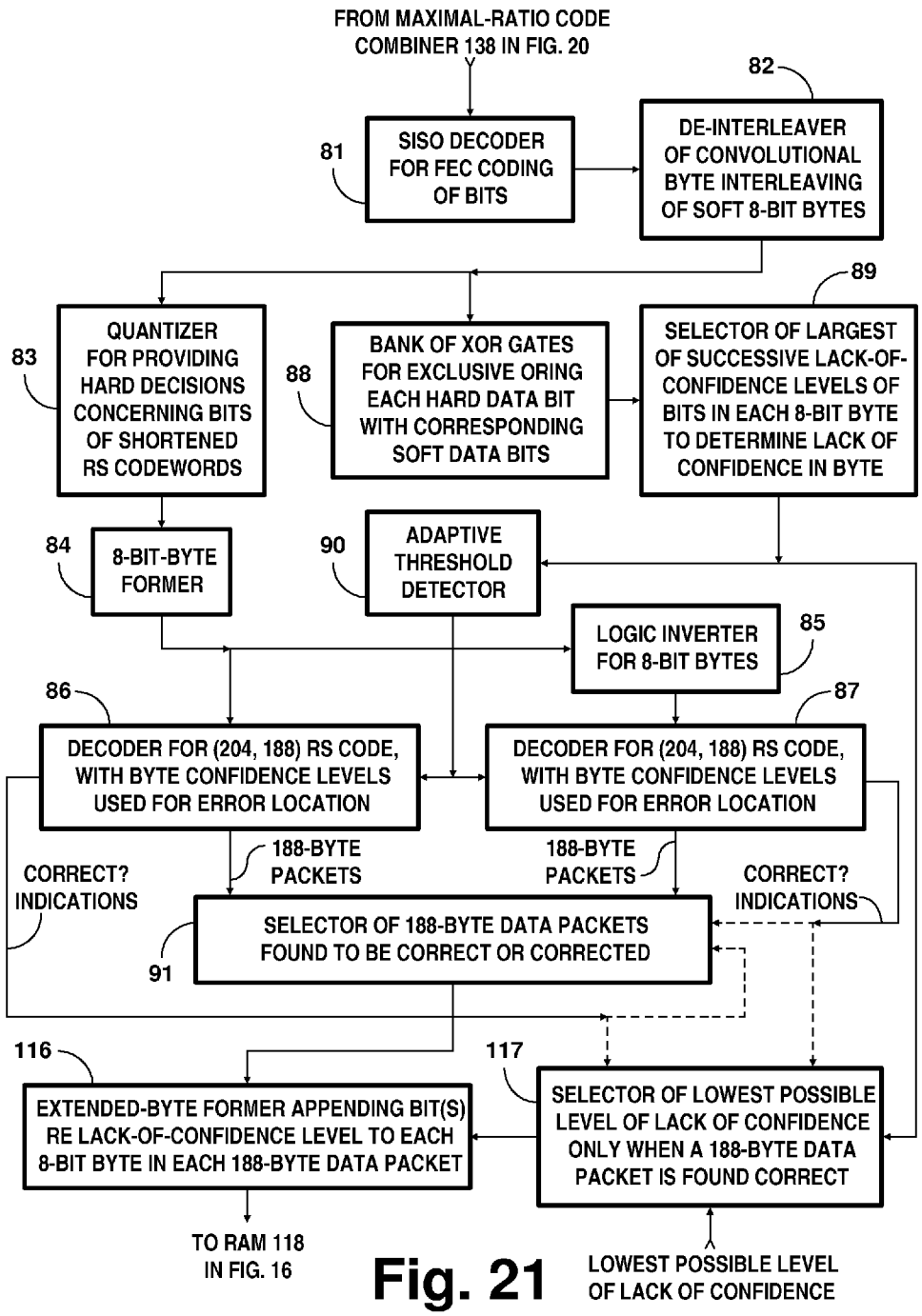

FIGS. 20 and 21 successively combine with FIGS. 16 and 13 thereafter to provide a generic schematic diagram of further receivers for iterative-diversity reception of COFDM signals as transmitted by a DTV transmitter as depicted in FIG. 3, FIG. 4 and any one of FIGS. 5 through 9, which receivers are designed for mobile reception and embody aspects of the invention.

FIGS. 22, 23, 24, 25 and 26 illustrate soft-input/soft-output decoders for various species of FEC coding, any one of which sorts of decoders can be used in the FIG. 12, FIG. 15, FIG. 19 and FIG. 21 portions of a COFDM receiver for a DTV system embodying aspects of the invention.

Figure 10:
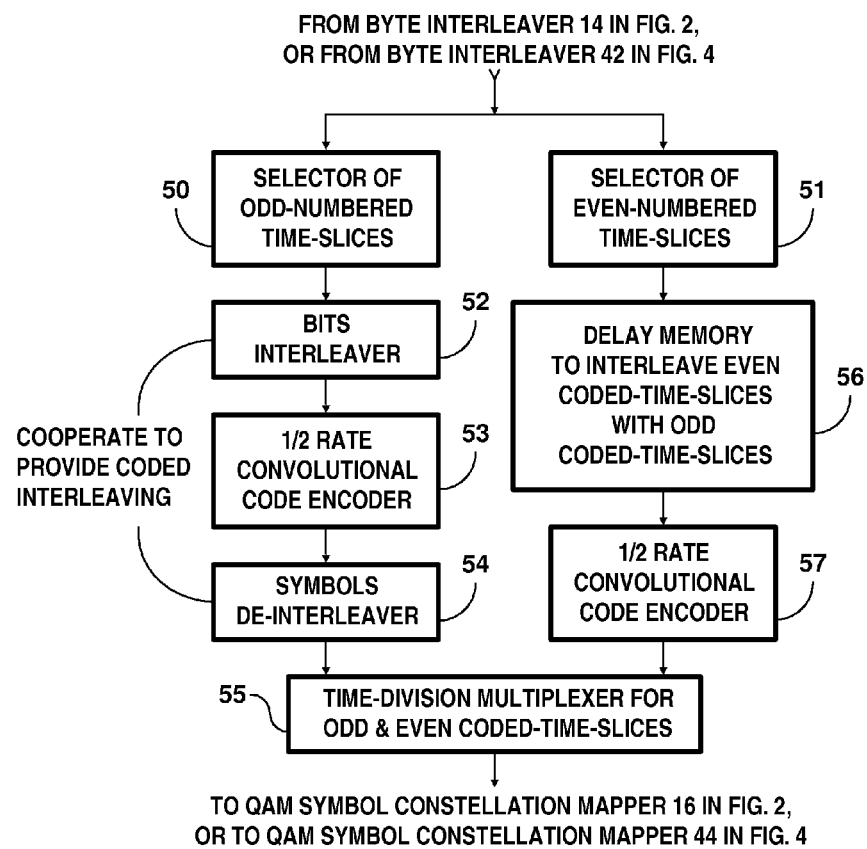
FIG. 10 is a schematic diagram of a sort of encoder for forward-error-coding bits of data packets transmitted twice, at times separated by a second or more, which further sort of encoder can be used in the FIG. 2 and FIG. 4 portions of a COFDM transmitter for a DTV system.
Figure 27:
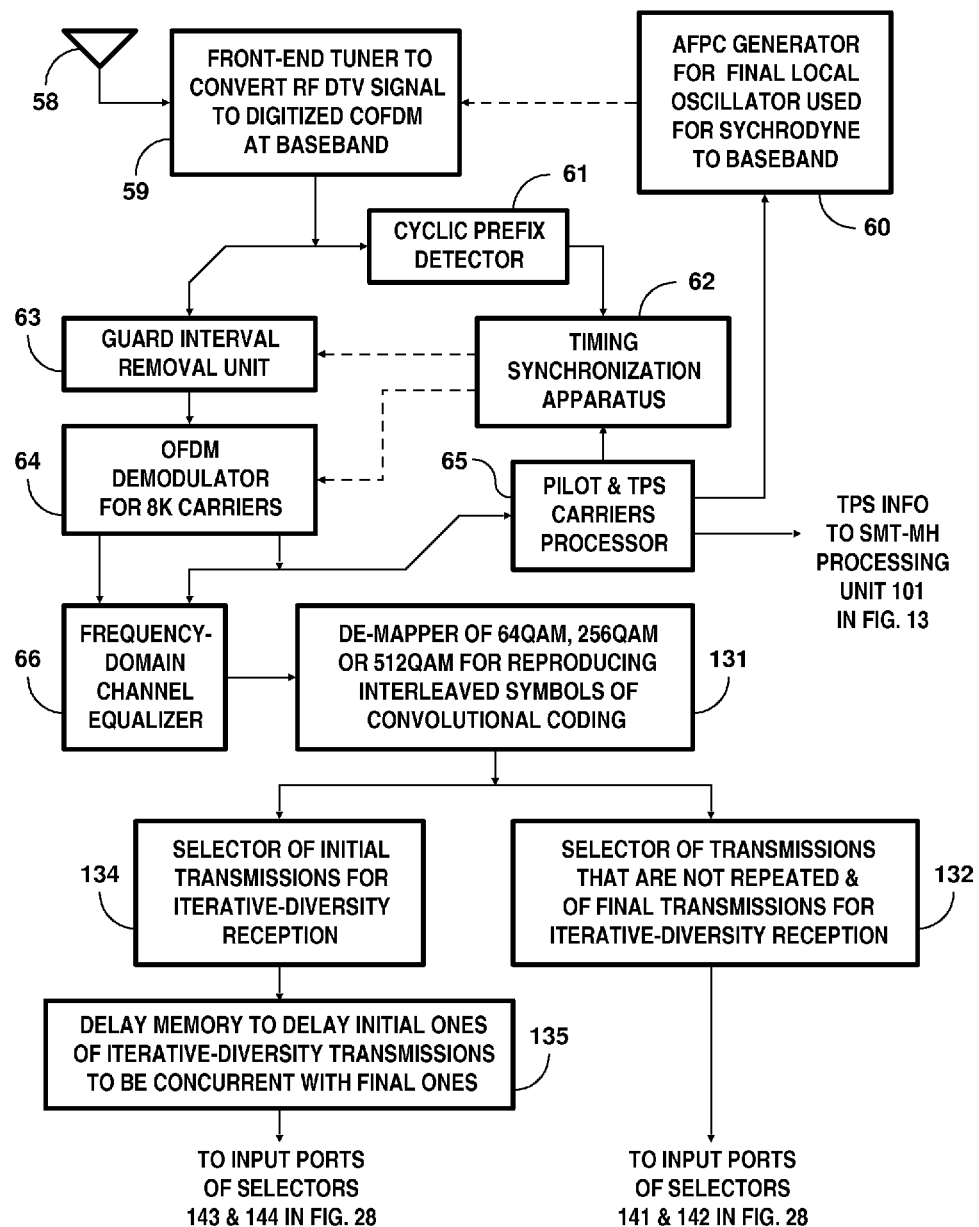
Figure 28:
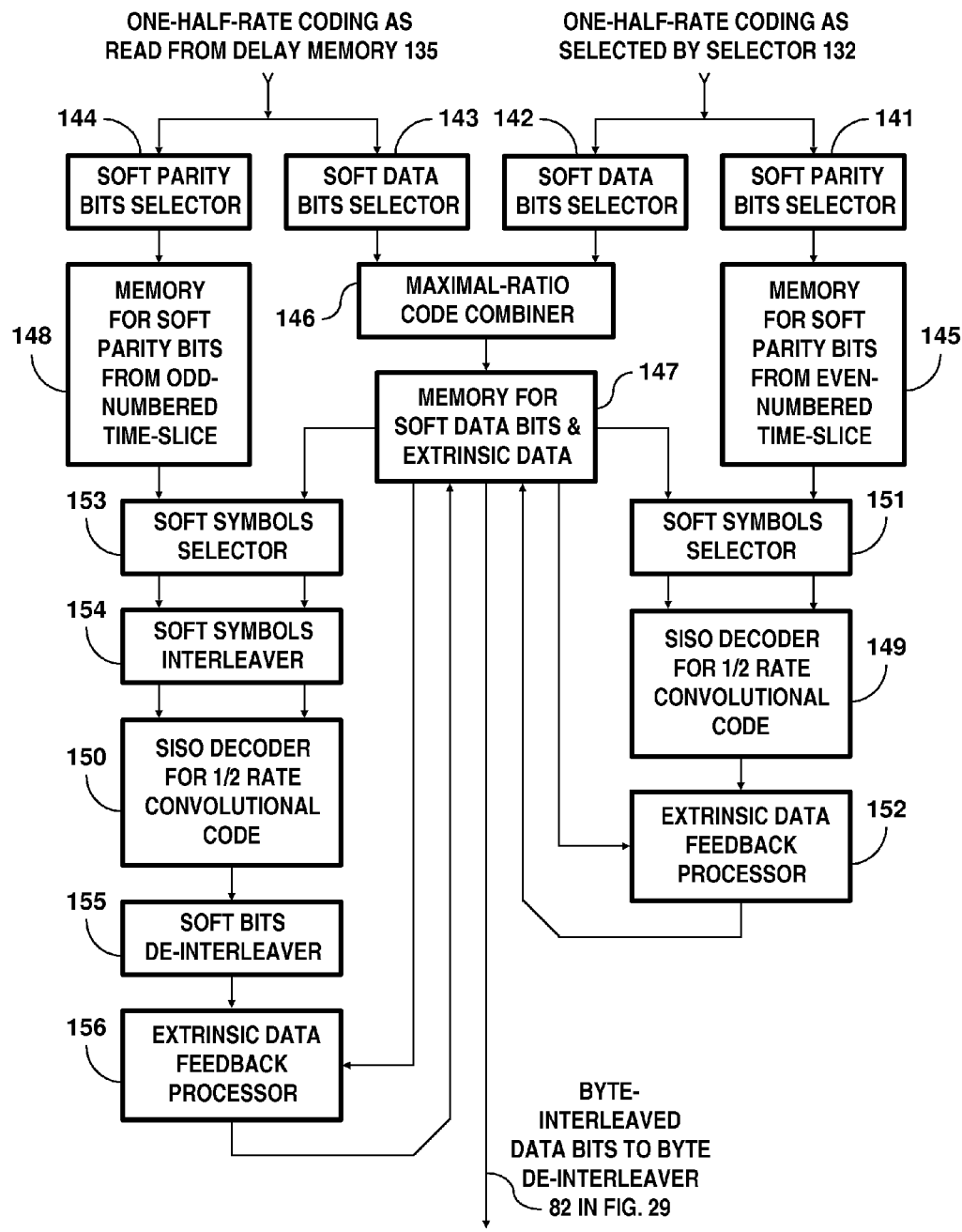
Figure 29:
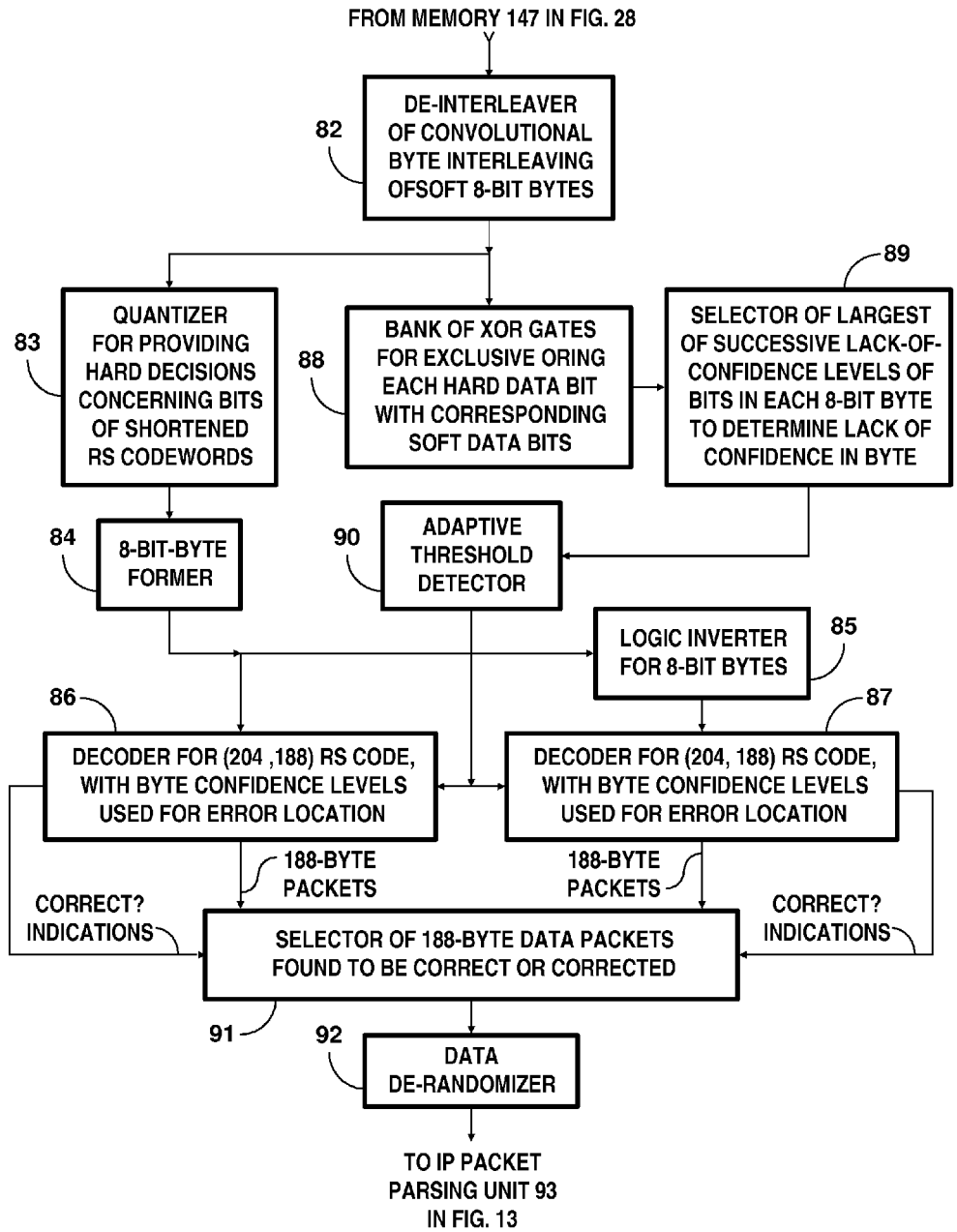

FIGS. 27, 28 and 29 successively combine with FIG. 13 thereafter to provide a schematic diagram of a receiver for iterative-diversity reception of COFDM signals as transmitted by a DTV transmitter as depicted in FIGS. 1 and 2 that uses the FIG. 10 encoder for FEC coding, which receiver is designed for stationary reception and embodies the invention in at least one aspect thereof.

Figure 30:
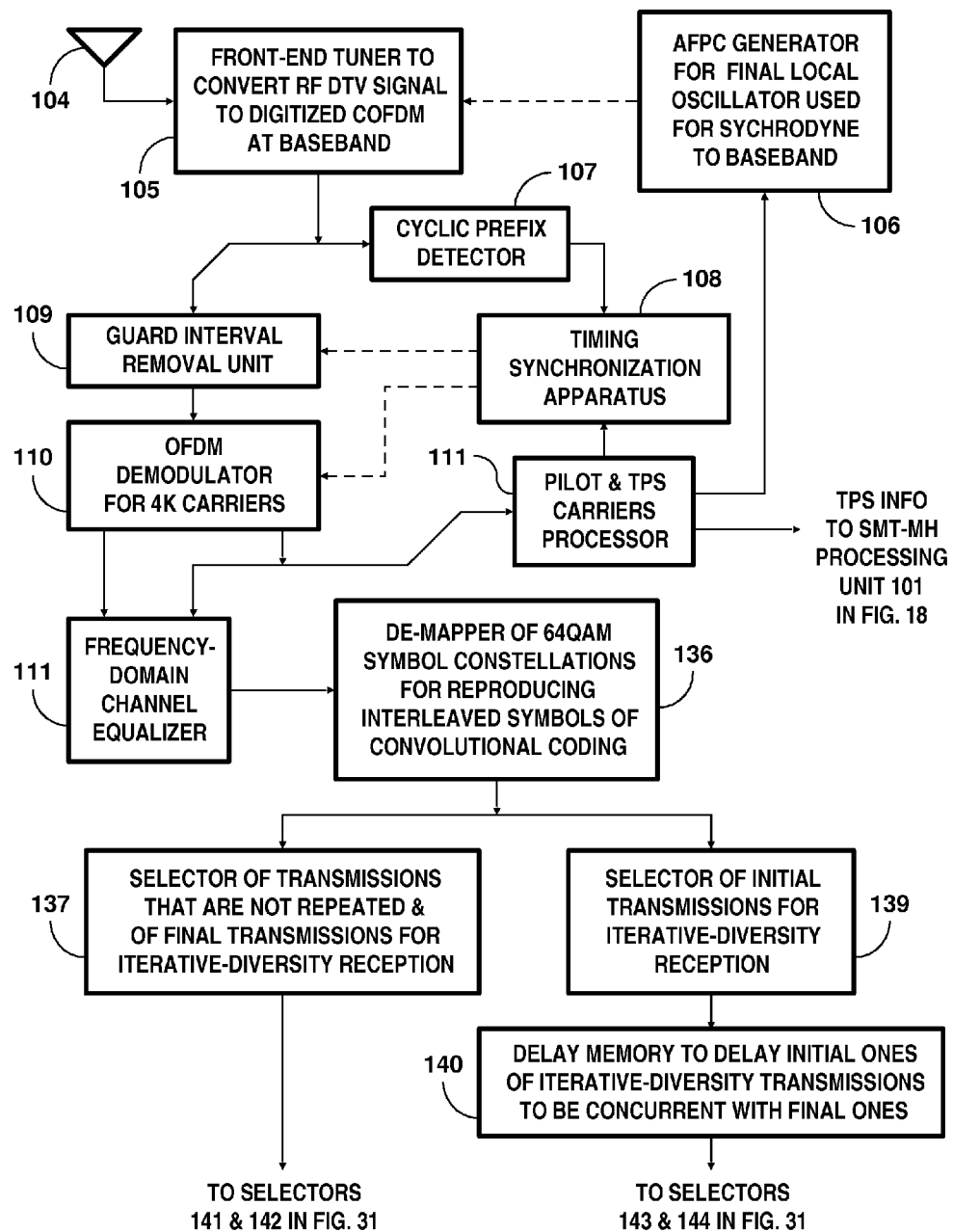
Figure 31:
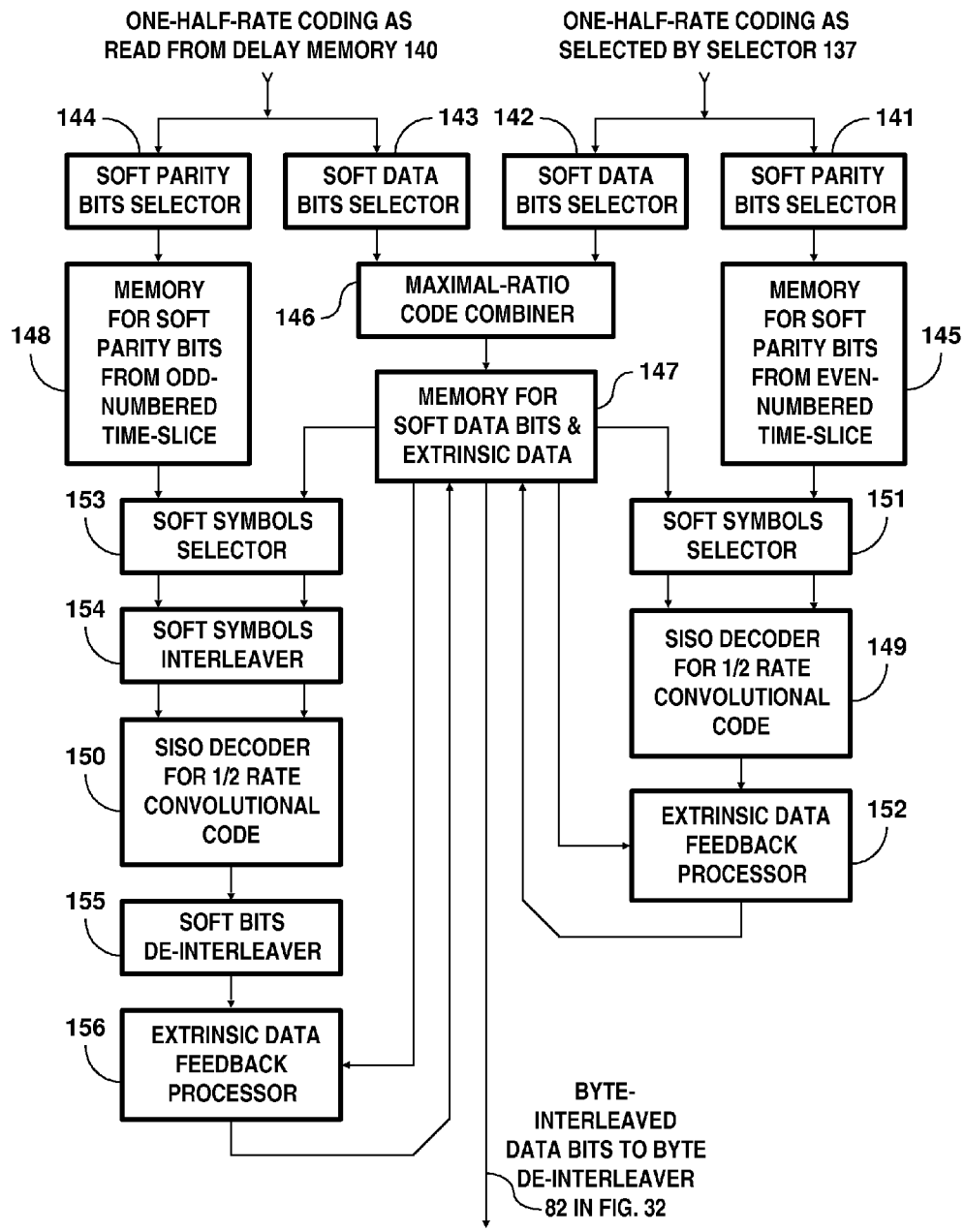
Figure 32:
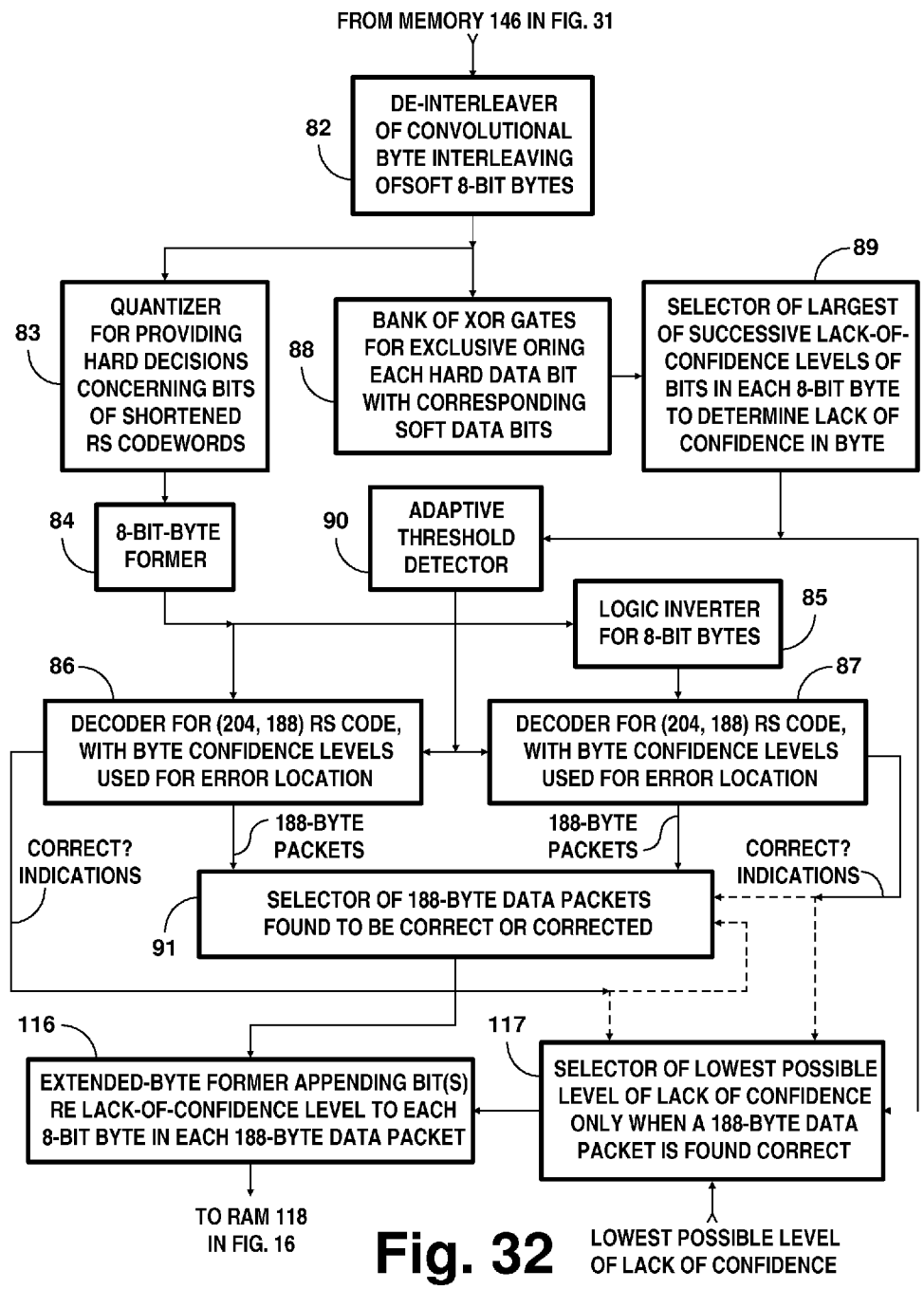

FIGS. 30, 31 and 32 successively combine with FIGS. 16 and 13 thereafter to provide a schematic diagram of a receiver for iterative-diversity reception of COFDM signals as transmitted by a DTV transmitter as depicted in FIGS. 3 and 4 that uses the FIG. 10 encoder for FEC coding, which receiver is designed for mobile reception and embodies the invention in at least one aspect thereof.

Figure 33:
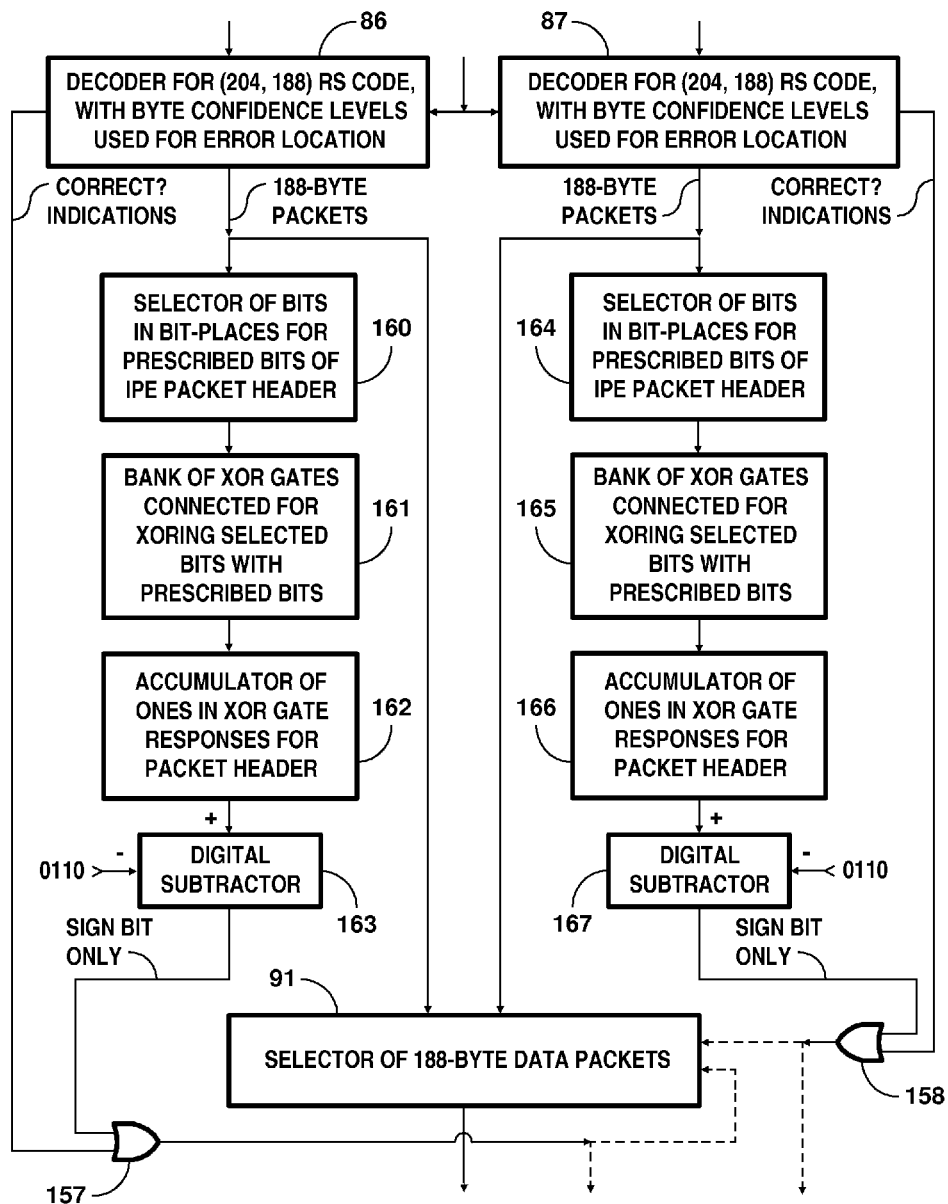

FIG. 33 is a schematic diagram of a modification of the DTV receiver apparatus depicted in any one of FIGS. 12, 15, 19, 21, 29 and 32.

Figure 34:
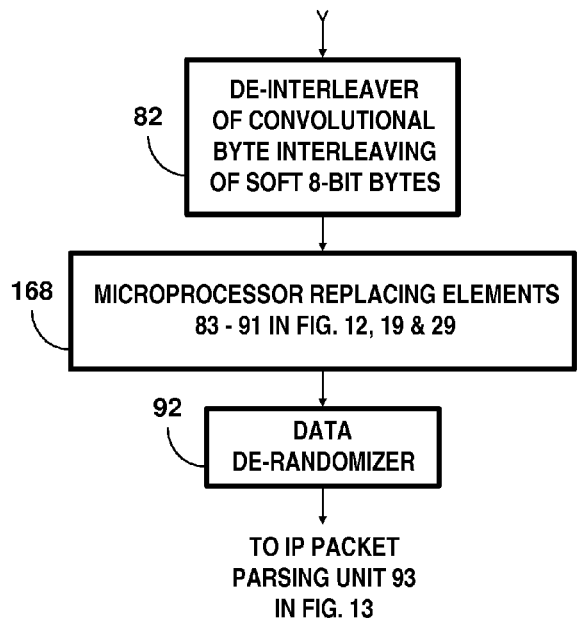

FIG. 34 is a schematic diagram of a modification of the DTV receiver apparatus depicted in any one of FIGS. 12, 19 and 29, in which modification certain of the elements are replaced by a microprocessor.

Figure 15:
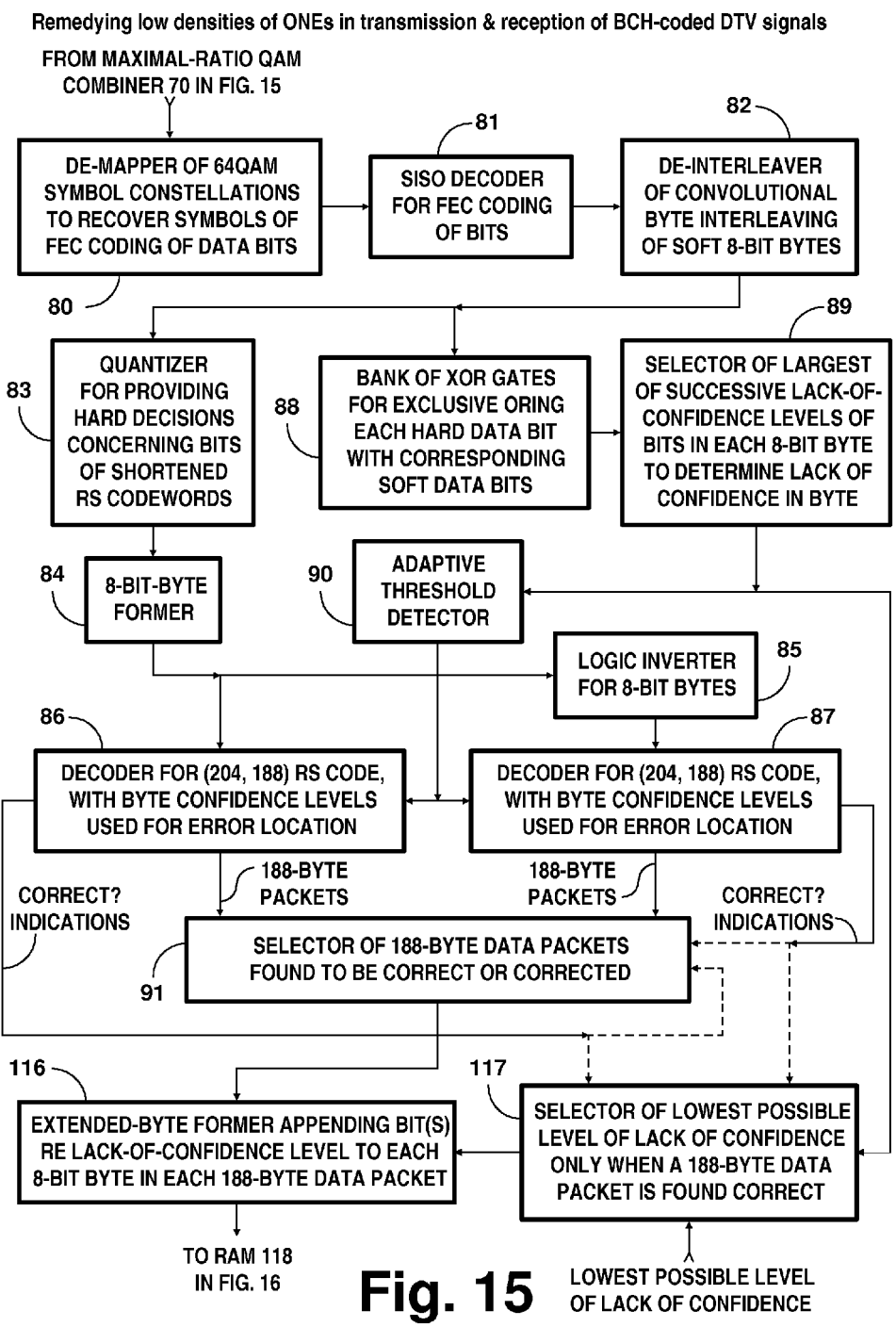
Figure 35:
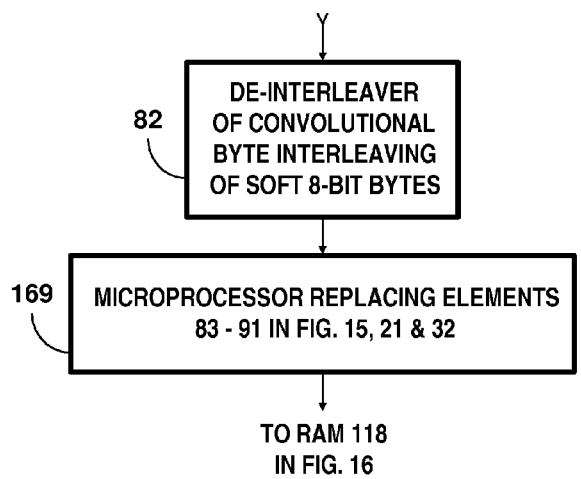

FIG. 35 is a schematic diagram of a modification of the DTV receiver apparatus depicted in any one of FIGS. 15, 21 and 32, in which modification certain of the elements are replaced by a microprocessor.

Figure 36:
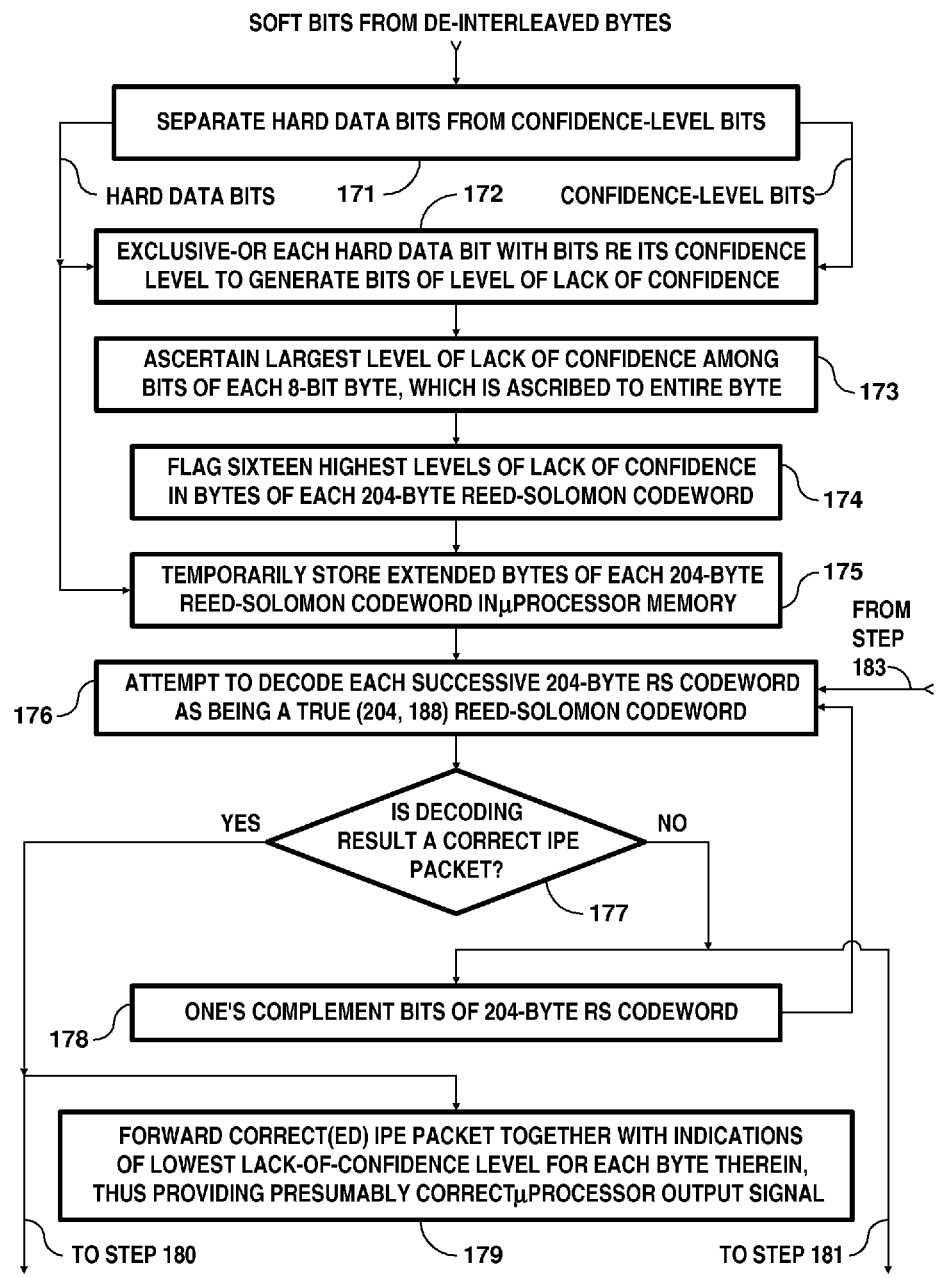

FIG. 36 is an informal flow chart illustrating the general method of operation of microprocessors depicted in FIGS. 34 and 35.

Figure 37:
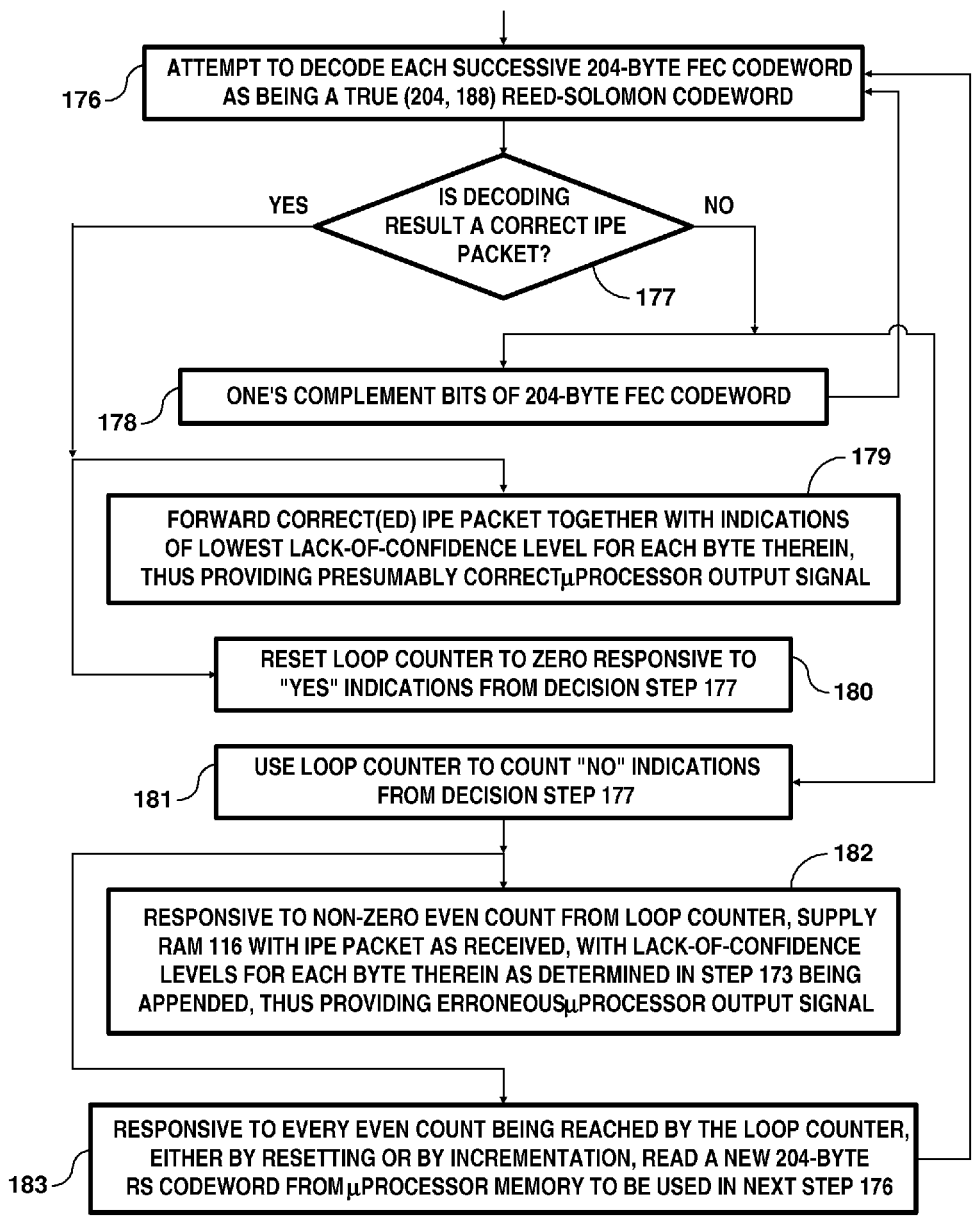

FIG. 37 is an informal flow chart illustrating further detail in the FIG. 36 method of operation of microprocessors depicted in FIGS. 34 and 35.

Figure 38:
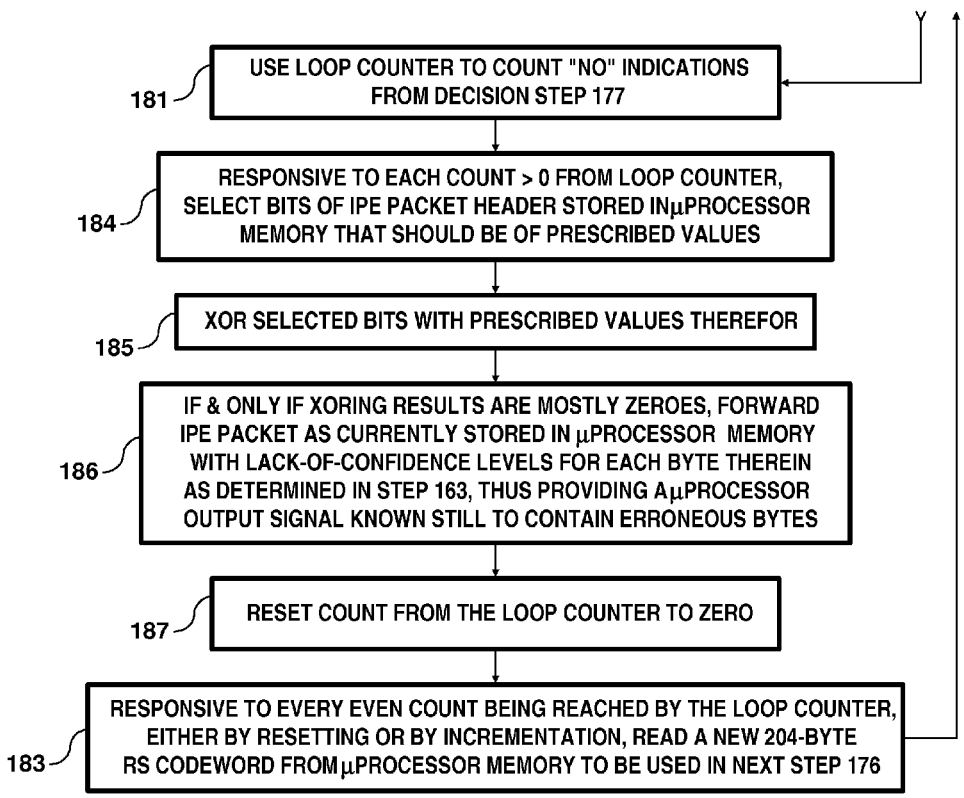

FIG. 38 is an informal flow chart illustrating a modification of the method shown in FIGS. 36 and 37.

Figure 39:
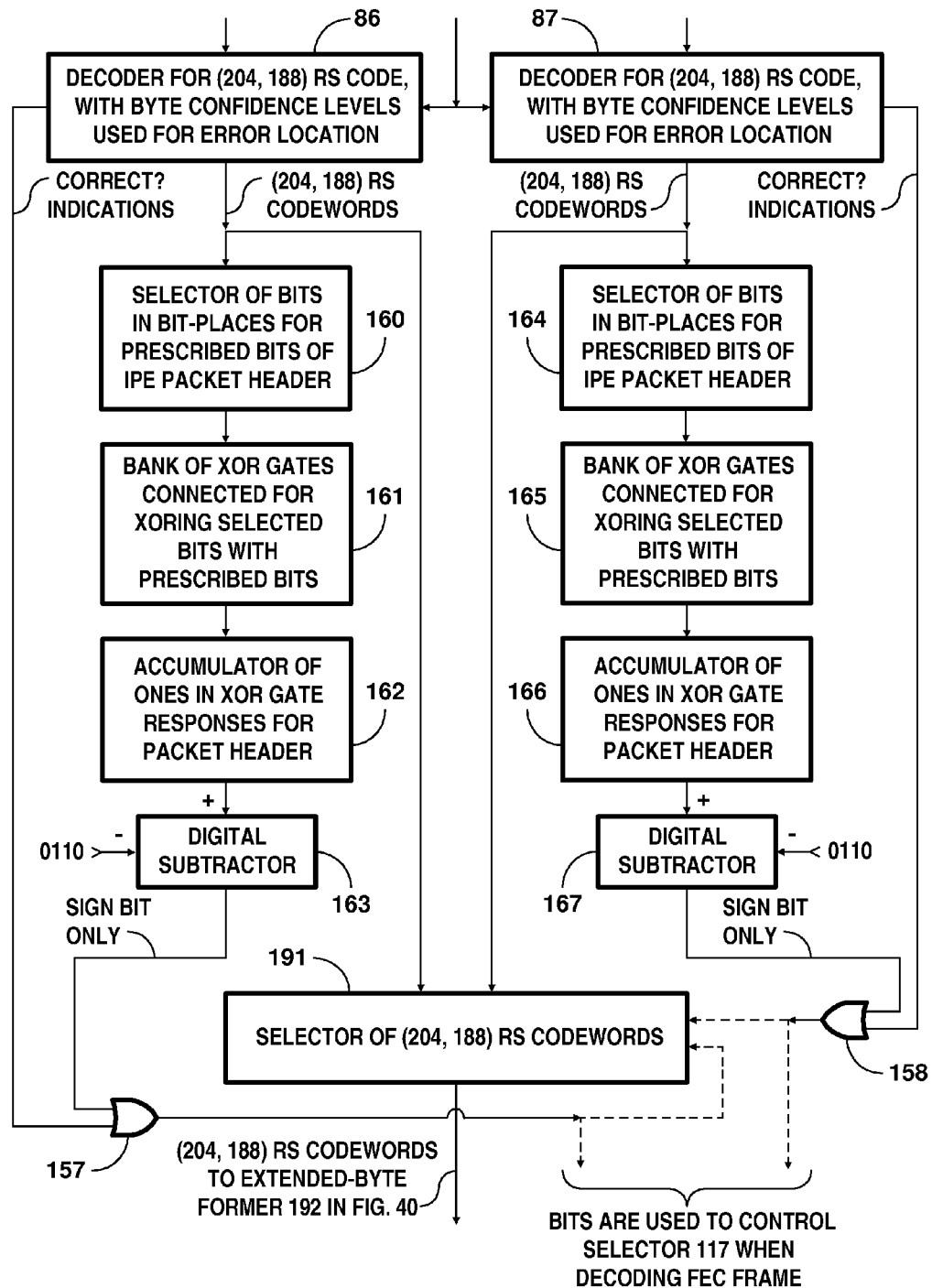

FIG. 39 is a schematic diagram of modifications of the DTV receiver apparatus depicted in any one of FIGS. 15, 21 and 32, which modifications provide for supplying selected (204, 188) RS-coded IPE packets to apparatus for decoding two-dimensional Reed-Solomon coding.

Figure 40:
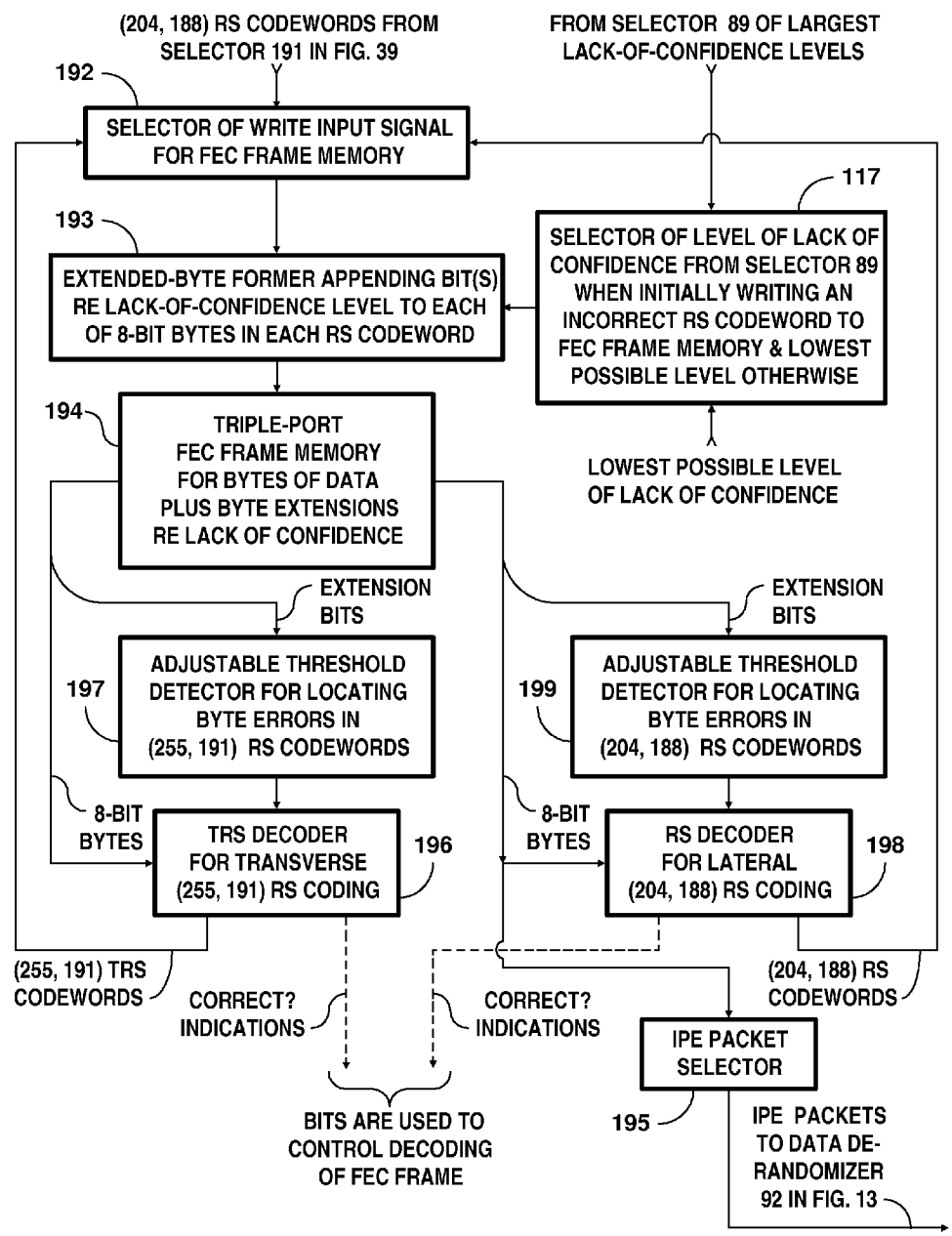

FIG. 40 is a schematic diagram of apparatus for decoding two-dimensional Reed-Solomon coding.

Figure 41:
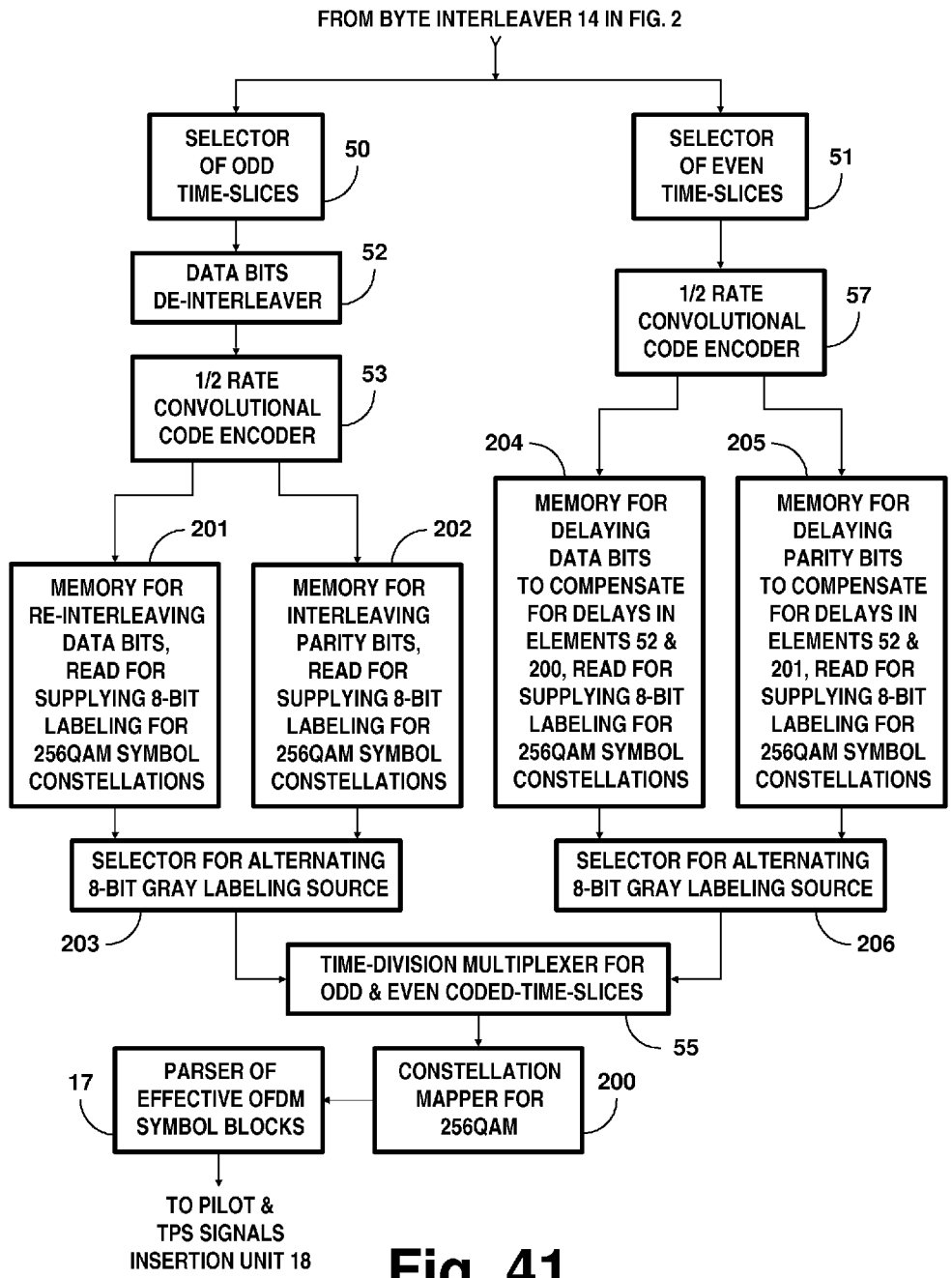

FIG. 41 combines with preceding FIG. 1 to provide a schematic diagram of a modification of the DTV transmitter depicted in FIGS. 1 and 2.

Figure 42:
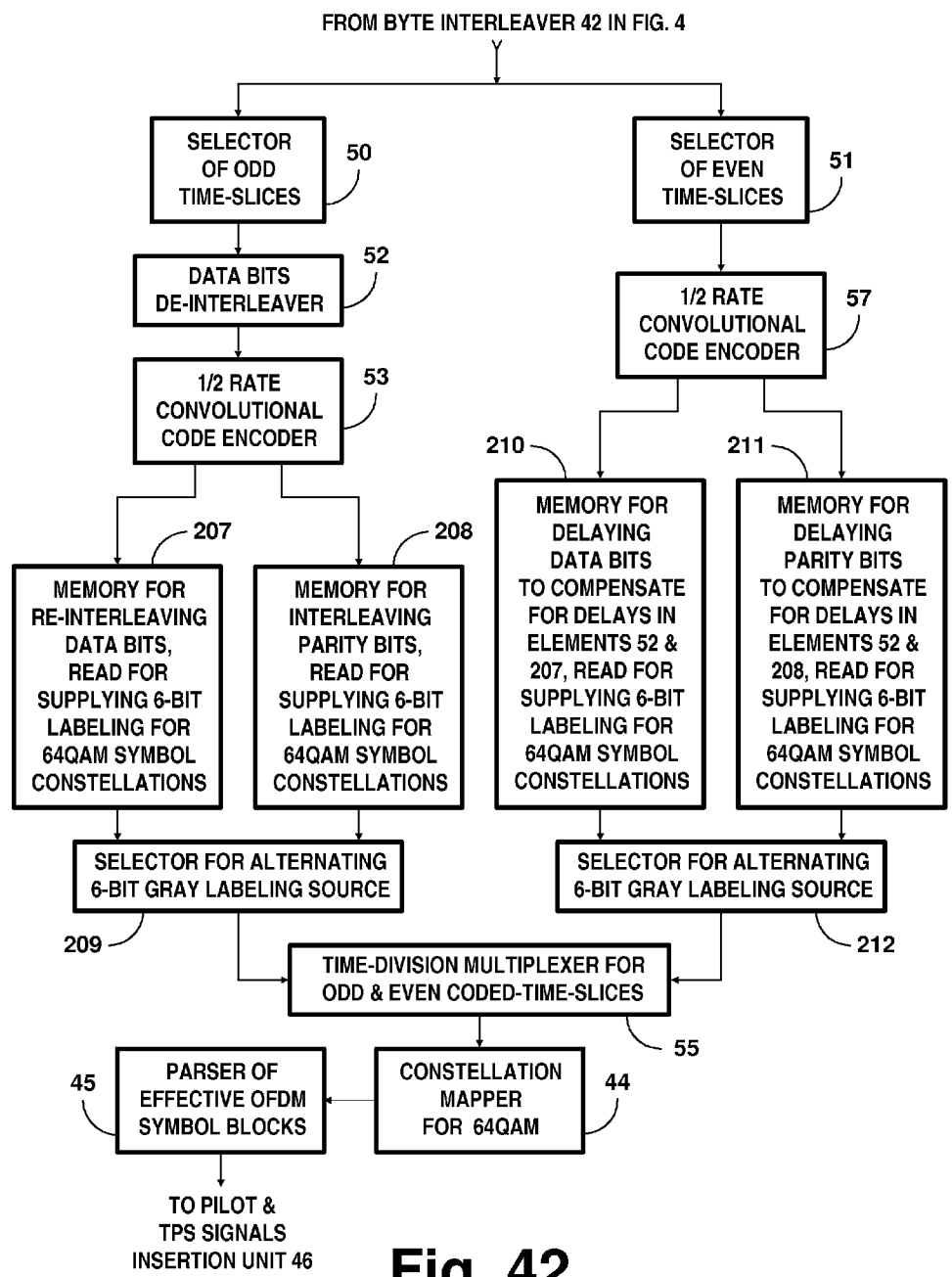

FIG. 42 combines with preceding FIG. 3 to provide a schematic diagram of a modification of a DTV transmitter depicted in FIGS. 3 and 4.

Figure 43:
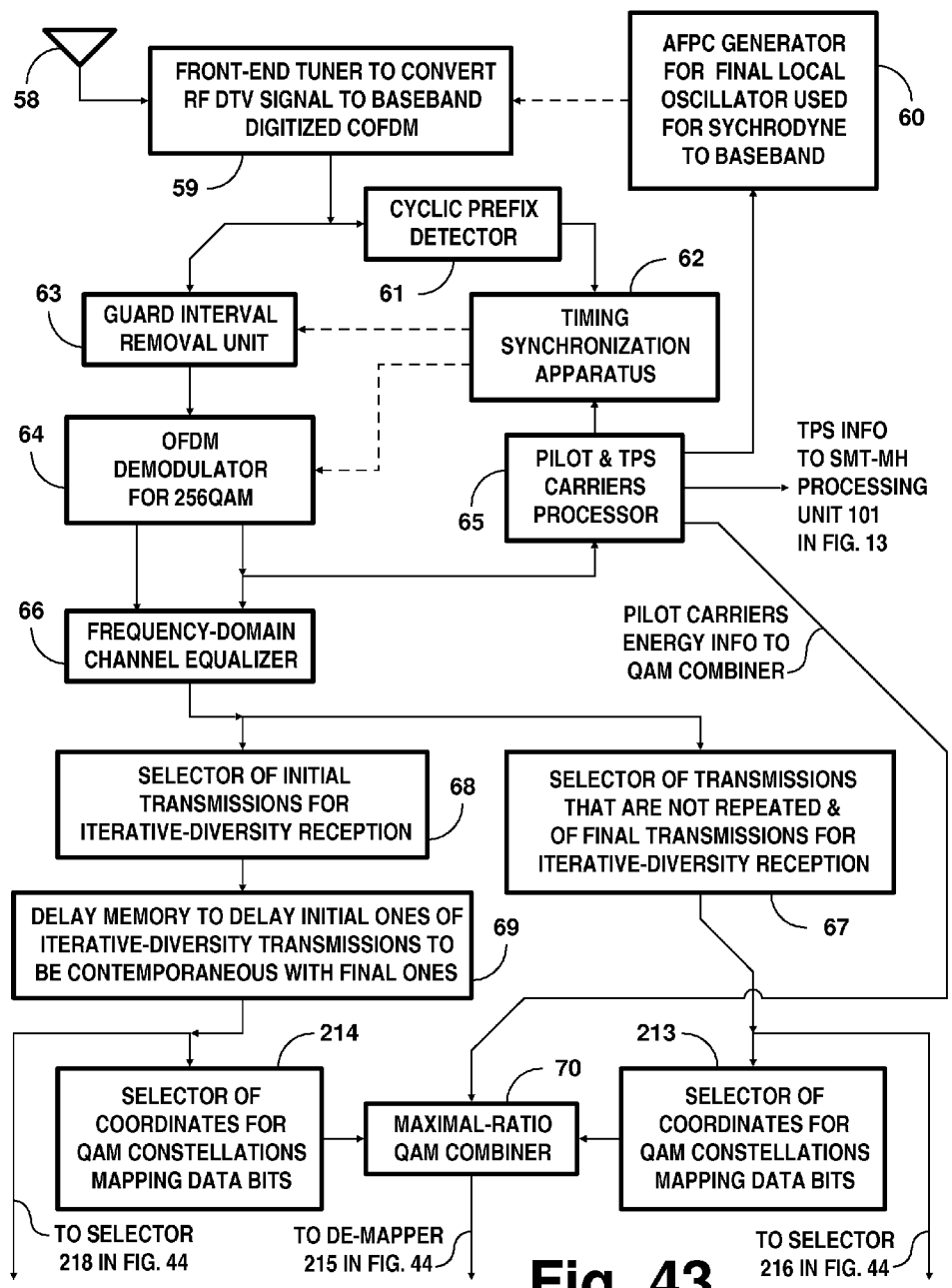
Figure 44:
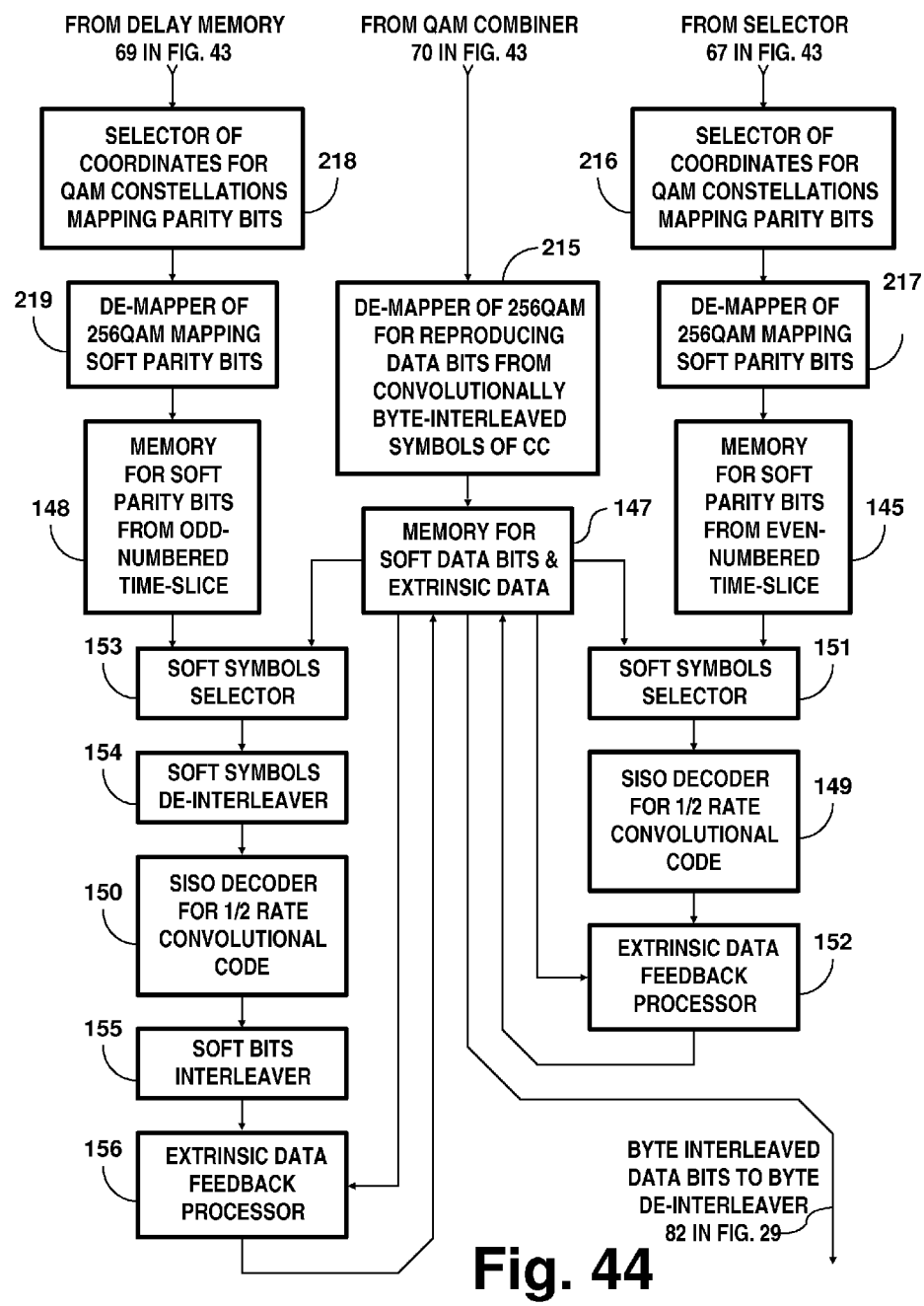

FIGS. 43 and 44 successively combine with FIGS. 29 and 13 thereafter to provide a schematic diagram of a receiver for iterative-diversity reception of COFDM signals as transmitted by a DTV transmitter as depicted in FIGS. 1 and 2 that is modified per FIG. 41, which receiver is designed for stationary reception and embodies the invention in at least one aspect thereof.

Figure 45:
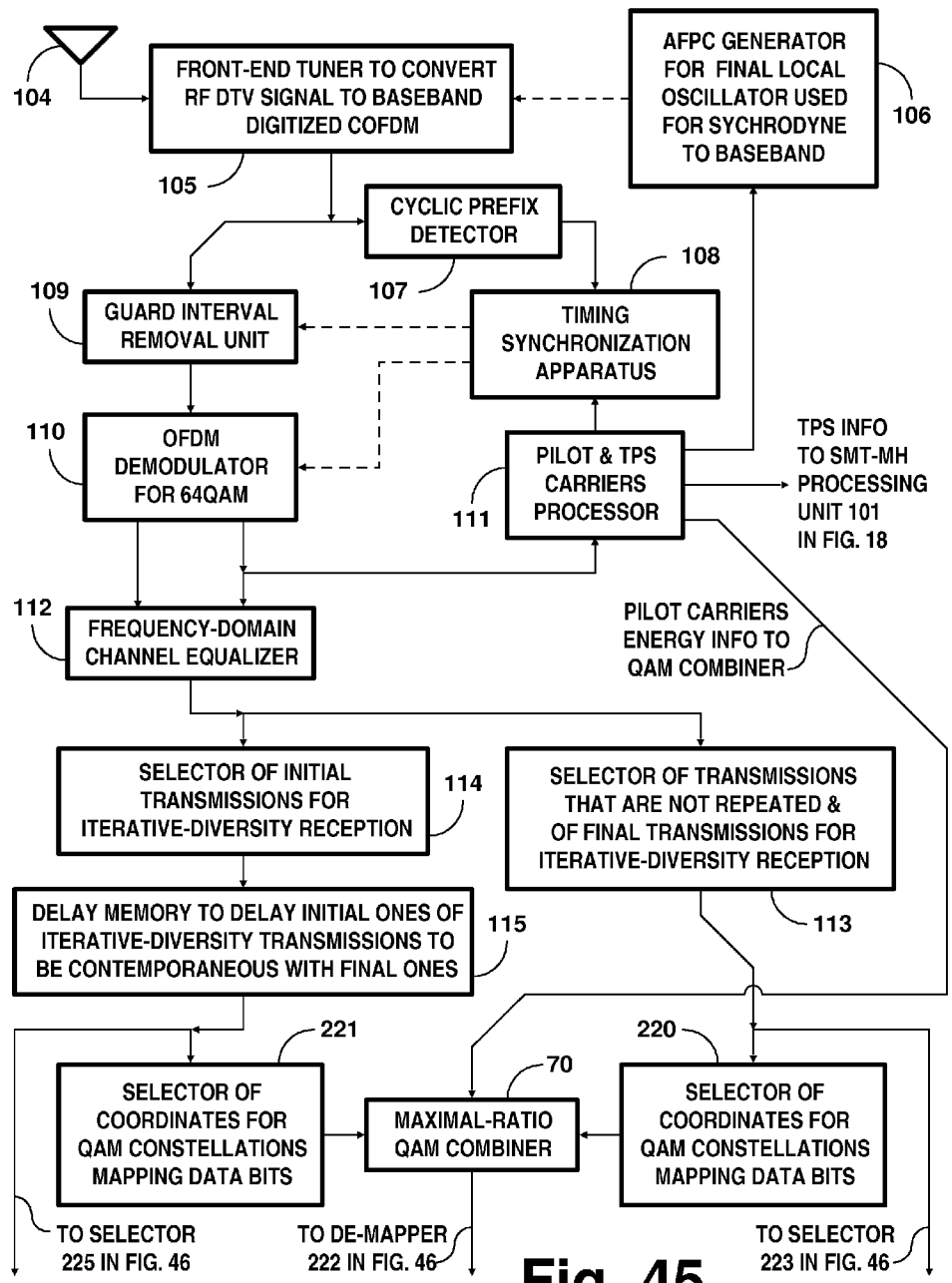
Figure 46:
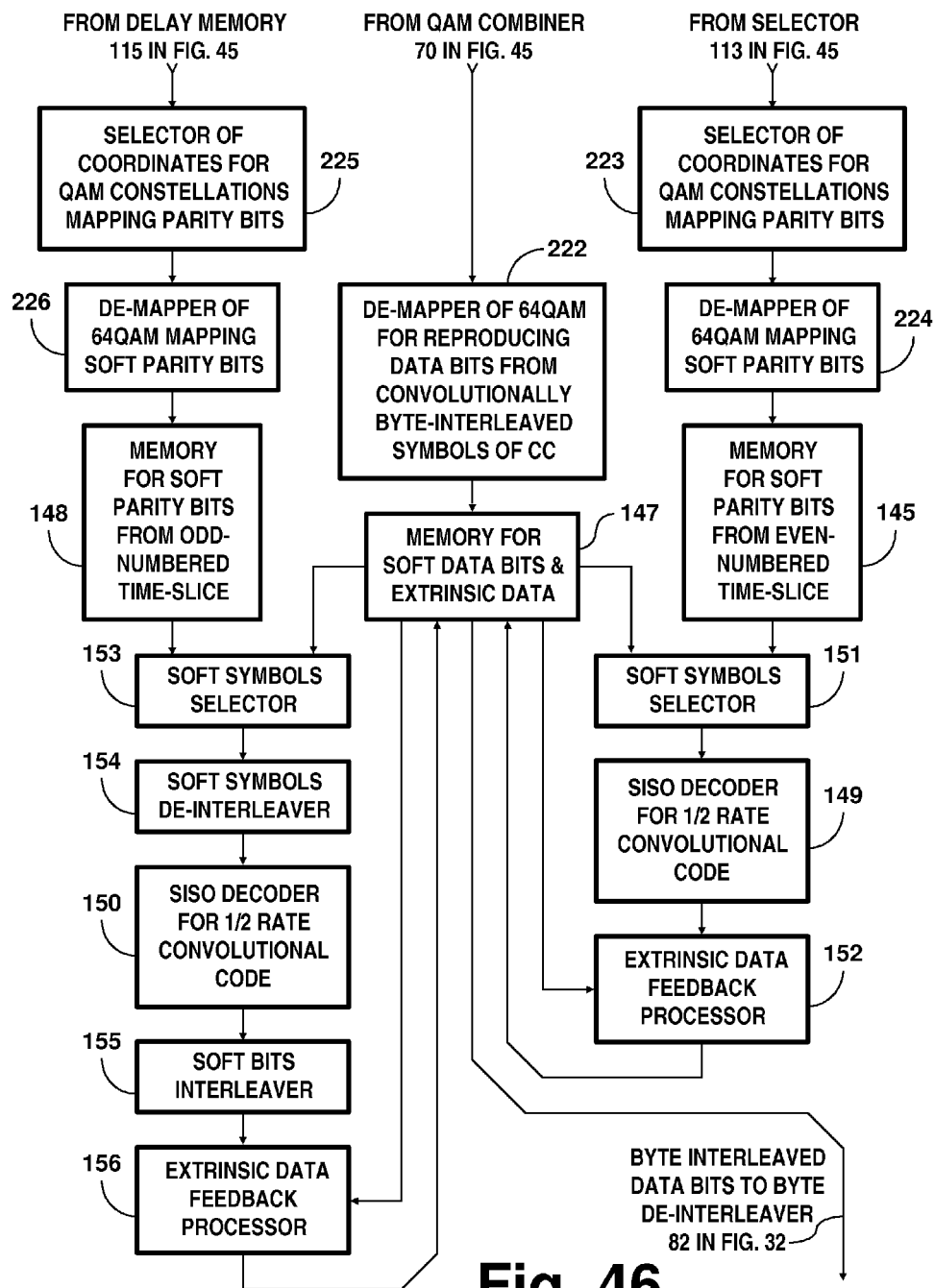

FIGS. 45 and 46 successively combine with FIGS. 32, 16 and 13 thereafter to provide a schematic diagram of a receiver for iterative-diversity reception of COFDM signals as transmitted by a DTV transmitter as depicted in FIGS. 3 and 4 that is modified per FIG. 42, which receiver is designed for mobile reception and embodies the invention in at least one aspect thereof.

Figure 47:
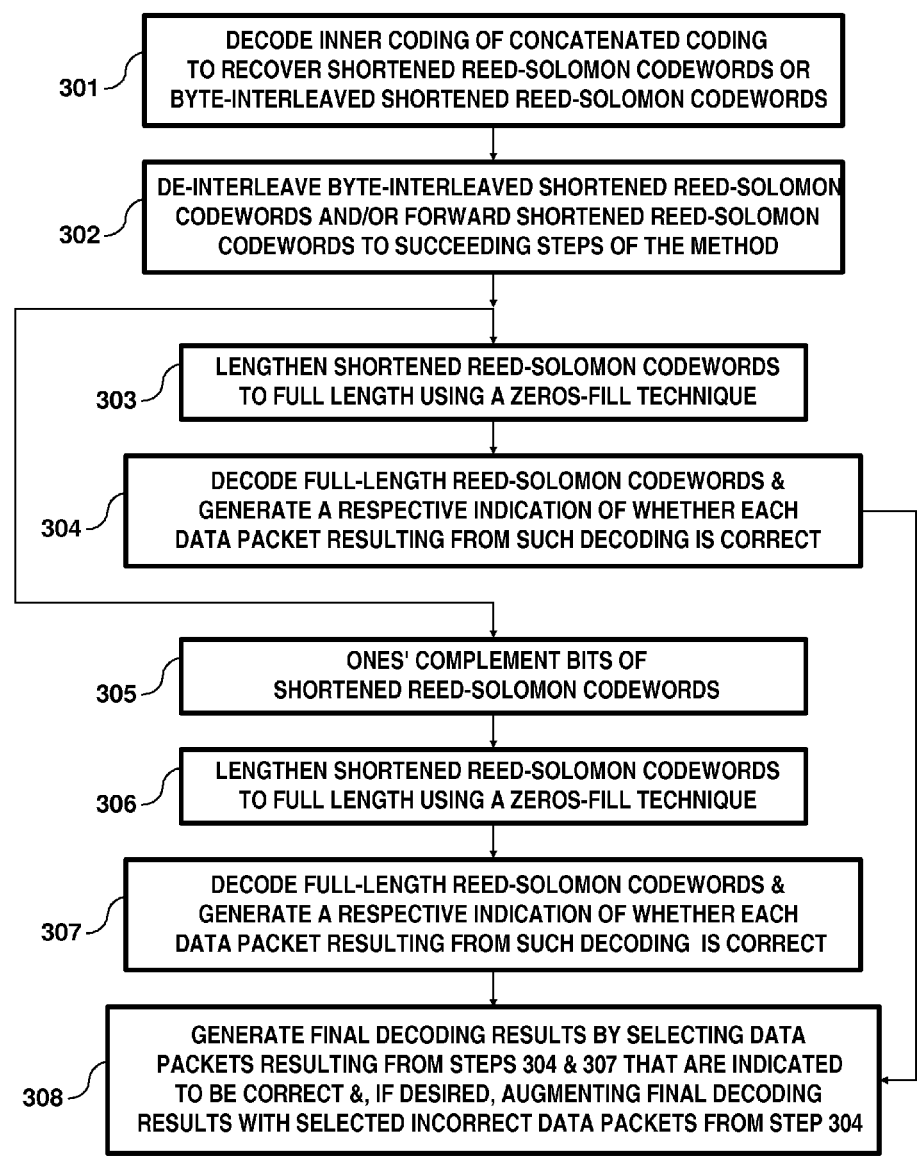
Figure 48:
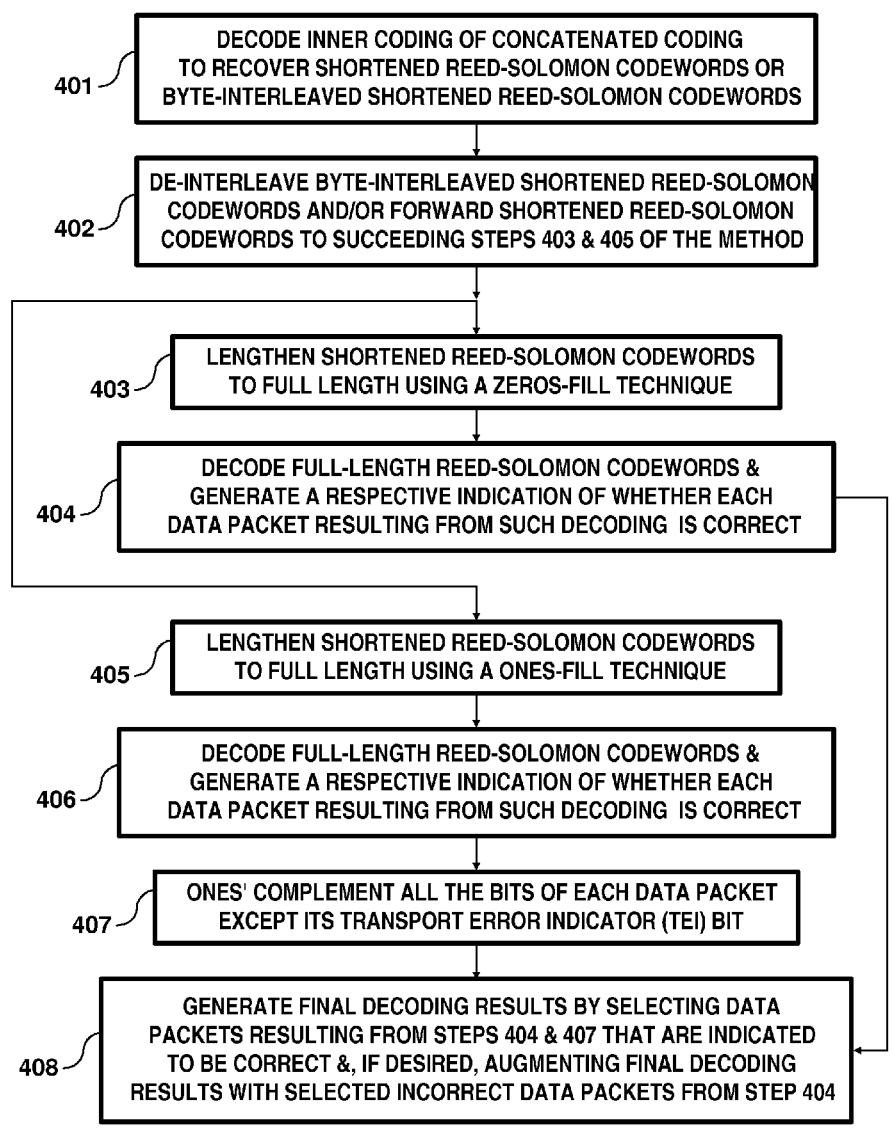

FIGS. 47 and 48 are informal flow charts illustrating in more generic form two methods alternative to each other for decoding concatenated coding of data bits in electronic apparatus, which concatenated coding was generated by further coding a collection of shortened Reed-Solomon codewords some of which are TRUE in form and some of which are FALSE in form.

Figure 49:
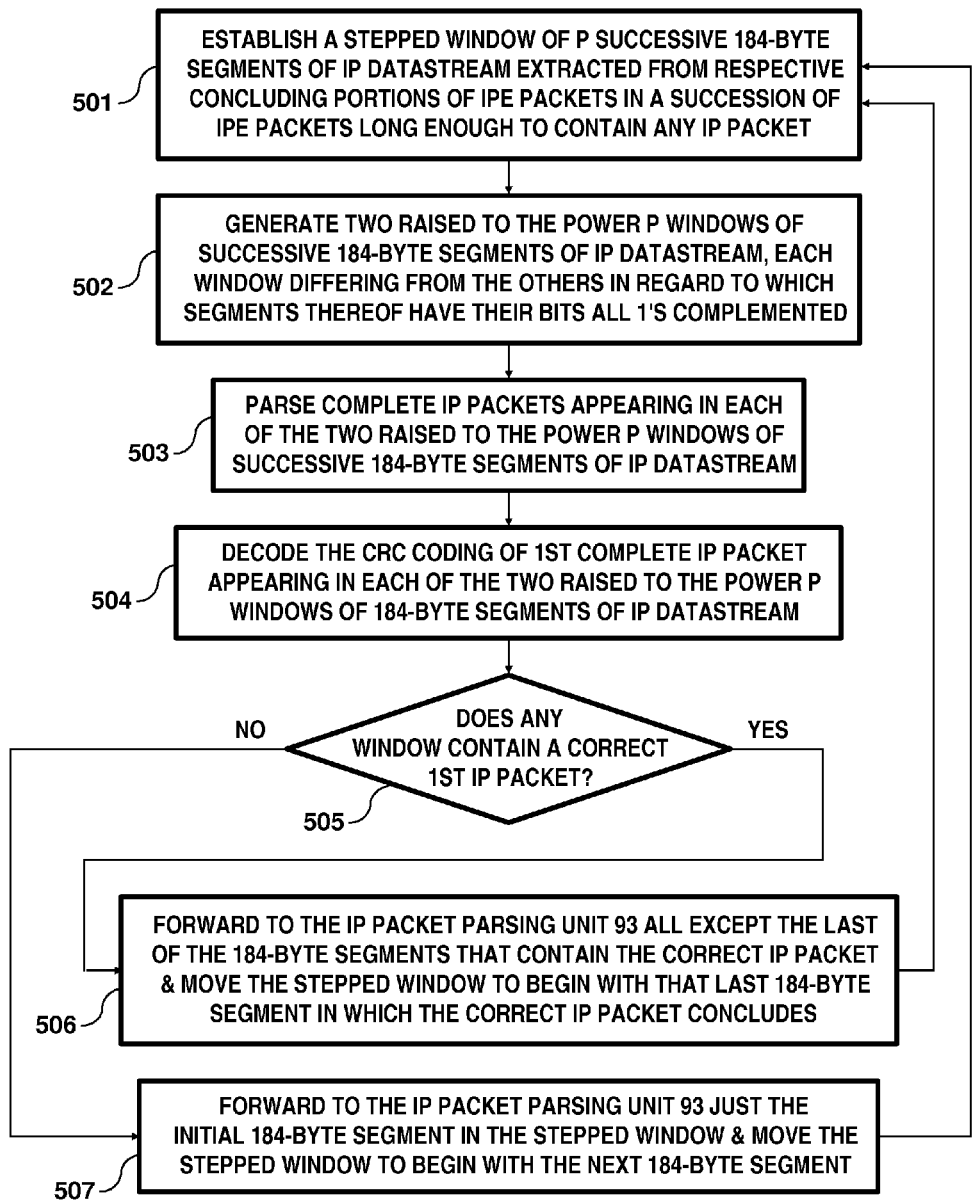

FIG. 49 is an informal flow chart illustrating the operation of modifications that can be introduced into the DTV receiver apparatus depicted in FIG. 13.

Figure 50:
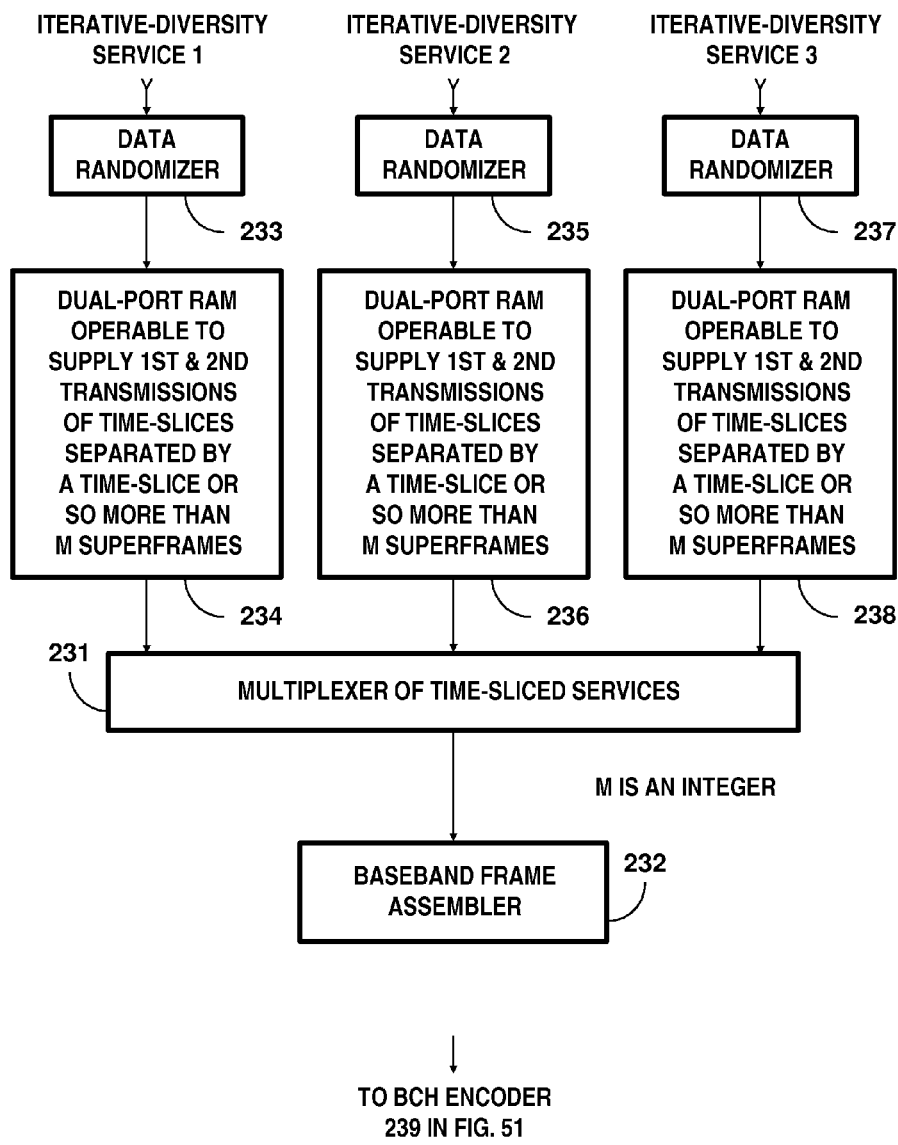
Figure 51:
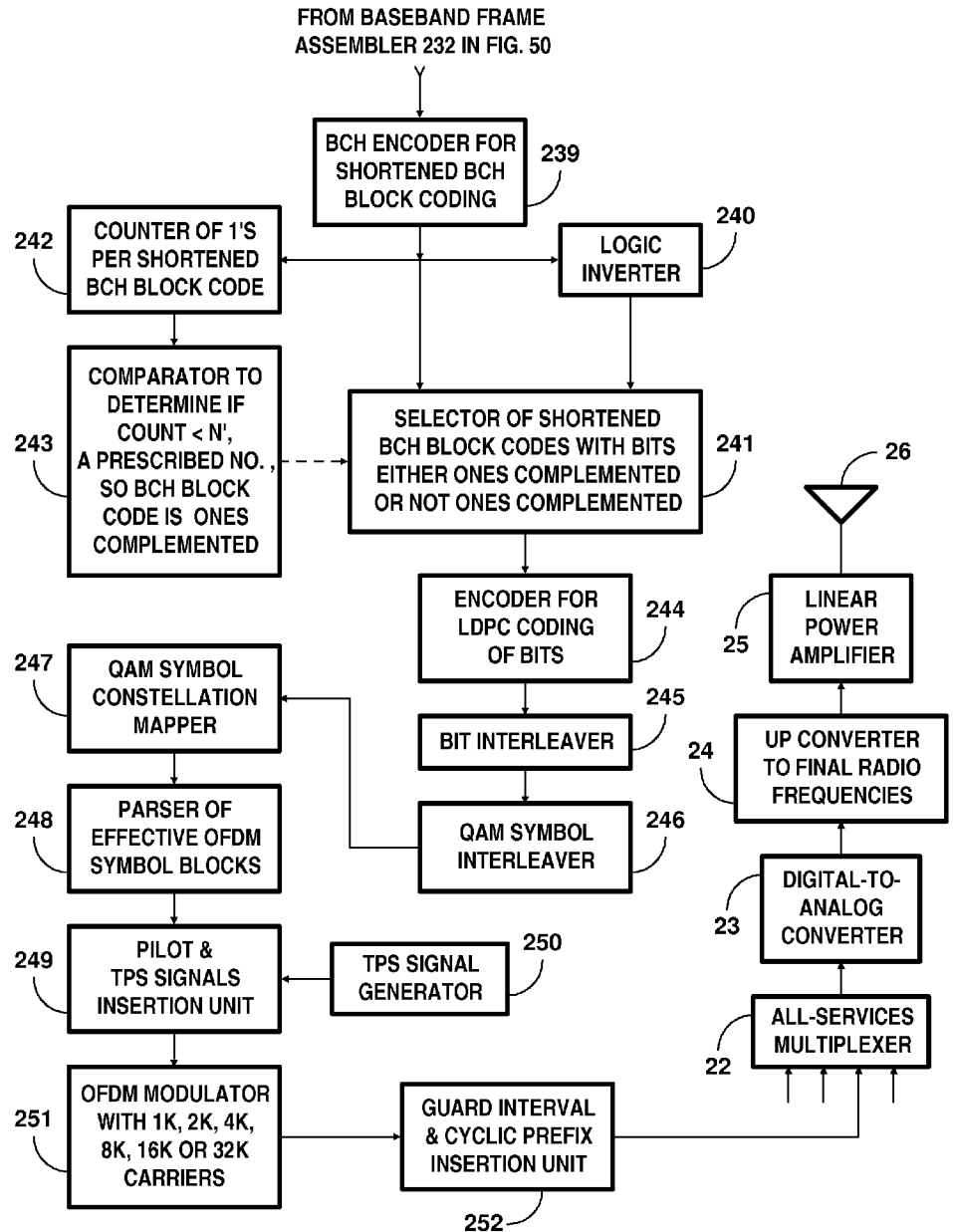

FIGS. 50 and 51 together provide a schematic diagram of a portion of a COFDM transmitter for transmitting signals similar to DVB-T2 signals, which transmitter is capable of transmitting LDPC-coded BCH block codes twice for iterative-diversity reception.

Figure 52:
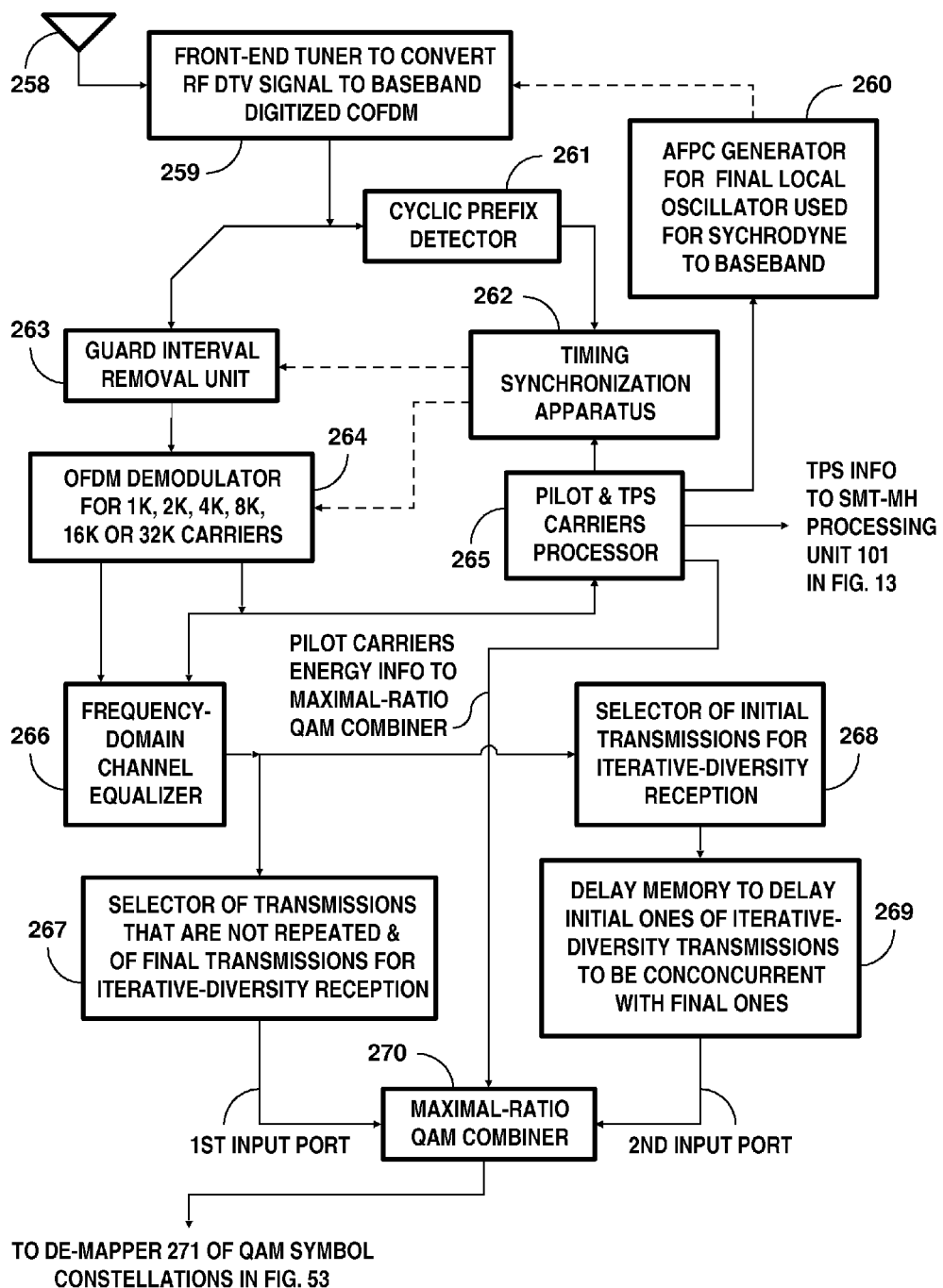
Figure 53:
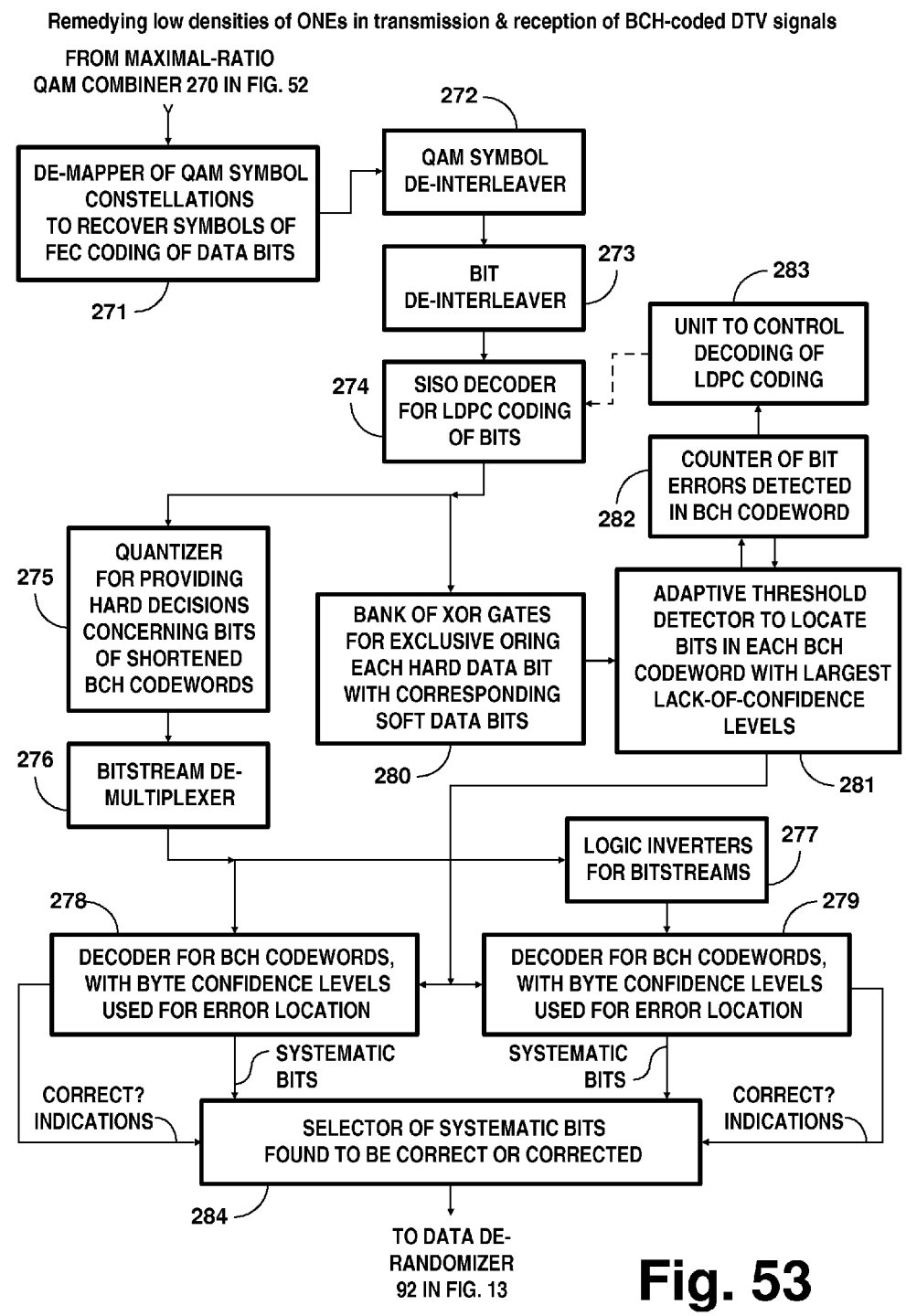

FIGS. 52 and 53 successively combine with FIG. 13 thereafter to provide a schematic diagram of a receiver for iterative-diversity reception of COFDM signals as transmitted by a DTV transmitter as depicted in FIGS. 50 and 51.

Figure 54:
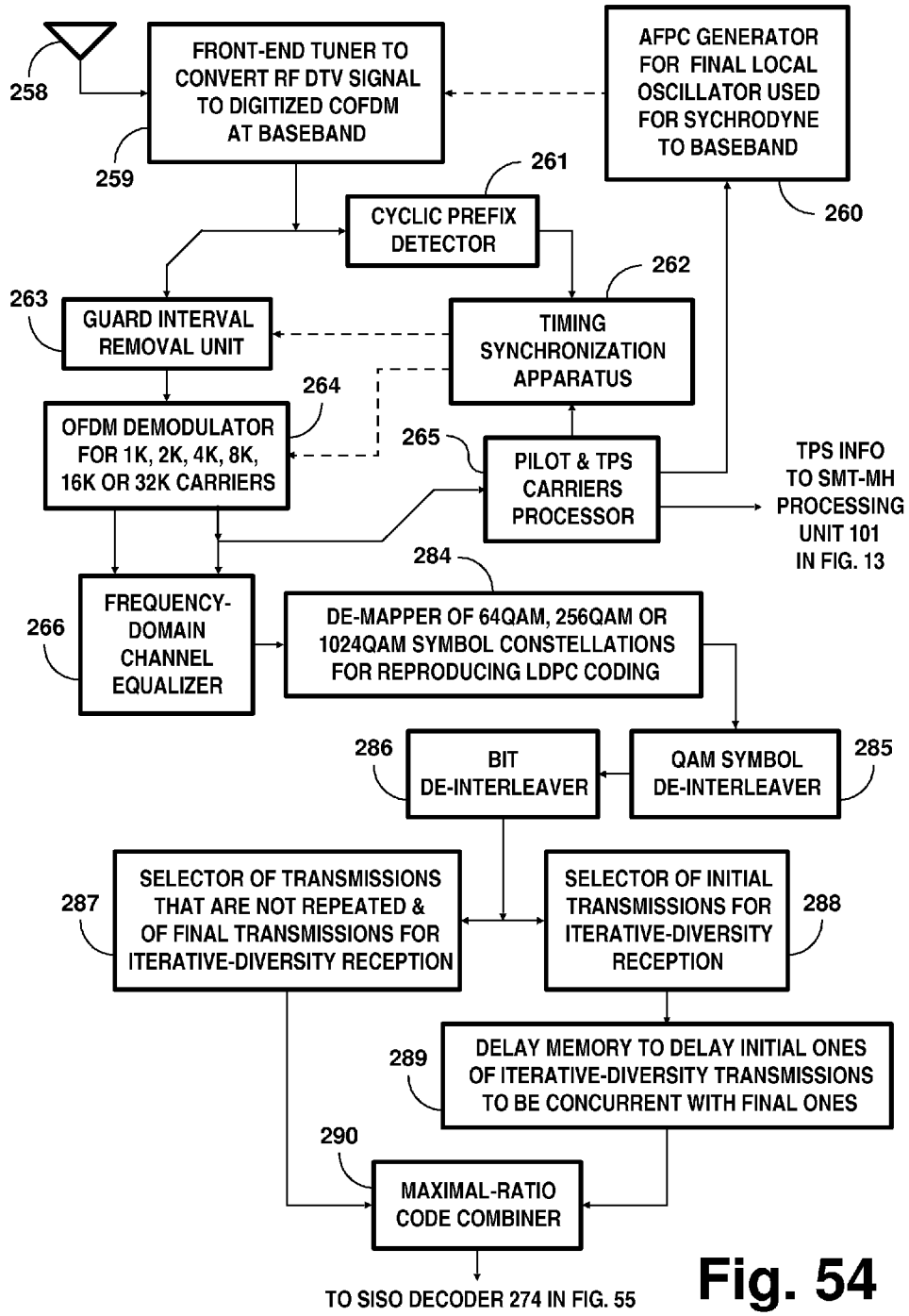
Figure 55:
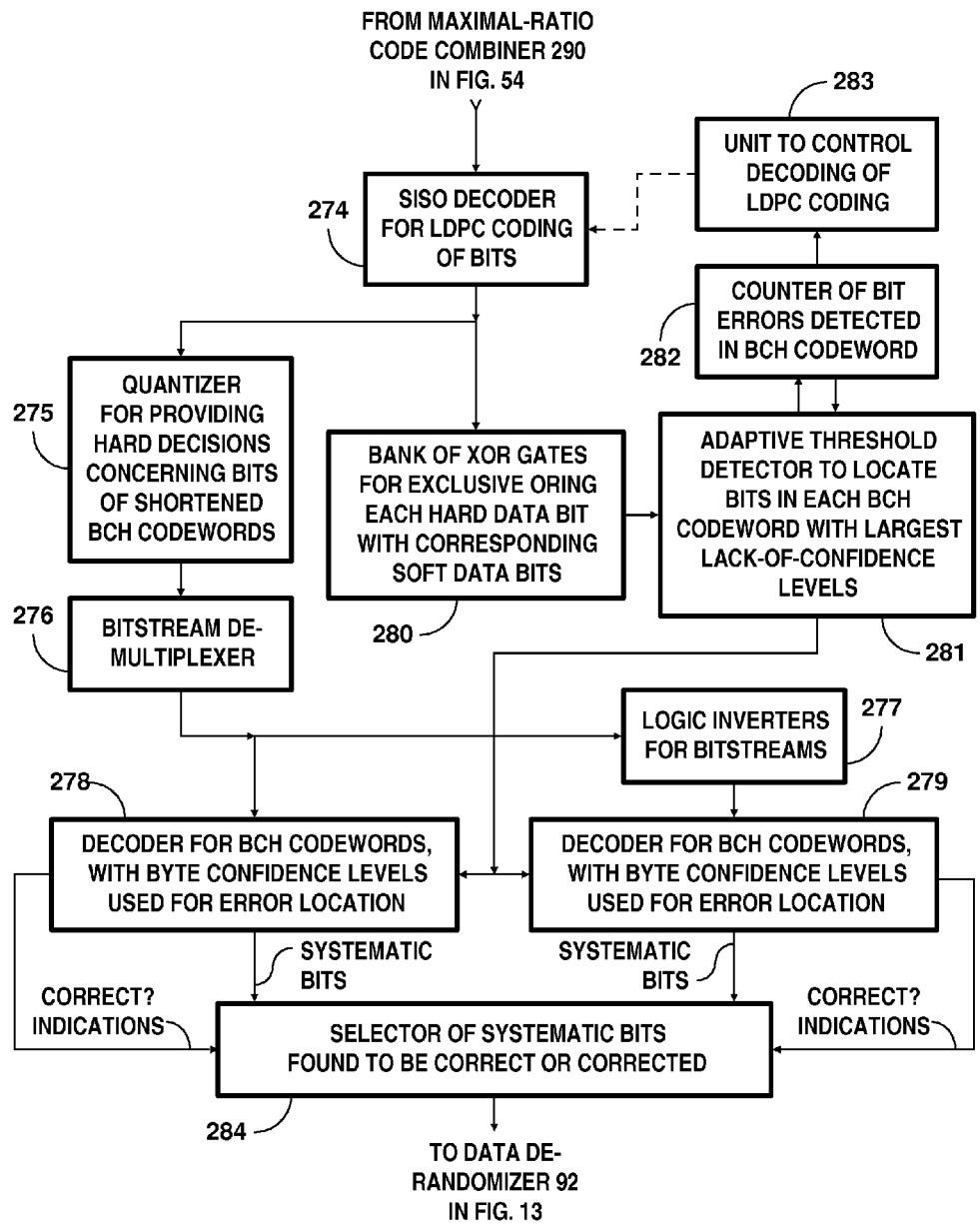

FIGS. 54 and 55 successively combine with FIGS. 16 and 13 thereafter to provide a schematic diagram of a receiver for iterative-diversity reception of COFDM signals as transmitted by a DTV transmitter as depicted in FIGS. 50 and 51.

Dashed lines are used in the various drawing figures for depicting connections used for conveying control signals.

DETAILED DESCRIPTION

The invention is described in detail as it relates to a DTV broadcast system employing COFDM in which the transmitter repeats each transmission of DTV data a few seconds later to facilitate iterative-diversity reception by receivers. The invention, which is directed to remedying low densities of ONEs in packets of digital data for broadcasting, is also applicable to DTV broadcast systems in which DTV data are transmitted once, rather than twice, or are transmitted more than twice. A primary reason for repeating each transmission of DTV data a few seconds later to facilitate iterative-diversity reception is to help receivers overcome brief severe flat-spectrum fades. COFDM is able to overcome frequency-selective fading quite well, but reception will fail if there is severe flat-spectrum fading that lasts too long. Such flat-spectrum fading is sometimes referred to as a "drop-out" in received signal strength. Such drop-out occurs when the receiving site changes such that a sole effective signal transmission path is blocked by an intervening hill or structure, for example. Because the signaling rate in the individual OFDM carriers is very low, COFDM receivers are capable of maintaining reception despite drop-outs that are only a fraction of a second in duration. However, drop-outs that last as long as a few seconds disrupt television reception perceptibly.

In DVB-T the bit-wise forward-error-correction (FEC) coding of packets of randomized data prior to mapping to modulation symbols uses (204, 188) Reed-Solomon coding followed by simple convolutional coding. This FEC coding supports modulation symbol constellations as large as 16QAM. However, if one desires to use larger QAM symbol constellations, stronger FEC coding is needed to bring performance in the presence of additive White Gaussian noise (AWGN) close to the Shannon limit. The FEC coding can be strengthened by replacing the simple convolutional coding with concatenated convolutional coding. DVB-T2 strengthens the bit-wise FEC coding by replacing the concatenated RS and simple convolutional coding of DVB-T with concatenated BCH and LDPC coding that can support 64QAM or 256QAM symbol constellations.

Mathematicians describe QAM symbol constellations as two-dimensional "point lattices". As the number of lattice points in the QAM symbol constellations increases in each dimension, the number of bins needed for data slicing the orthogonal amplitude-shift-keying (ASK) component in each dimension increases. So, the size of the bins used in data-slicing each of the orthogonal ASK components decreases, increasing the likelihood of data-slicing error caused by AWGN. E. g., doubling the number of lattice points in each dimension of a QAM symbol constellation halves the sizes of the bins used for data-slicing each ASK component thereof, increasing the likelihood of bit error attributable to AWGN by 6 dB or so. However, the quadrupling of the number of lattice points in the QAM symbol constellation quadruples the number of bits available in the recovered bit-wise FEC coding. This increase in the number of bits in the recovered bit-wise FEC coding is more than sufficient to accommodate the redundancy involved in stronger FEC coding.

FIGS. 1 and 2 together show a portion of a DTV transmitter generating COFDM signals, which portion of the DTV transmitter generates DTV signal for reception by stationary DTV receivers. FIG. 1 shows apparatus for processing time-slices of data for reception by stationary DTV receivers, so as to generate 188-byte MPEG-transport-stream packets. Apparatus for forward-error-correction coding the MPEG-transport-stream packets and generating subsequent COFDM signals is shown in FIG. 2.

A multiplexer 1 of time-sliced services for reception by stationary DTV receivers is shown at mid-page of FIG. 1. The multiplexer 1 successively selects time-slices of various services to be reproduced in its response, which is supplied as input signal to an internet-protocol encapsulator 2. An internet-protocol encapsulator (IPE) encapsulates the incoming IP-datagrams into MPE (MultiProtocol Encapsulation) sections, which MPE sections are subsequently segmented to fit within 188-byte MPEG-transport-stream packets referred to as IPE packets. The IPE 2 further encapsulates the required PSI/SI (Program Specific Information/Service Information) signaling data that is to accompany each frame of DTV data to be transmitted for reception by stationary receivers.

Super-frames have customarily been composed of four consecutive frames apiece, three frames respectively comprising data from each of the services for reception by stationary receivers and a fourth frame comprising a plurality of respective sub-frames from each of the services for reception by M/H receivers. FIG. 1 shows an exemplary arrangement of elements 3, 4, 5, 6, 7 and 8 for supplying the multiplexer 1 with time-slices of data from a plurality of services scheduled for iterative-diversity reception by stationary DTV receivers. Each frame can be composed of eight successive time-slices of equal duration successively numbered modulo-8 from 001 to 000, for example.

Data concerning a first of the services to be transmitted twice to enable iterative-diversity reception by stationary DTV receivers are supplied to the input port of a data randomizer 3. The data randomizer 3 is connected for supplying its response to the random-access port of a dual-port random-access memory 4 for being written into temporary storage locations therein. The RAM 4 is capable of temporarily storing a number at least 32M+1 of time-slices of the first service, each to be transmitted twice, one time-slice more than M super-frames apart, to enable iterative-diversity reception by stationary DTV receivers. The dual-port RAM 4 has a serial output port connected to a first input port of the multiplexer 1 of time-sliced services for reception by stationary DTV receivers. Successive time-slices of the first service for reception by stationary DTV receivers are read from the RAM 4, one odd-numbered time-slice per super-frame, to support the initial transmissions of those time-slices. The successive time-slices of the first service for reception by stationary DTV receivers are read again from the RAM 4, one even-numbered time-slice per super-frame, to support the final transmissions of those time-slices.

Data concerning a second of the services to be transmitted twice to enable iterative-diversity reception by stationary DTV receivers are supplied to the input port of a data randomizer 5. The data randomizer 5 is connected for supplying its response to the random-access port of a dual-port random-access memory 6 for being written into temporary storage locations therein. The RAM 6 is capable of temporarily storing a number, at least 32M+1, of time-slices of the second service to be transmitted twice to enable iterative-diversity reception by stationary DTV receivers. The dual-port RAM 6 has a serial output port connected to a second input port of the multiplexer 1 of time-sliced services for reception by stationary DTV receivers. Successive time-slices of the second service for reception by stationary DTV receivers are read from the RAM 6, one odd-numbered time-slice per super-frame, to support the initial transmissions of those time-slices. The successive time-slices of the second service for reception by stationary DTV receivers are read again from the RAM 6, one even-numbered time-slice per super-frame, to support the final transmissions of those time-slices.

Data concerning a third of the services to be transmitted twice to enable iterative-diversity reception by stationary DTV receivers are supplied to the input port of a data randomizer 7. The data randomizer 7 is connected for supplying its response to the random-access port of a dual-port random-access memory 8 for being written into temporary storage locations therein. The RAM 8 is capable of temporarily storing a number, at least 32M+1, of time-slices of the third service to be transmitted twice to enable iterative-diversity reception by stationary DTV receivers. The dual-port RAM 8 has a serial output port connected to a third input port of the multiplexer 1 of time-sliced services for reception by stationary DTV receivers. Successive time-slices of the third service for reception by stationary DTV receivers are read from the RAM 8, one odd-numbered time-slice per super-frame, to support the initial transmissions of those time-slices. The successive time-slices of the third service for reception by stationary DTV receivers are read again from the RAM 8, one even-numbered time-slice per super-frame, to support the final transmissions of those time-slices.

Alternatively, the data randomizers 3, 5 and 7 can be connected after the RAMs 4, 6 and 8, rather than before. Each of the data randomizers 3, 5 and 7 exclusive-ORs the bits of a data stream with the bits of a standardized pseudo-random binary sequence. Data randomization of the final 187 bytes of the MPEG-2 transport-stream packets can also be done using a single data randomizer connected just after the output port of the multiplexer 1. Connecting the data randomizers 3, 5 and 7 before the RAMs 4, 6 and 8 allows the data randomizers to operate at the slower rate that these RAMs can be written, rather than at a higher rate at which these RAMs must be read.

FIG. 2 shows connections for supplying the 188-byte IPE packets from the IPE 2 to the input port of an RS encoder 9 for (204, 188) Reed-Solomon coding. The RS encoder 10 generates shortened 255-byte Reed-Solomon codewords, each formed using an all-ZEROs fill as the fifty-one virtual bytes of the full-length Reed-Solomon codeword. The output signal from the RS encoder 9 reproduces the IPE packets read to the RS encoder 9, following each IPE packet with parity bytes for the (204, 188) Reed-Solomon coding as calculated by the RS encoder 9. The output port of the RS encoder 9 is connected for supplying successive (204, 188) Reed-Solomon codewords to the input port of a logic inverter 10 and to the first of two input ports of a selector 11. The output port of the logic inverter 10 connects to the second input port of the selector 11, supplying it with ONEs' complemented (204, 188) Reed-Solomon codewords.

Figure 9:
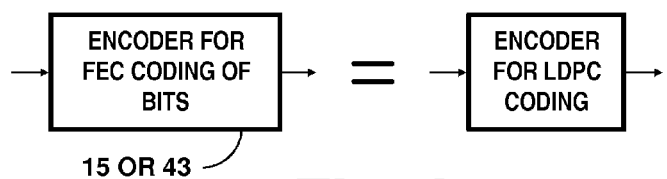

A counter 12 is connected for counting the number of ONEs in each (204, 188) RS codeword generated by the RS encoder 9. A comparator 13 is connected for receiving counts supplied from the counter 12 and determining whether or not the final count of ONEs in each (204, 188) RS codeword is less than a prescribed number N. If the comparator 13 determines that the count of ONEs in a (204, 188) RS codeword is at least that prescribed number N, it supplies an indication of this that conditions the selector 11 to reproduce at its output port the shortened (204, 188) Reed-Solomon codeword containing the IPE packet that the RS encoder 9 supplies to the first input port of the selector 11. If the comparator 13 determines that the count of ONEs in an IPE packet is less than the prescribed number N, it supplies an indication of this that conditions the selector 11 to reproduce at its output port the ONEs' complemented shortened (204, 188) Reed-Solomon codeword containing the IPE packet that the logic inverter 10 supplies to the second input port of the selector 11. The prescribed number N will customarily be substantially smaller than eight hundred sixteen, half the maximum number of ONEs possible in 204 eight-bit bytes. A smaller prescribed number N reduces problems that arise in a stationary DTV receiver when it is unable to determine whether ones of the (204, 188) shortened RS codewords it receives were transmitted in TRUE form or in ONEs' complemented form. This difficulty arises owing to those codewords having been corrupted during their transmission. Using a smaller prescribed number N reduces the likelihood that shortened RS codewords are transmitted in ONEs' complemented form. The DTV receiver can then be designed to presume that any badly corrupted (204, 188) shortened RS codewords it receives were transmitted in TRUE form, which presumption will more likely than not be correct. The prescribed number N is chosen large enough that the subsequent FEC coding of bits by the encoder 15 will have, at least most of the time, a sufficiency of ONEs to facilitate soft decoding procedures by DTV receivers, even when per custom the FEC coding of bits is plural-phase in nature. The use of recursive systematic convolutional coding in some form by the encoder 15 favors the generation of ONEs in the parity bits, even though there is some sparseness of ONEs in the randomized systematic data bits. This tends to allow the prescribed number N to be chosen smaller than would be the case for the encoder 15 being of a sort using LDPC coding, as shown in FIG. 9.

FIG. 2 shows the output port of the selector 11 connected for supplying its response, the shortened (204, 188) RS codewords in TRUE form or in ONEs' complemented form, to the input port of a convolutional byte interleaver 14. Generally, convolutional byte interleavers are constructed from byte-organized, dual-ported random access memories written according to one pattern of addressing the storage locations therein and subsequently read according to another pattern of addressing the storage locations therein. The pattern of byte interleaving by the convolutional byte interleaver 14 is preferably one that provides staircase interleaving of the (204, 188) Reed-Solomon codewords of a time-slice, relative to raster scanning of a 204-byte-wide data field. Preferably, the staircase interleaving of bytes wraps around from the conclusion of the 204-byte-wide data field to its beginning. The generally diagonal nature of the staircase interleaving means that sustained burst noise extending for as many as sixteen rows of the 204-byte-wide data field will cause no more than sixteen byte errors in any (204, 188) RS codeword. If byte errors in a (204, 188) RS codeword are located externally to the codeword, as many as sixteen byte errors in the codeword can be corrected during its decoding in the M/H receiver. If byte errors in a (204, 188) RS codeword have to be located internally, within the codeword itself, only up to eight byte errors in the codeword can be corrected during its decoding in the M/H receiver. Sustained burst noise extending for as many as eight rows of the 204-byte-wide data field can still be corrected.

The convolutional byte interleaver 14 is connected for supplying the byte-interleaved (204, 188) RS codewords in its response as the input signal for an encoder 15 for FEC coding the bits of its input signal. The encoder 15 can be any of the kinds shown in FIGS. 5, 6, 7, 8, 9, 10 and 11, for example. The output port of the encoder 15 is connected to the input port of a symbol constellation mapper 16 for 64QAM, for 256QAM or for 512QAM. The 64QAM and 256QAM symbol constellations are square in form in two-dimensional complex-number space. The 512QAM symbol constellations are cruciform. The output port of the QAM symbol constellation mapper 16 is connected to the input port of a parser 17 for effective OFDM symbol blocks.

The block parser 17 parses a stream of complex samples supplied from the QAM symbol constellation mapper 16 into uniform-length sequences of complex samples, each of which sequences is associated with a respective effective OFDM symbol. The output port of the block parser 17 is connected to a first input port of a pilot and TPS signal insertion unit 18, a second input port of which unit 18 is connected to receive Transmission Parameters Signaling (TPS) bits from a TPS signal generator 19. The pilot and TPS signal insertion unit 18 inserts these TPS bits, which are to be conveyed by dedicated carriers (TPS Pilots), into each effective OFDM symbol block. The pilot and TPS signal insertion unit 18 inserts other bits descriptive of unmodulated carriers of predetermined amplitude and predetermined phase into each effective OFDM symbol block. An output port of the pilot and TPS signal insertion unit 18 is connected for supplying the effective OFDM symbol blocks with pilot carriers inserted therein to the input port of an OFDM modulator 20.

The OFDM modulator 20 has 8K carriers capability, suitable for transmissions to stationary DTV receivers. The OFDM modulator 20 includes a serial-to-parallel converter for converting the serially generated complex digital samples of the effective OFDM symbols to parallel complex digital samples for inverse discrete Fourier transformation (I-DFT). The OFDM modulator 20 further includes a parallel-to-serial converter for converting the parallel complex digital samples of the I-DFT results to serial complex digital samples of the I-DFT results supplied from the output port of the OFDM modulator 20 to the input port of a guard-interval-and-cyclic-prefix insertion unit 21.

A transmission signal in an OFDM system is transmitted in successive units called OFDM symbols. Each OFDM symbol includes an interval during which an effective symbol is supplied for inverse discrete Fourier transformation (I-DFT), and further includes a guard interval into which the waveform of a part of the latter half of this effective symbol will be directly copied. This guard interval is provided in the initial half of the OFDM symbol. In an OFDM system, such a guard interval is provided to improve performance during multi-path reception. A plurality of OFDM symbols are collected to form one OFDM transmission frame. For example, in the ISDB-T standard, ten OFDM transmission frames are formed by two hundred four OFDM symbols. Insertion positions of pilot signals are set with this unit of OFDM transmission frames as a reference.

FIG. 2 shows the output port of the guard-interval-and-cyclic-prefix insertion unit 21 connected for supplying successive complex digital samples of a COFDM signal to a first input port of an all-services multiplexer 22. The output port of the all-services multiplexer 22 is connected to the input port of a digital-to-analog converter 23. FIG. 2 shows the output port of the DAC 23 connected for supplying its analog COFDM signal response to the input port of an up-converter 24 for converting baseband-frequency analog COFDM signal to very-high-frequency (VHF) or ultra-high-frequency (UHF) analog COFDM signal. FIG. 2 shows the output port of the up-converter 24 connected for supplying analog COFDM signal at radio frequencies to the input port of a linear power amplifier 25. FIG. 2 shows the output port of the linear power amplifier 25 connected for driving RF analog COFDM signal power to a transmission antenna 26. FIG. 2 omits showing some details of the DTV transmitter, such as band-shaping filters for the RF signals.

FIGS. 3 and 4 together show a portion of a DTV transmitter generating COFDM signals for reception by mobile and hand-held DTV receivers, collectively referred to as "M/H receivers". FIG. 3 shows apparatus for processing time-slices of data to be transmitted for reception by M/H receivers, which processing generates a multiplex of IPE packets. FIG. 4 shows apparatus for FEC-coding the multiplex of IPE packets and subsequently generating COFDM signals from the results of the forward-error-correction coding.

The middle of FIG. 3 depicts a multiplexer 27 of time-sliced services to be transmitted for reception by M/H receivers. A first encoder 28 for transverse (255, 191) Reed-Solomon coding is connected for encoding odd-numbered ones of successive time-slices in the response from the multiplexer 27. A second encoder 29 for transverse (255, 191) Reed-Solomon coding is connected for encoding even-numbered ones of successive time-slices in the response from the multiplexer 27. The responses of the transverse-Reed-Solomon (TRS) encoders 28 and 29 are interleaved in time to supply input signal to an internet-protocol encapsulator (IPE) 30. In practice somewhat different from DVB-H practice, the full-length (255, 191) RS codewords are aligned in parallel with each other, orthogonal to the scanning of IPE packets therefrom. This is arranged for by sizing the FEC frames to consist of a low multiple of 184 TRS codewords, rather than a multiple of 256 TRS codewords.

The IPE 30 employs time-slicing technology for sending data in bursts, each burst including a respective FEC frame supplied from one of the TRS encoders 28 and 29. Each burst begins with MPE timing information that receivers need, so as to know when to expect the next burst. The relative amount of time from the beginning of a current MPE frame to the beginning of the next burst is indicated within a burst in the header of each MPE frame. This enables a handset receiver to shut down between bursts, thereby minimizing power consumption and preserving battery life.

In transmissions made per the DVB-H standard, further signaling information in regard to time-slicing, such as burst duration, is included in the time_slice_fec_identifier_descriptor in the INT (IP/MAC Notification Table). Some of this information is also sent within Transmission Parameters Signaling (TPS) bits that are transported by dedicated carriers (TPS Pilots) in the COFDM (Coded Orthogonal Frequency Division Multiplexing) signal so as to be more quickly and easily available to receivers. This relieves a receiver of the need to decode MPEG2 and PSI/SI information. Such further time-slicing signaling information can be transmitted in tabular format prescribed in a standard developed for broadcasting DTV in the USA, as well as some of this information being sent as TPS bits. For example, this further time-slicing signaling information could be incorporated into an extension of the SMT-M/H table, as carried over from 8VSB DTV broadcasting.

How the multiplexer 27 can be supplied time-slices of data from a plurality of services scheduled for iterative-diversity reception by mobile and hand-held DTV receivers, referred to collectively as "M/H" receivers, is next considered. FIG. 3 shows an exemplary arrangement of elements 31, 32, 33, 34, 35 and 36 for doing this.

Data concerning a first of the services to be transmitted twice to enable iterative-diversity reception by M/H receivers is supplied to the input port of a data randomizer 31. The data randomizer 31 is connected for writing its response into a dual-port random-access memory 32 via a random-access port thereof. The RAM 32 is capable of temporarily storing a number, at least 32M+1, of time-slices of the first service to be transmitted twice to enable iterative-diversity reception by M/H receivers. The dual-port RAM 32 has a serial output port connected to a first input port of the multiplexer 27 of time-sliced services for reception by M/H receivers. Successive time-slices of the first service for such reception are read from the RAM 32, one odd-numbered time-slice per super-frame, to support the initial transmissions of those time-slices. The successive time-slices of the first service for such reception are read again from the RAM 32, one even-numbered time-slice per super-frame, to support the final transmissions of those time-slices.

Data concerning a second of the services to be transmitted twice to enable iterative-diversity reception by M/H receivers are supplied to the input port of a data randomizer 33. The data randomizer 33 is connected for writing its response into a dual-port random-access memory 34 via a random-access port thereof. The RAM 34 is capable of temporarily storing a number, at least 32M+1, of time-slices of the second service to be transmitted twice to enable iterative-diversity reception by M/H receivers. The dual-port RAM 34 has a serial output port connected to a second input port of the multiplexer 27 of time-sliced services for reception by M/H receivers. Successive time-slices of the second service for such reception are read from the RAM 34, one odd-numbered time-slice per super-frame, to support the initial transmissions of those time-slices. The successive time-slices of the second service for reception by M/H receivers are read again from the RAM 34, one even-numbered time-slice per super-frame, to support the final transmissions of those time-slices.

Data concerning a third of the services to be transmitted twice to enable iterative-diversity reception by M/H receivers are supplied to the input port of a data randomizer 35. The data randomizer 35 is connected for writing its response into a dual-port random-access memory 36 via a random-access port thereof. The RAM 36 is capable of temporarily storing a number, at least 32M+1, of time-slices of the third service to be transmitted twice to enable iterative-diversity reception by M/H receivers. The dual-port RAM 36 has a serial output port connected to a third input port of the multiplexer 27 of time-sliced services for reception by M/H receivers. Successive time-slices of the third service for reception by M/H receivers are read from the RAM 36, one odd-numbered time-slice per super-frame, to support the initial transmissions of those time-slices. The successive time-slices of the third service for reception by M/H receivers are read again from the RAM 36, one even-numbered time-slice per super-frame, to support the final transmissions of those time-slices.

Alternatively, the data randomizers 31, 33 and 35 can be connected after the RAMs 32, 34 and 36, rather than before. Data randomization of the final 187 bytes of the MPEG-2 transport-stream packets can also be done using a single data randomizer connected just after the output port of the multiplexer 27.

FIG. 4 shows apparatus for FEC coding the multiplex of MPEG-transport-stream packets in the response from the internet-protocol encapsulator (IPE) 30 in FIG. 3. FIG. 4 further shows apparatus for subsequently generating COFDM signals responsive to the results of that FEC coding, which COFDM signals are transmitted over the air for iterative-diversity reception by stationary DTV receivers.

FIG. 4 shows connections for supplying the 188-byte MPEG-transport-stream packets in the response from the IPE 30 to the input port of an RS encoder 37 for (204, 188) Reed-Solomon coding. The RS encoder 37 generates shortened 255-byte Reed-Solomon codes, each formed using an all-ZEROs fill as the fifty-one virtual bytes of the full-length Reed-Solomon codeword. The output signal from the RS encoder 37 reproduces the MPEG-transport-stream packets read to the RS encoder 37 from the output port of the IPE 30, but replaces the null-bytes in the parity fields following those packets with parity bytes for the (204, 188) Reed-Solomon coding as calculated by the RS encoder 37. The output port of the RS encoder 37 is connected for supplying successive (204, 188) Reed-Solomon codewords to the input port of a logic inverter 38 and to the first of two input ports of a selector 39. The output port of the logic inverter 38 connects to the second input port of the selector 39, supplying it with ONEs' complemented (204, 188) Reed-Solomon codewords.

A counter 40 is connected for counting the number of ONEs in each 188-byte MPEG-transport-stream packet supplied to be (204, 188) Reed-Solomon coded by the RS encoder 37. A comparator 41 is connected for receiving counts supplied from the counter 40 and determining whether or not the final count of ONEs in each (204, 188) RS codeword is less than a prescribed number N. If the comparator 41 determines that the count of ONEs in a (204, 188) RS codeword is at least that prescribed number N, it supplies an indication of this that conditions the selector 39 to reproduce at its output port the shortened (204, 188) Reed-Solomon codeword containing the IPE packet that the RS encoder 37 supplies to the first input port of the selector 39. If the comparator 41 determines that the count of ONEs in an IPE packet is less than the prescribed number N, it supplies an indication of this that conditions the selector 39 to reproduce at its output port the ONEs' complemented shortened (204, 188) Reed-Solomon codeword containing the IPE packet that the logic inverter 38 supplies to the second input port of the selector 39. The prescribed number N will customarily be substantially smaller than eight hundred sixteen, half the maximum number of ONEs possible in 188 eight-bit bytes. A smaller prescribed number N reduces problems with the decoding of two-dimensional Reed-Solomon coding in transmissions for M/H reception, which problems arise when an M/H receiver is unable to determine whether ones of the (204, 188) shortened RS codewords it receives were transmitted in TRUE form or in ONEs' complemented form.

FIG. 4 shows the output port of the selector 39 connected for supplying its response, the shortened (204, 188) RS codewords in TRUE form or in ONEs' complemented form, to the input port of a convolutional byte interleaver 42. (The ONEs' complemented form is sometimes referred to as "FALSE" form.) The pattern of byte interleaving by the convolutional byte interleaver 42 is preferably one that provides staircase interleaving of the (204, 188) Reed-Solomon codewords of a time-slice, relative to raster scanning of a 204-byte-wide data field. Preferably, the staircase interleaving of bytes wraps around from the conclusion of the 204-byte-wide data field to its beginning. The generally diagonal nature of the staircase interleaving means that sustained burst noise extending for as many as sixteen rows of the 204-byte-wide data field will cause no more than sixteen byte errors in any (204, 188) RS codeword. If byte errors in a (204, 188) RS codeword are located externally to the codeword, as many as sixteen byte errors in the codeword can be corrected during its decoding in the M/H receiver. If byte errors in a (204, 188) RS codeword have to be located internally, within the codeword itself, only up to eight byte errors in the codeword can be corrected during its decoding in the M/H receiver. The number of rows of data bytes in the 204-byte-wide data field that can be corrupted by sustained burst noise and still be corrected is determined by the more powerful forward-error-correction capabilities of the transverse (255, 191) RS coding, however, rather than being confined to the forward-error-correction capabilities of the lateral (204, 188) RS coding. If an integral number of time-slices for transmitting to mobile receivers occupies the same amount of time that each of the time-slices for transmitting to stationary receivers does, the convolutional byte interleaver 42 can be similar in design to the convolutional byte interleaver 17 in the FIG. 2 portion of the DTV transmitter.

The convolutional byte interleaver 42 is connected for supplying the byte-interleaved (204, 188) RS codewords in its response as the input signal for an encoder 43 for FEC coding the bits of its input signal. The encoder 43 can be any of the kinds shown in FIGS. 5, 6, 7, 8, 9, 10 and 11, for example.

The output port of the encoder 43 is connected to the input port of a symbol constellation mapper 44 for 64 QAM. The output port of the QAM symbol constellation mapper 44 is connected to the input port of a parser 45 for effective OFDM symbol blocks. The block parser 45 parses a stream of complex samples supplied from the QAM symbol constellation mapper 44 into uniform-length sequences of complex samples, each of which sequences is associated with a respective effective OFDM symbol. The output port of the block parser 45 is connected to a first input port of a pilot and TPS signal insertion unit 46, a second input port of which unit 46 is connected to receive Transmission Parameters Signaling (TPS) bits from a TPS signal generator 47. The pilot and TPS signal insertion unit 46 inserts these TPS bits, which are to be transported by modulated dedicated carriers (TPS pilot carriers), into each effective OFDM symbol block. The pilot and TPS signal insertion unit 46 inserts other bits descriptive of unmodulated carriers of predetermined amplitude and predetermined phase into each effective OFDM symbol block. An output port of the pilot and TPS signal insertion unit 46 is connected for supplying the effective OFDM symbol blocks, with pilot carriers inserted therein, to the input port of an OFDM modulator 48. The OFDM modulator 48 has 4K carriers capability, suitable for transmissions to M/H receivers as well as to stationary DTV receivers.

The OFDM modulator 48 includes a serial-to-parallel converter for converting the serially generated complex digital samples of the effective OFDM symbols to parallel complex digital samples for inverse discrete Fourier transformation (I-DFT). The OFDM modulator 48 further includes a parallel-to-serial converter for converting the parallel complex digital samples of the I-DFT results to serial complex digital samples of the I-DFT results supplied from the output port of the OFDM modulator 48 to the input port of a guard-interval-and-cyclic-prefix insertion unit 49. The output port of the guard-interval-and-cyclic-prefix insertion unit 49 is connected for supplying successive complex digital samples of a COFDM signal to a second input port of the all-services multiplexer 22.

Figure 5:
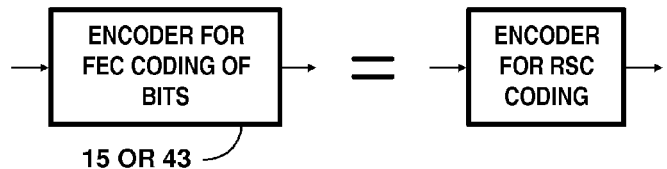
FIGS. 5, 6, 7, 8 and 9 illustrate encoders for various species of forward-error-correction coding, any one of which sorts of encoders can be used in the FIG. 2 and FIG. 4 portions of a COFDM transmitter for a DTV system embodying aspects of the invention.

FIG. 5 shows the FIG. 2 encoder 15 for FEC coding or the FIG. 4 encoder 43 for FEC coding as being an encoder for recursive systematic convolutional (RSC) coding. Recursion is used in the convolutional coding, better to maintain an adequate population of ONEs therein.

Figure 6:
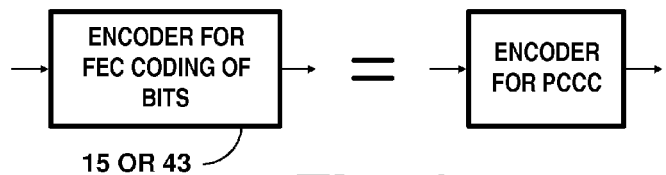

FIG. 6 shows the FIG. 2 encoder 15 for FEC coding or the FIG. 4 encoder 43 for FEC coding as being an encoder for parallel concatenated convolutional coding (PCCC). By way of example, the encoder for PCCC can be as prescribed by the Universal Mobile Telecommunications System (UMTS) specification and standardized by the Third-Generation Partnership Project (3GPP).

Figure 7:
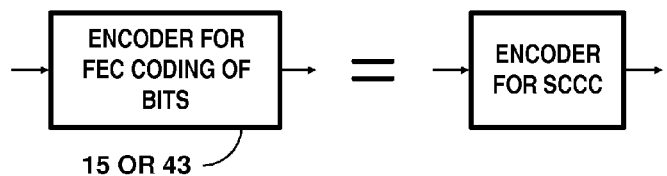
Figure 8:
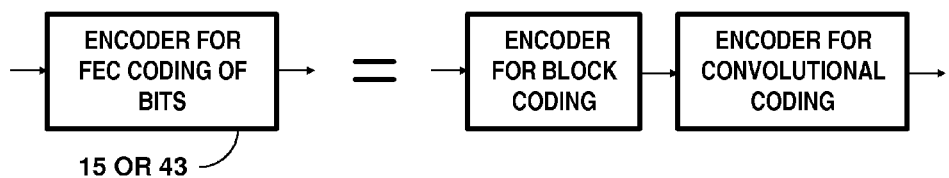

FIG. 7 shows the FIG. 2 encoder 15 for FEC coding or the FIG. 4 encoder 43 for FEC coding as being an encoder for serial concatenated convolutional coding (SCCC). FIG. 8 shows the FIG. 2 encoder 15 or the FIG. 4 encoder 43 as being an encoder for product coding, which encoder is composed of an encoder for block coding followed by an encoder for convolutional coding connected in cascade thereafter. FIG. 9 shows the FIG. 2 encoder 15 or the FIG. 4 encoder 43 as being an encoder for low-density parity-check (LDPC) coding.

FIG. 10 shows apparatus for FEC coding convolutional byte interleaver response differently during initial transmissions of DTV data than during subsequent repeated transmissions of similar DTV data to facilitate iterative-diversity reception. One-half-rate convolutional coding (CC) of DTV data during the initial transmissions and during the subsequent re-transmissions is performed such as to provide parallel concatenated convolutional coding (PCCC) in which the original DTV data appears in both the initial transmissions and the subsequent re-transmissions.

The encoder 15 shown in FIG. 2 can be constructed per FIG. 10. So can the encoder 43 shown in FIG. 4. The output port of the convolutional byte interleaver 14 shown in FIG. 2 or the convolutional byte interleaver 42 shown in FIG. 4 is connected for supplying the response therefrom to the respective input ports of selectors 50 and 51 shown in FIG. 10. The selector 50 selectively responds to the convolutionally byte-interleaved (204, 188) Reed-Solomon codewords of odd-numbered time-slices supplied to its input port, reproducing them in bit-serial form at its output port. The selector 51 selectively responds to the convolutionally byte-interleaved (204, 188) Reed-Solomon codewords of even-numbered time-slices supplied to its input port, reproducing them in bit-serial form at its output port.

The bit-serial, convolutionally byte-interleaved (204, 188) Reed-Solomon codewords of odd-numbered time-slices are supplied from the output port of the selector 50 to the input port of a bits interleaver 52. The output port of the bits interleaver 52 is connected for supplying bit-interleaved response to the input port of a CC encoder 53 for one-half-rate convolutional coding. The output port of the CC encoder 53 is connected for supplying one-half-rate CC to the input port of a symbols de-interleaver 54. The bits interleaver 52 and the symbols de-interleaver 54 cooperate to provide coded (or "implied") interleaving of the CC from the output port of the symbols de-interleaver 54. The symbols de-interleaver 54 de-interleaves half-nibble symbols in a way complementary to the way that the bits interleaver 52 interleaves randomized systematic data bits supplied to the CC encoder 14 for one-half-rate CC. Accordingly, randomized systematic data bits appear in their original order in the symbol de-interleaved one-half-rate CC supplied from the output port of the symbol de-interleaver 54 to a first of two input ports of a time-division multiplexer 55 for even-numbered and odd-numbered coded-time-slices.

The bit-serial, convolutionally byte-interleaved (204, 188) Reed-Solomon codewords of even-numbered time-slices are supplied from the output port of the selector 51 to the input port of a delay memory 56. The output port of the delay memory 56 is connected to the input port of a CC encoder 57 for one-half-rate convolutional coding. The CC encoder 57 is similar in construction and operation to the CC encoder 53. The output port of the CC encoder 57 is connected for supplying one-half-rate CC to the second input port of the time-division multiplexer 55 for even-numbered and odd-numbered coded-time-slices. The delay memory 56 provides delay that compensates for the latent delays in the bits interleaver 52 and the symbols de-interleaver 54. So, coded even-numbered time-slices that the CC encoder 57 supplies to the second input port of the time-division multiplexer 55 interleave in time with the odd-numbered coded-time-slices that the symbols interleaver 54 supplies to the first input port of the time-division multiplexer 55.

If the FIG. 10 encoder is used as the encoder 15 for FEC coding bits in FIG. 2, the output port of the time-division multiplexer 55 is connected for supplying time-interleaved odd-numbered and even-numbered coded-time-slices to the input port of the 64QAM, 256QAM or 512QAM symbol constellation mapper 16. If the FIG. 10 encoder is used as the encoder 43 for FEC coding bits in FIG. 4, the output port of the time-division multiplexer 55 is connected for supplying time-interleaved odd-numbered and even-numbered coded-time-slices to the input port of the 64QAM symbol constellation mapper 44.

FIG. 11 shows the initial portion of an M/H receiver designed for iterative-diversity reception of COFDM signals as transmitted at VHF or UHF by a DTV transmitter, such as the one depicted in FIGS. 1 through 4. A reception antenna 58 captures the radio-frequency COFDM signal for application as input signal to a front-end tuner 59 of the receiver. The front-end tuner 59 can be of a double-conversion type composed of initial single-conversion super-heterodyne receiver circuitry for converting radio-frequency (RF) COFDM signal to intermediate-frequency (IF) COFDM signal followed by circuitry for performing a final conversion of the IF COFDM signal to baseband COFDM signal. The initial single-conversion receiver circuitry typically comprises a tunable RF amplifier for RF COFDM signal incoming from the reception antenna, a tunable first local oscillator, a first mixer for heterodyning amplified RF COFDM signal with local oscillations from the first local oscillator to obtain the IF COFDM signal, and an intermediate-frequency (IF) amplifier for the IF COFDM signal. Typically, the front-end tuner 59 further includes a synchronous demodulator for performing the final conversion from IF COFDM signal to baseband COFDM signal and an analog-to-digital converter for digitizing the baseband COFDM signal. Synchronous demodulation circuitry typically comprises a final local oscillator with automatic frequency and phase control (AFPC) of its oscillations, a second mixer for synchrodyning amplified IF COFDM signal with local oscillations from the final local oscillator to obtain the baseband COFDM signal, and a low-pass filter for suppressing image signal accompanying the baseband COFDM signal. In some designs of the front-end tuner 59, synchronous demodulation is performed in the analog regime before subsequent analog-to-digital conversion of the resulting complex baseband COFDM signal. In other designs of the front-end tuner 59 analog-to-digital conversion is performed before synchronous demodulation is performed in the digital regime.

Simply stated, the front-end tuner 59 converts radio-frequency COFDM signal received at its input port to digitized samples of baseband COFDM signal supplied from its output port. Typically, the digitized samples of the real component of the baseband COFDM signal are alternated with digitized samples of the imaginary component of the baseband COFDM signal for arranging the complex baseband COFDM signal in a single stream of digital samples. FIG. 11 shows an AFPC generator 60 for generating the automatic frequency and phase control (AFPC) signal for controlling the final local oscillator within the front-end tuner 59.

The output port of the front-end tuner 59 is connected for supplying digitized samples of baseband COFDM signal to the input port of a cyclic prefix detector 61. The cyclic prefix detector 61 differentially combines the digitized samples of baseband COFDM signal with those samples as delayed by the duration of an effective COFDM symbol. Nulls in the difference signal so generated should occur, marking the guard intervals of the baseband COFDM signal. The nulls are processed to reduce any corruption caused by noise and to generate better-defined indications of the phasing of COFDM symbols. The output port of the cyclic prefix detector 61 is connected to supply these indications to a first of two input ports of timing synchronization apparatus 62.

A first of two output ports of the timing synchronization apparatus 62 is connected for supplying gating control signal to the control input port of a guard-interval-removal unit 63, the signal input port of which is connected for receiving digitized samples of baseband COFDM signal from the output port of the front-end tuner 59. The output port of the guard-interval-removal unit 63 is connected for supplying the input port of an OFDM demodulator 64 with windowed portions of the baseband COFDM signal that contain effective COFDM samples. A second of the output ports of the timing synchronization apparatus 62 is connected for supplying the OFDM demodulator 64 with synchronizing information concerning the effective COFDM samples. FIG. 11 shows the OFDM demodulator 64 being of a kind for demodulating 8K carriers as generated by the OFDM modulator 23 in FIG. 2.

The indications concerning the phasing of COFDM symbols that the cyclic prefix detector 61 supplies to the timing synchronization apparatus 62 is sufficiently accurate for initial windowing of a baseband COFDM signal that the guard-interval-removal unit 63 supplies to the OFDM demodulator 64. A first output port of the OFDM demodulator 64 is connected for supplying demodulated pilot carrier information to the input port of a pilot and TPS carriers processor 65. The information concerning unmodulated pilot carriers is processed in the processor 65 to support more accurate windowing of the baseband COFDM signal that the guard-interval-removal unit 63 supplies to the OFDM demodulator 64. Such processing can be done similarly to the way described by Nicole Alcouffe in US-20030148060-A1 published 24 Jul. 2003 with the title "COFDM demodulator with an optimal FFT analysis window positioning", for example. A first of four output ports of the pilot and TPS carriers processor 65 is connected for supplying more accurate window positioning information to the second input port of the timing synchronization apparatus 62.

The pilot and TPS carriers processor 65 demodulates the TPS information conveyed by modulated pilot signals. The second output port of the pilot and TPS carriers processor 65 is connected for supplying the TPS information to an SMT information processing unit 101 shown in FIG. 13.

The third output port of the pilot and TPS carriers processor 65 is connected for forwarding unmodulated pilot carriers to the input port of the AFPC generator 60. The real components of the unmodulated pilot carriers are multiplied by their respective imaginary components in the AFPC generator 60. The resulting products are summed and low-pass filtered to develop the AFPC signal that the AFPC generator 60 supplies to the front-end tuner 59 for controlling the final local oscillator therein. Other ways of developing AFPC signals for the final local oscillator in the front-end tuner 59 are also known, which can replace or supplement the method described above. One such other way is described in U.S. Pat. No. 5,687,165 titled "Transmission system and receiver for orthogonal frequency-division multiplexing signals, having a frequency-synchronization circuit", which was granted to Flavio Daffara and Ottavio Adami on 11 Nov. 1997. Complex digital samples from the tail of each OFDM symbol are multiplied by the conjugates of corresponding digital samples from the cyclic prefix of the OFDM symbol. The resulting products are summed and low-pass filtered to develop the AFPC signal that the AFPC generator 60 supplies to the front-end tuner 59 for controlling the final local oscillator therein.

The fourth output port of the pilot and TPS carriers processor 65 is connected for supplying information concerning the respective energies of unmodulated pilot carriers. This information is supplied to a maximal-ratio QAM combiner 70 shown at the foot of FIG. 11 and in more detail in FIG. 17. The QAM combiner 70 is more fully described further on in this specification with reference to FIG. 17.

A second output port of the OFDM demodulator 64 is connected to supply complex digital coordinates of successive 64QAM symbol constellations to a first input port of a frequency-domain channel equalizer 66. FIG. 11 shows the frequency-domain channel equalizer 66 having a second input port connected for receiving pilot carriers supplied from the first input port of the OFDM demodulator 64. A simple form of frequency-domain channel equalizer 66 measures the amplitude of the unmodulated pilot carriers to determine basic weighting coefficients for various portions of the frequency spectrum. The demodulated carriers descriptive of complex coordinates of successive QAM constellations are then multiplied by respective weighting coefficients determined by interpolation among the basic weighting coefficients determined by measuring the amplitudes of the unmodulated pilot carriers. Various alternative types of frequency-domain channel equalizer are also known. Frequency-domain equalization is augmented by time-domain equalization in some receiver designs.

As thusfar described, the FIG. 11 initial portion of a COFDM receiver is similar to the initial portions of COFDM receivers used for DVB in Europe. However, in a departure from customary practice, the response of the frequency-domain channel equalizer 66 is not supplied directly to a de-mapper for the successive QAM constellations. Instead, the maximal-ratio QAM combiner 70 combines delayed QAM constellations from earlier transmissions of time-slices with QAM constellations from later transmissions of the same time-slices. The combining is done in ratio determined by the relative root-mean-square (RMS) energies of the unmodulated pilot carriers that respectively accompany the earlier transmissions of the QAM constellations and the later transmissions of the same QAM constellations. The maximal-ratio QAM combiner is a configuration presumably novel, differing from the ordinary maximal-ratio code combiner used to combine coding recovered from separate receivers of COFDM signals. The ordinary maximal-ratio code combiner combines one-dimensional, real-only codes obtained from separately de-mapping paired QAM constellation maps. The maximal-ratio QAM combiner is a special type of code combiner, which combines the two-dimensional complex coordinates of paired QAM constellation maps to synthesize respective single QAM constellation maps for de-mapping. When both the earlier transmissions of the QAM constellations and the later transmissions of the same QAM constellations are received in strength, the maximal-ratio combining of the two-dimensional coordinates of paired QAM constellation maps permits improvement of coordinates estimation in the presence of additive white Gaussian noise (AWGN). This is because the coordinates of the paired QAM constellation maps should be correlated, while the AWGN is uncorrelated. Accordingly, errors in de-mapping are less likely to occur, as well as gaps in reception tending to be filled. Maximal-ratio code combining after de-mapping QAM symbol constellations tends to fill gaps in reception, but does not improve coordinates estimation of the paired QAM constellation maps in the presence of AWGN. FIG. 17 depicts the maximal-ratio QAM combiner 70 in more detail, as comprising elements 71-79.

FIG. 11 shows how the two-dimensional coordinates of paired QAM constellation maps are supplied to the maximal-ratio QAM combiner 70 as input signals thereto. The output port of the frequency-domain channel equalizer 66 is connected for supplying complex QAM symbol map coordinates to the input port of a selector 67. The selector 67 selectively reproduces at its output port complex 64QAM symbol map coordinates just for those transmissions that are not repeated and the final ones of those transmissions that are repeated for iterative-diversity reception. The output port of the selector 67 is connected for supplying these complex 64QAM symbol map coordinates to a first input port of the QAM combiner 70.

The output port of the channel equalizer 66 is further connected for supplying complex 64QAM symbol map coordinates to the input port of a selector 68. The selector 68 selectively reproduces at its output port complex QAM symbol map coordinates just for the initial ones of transmissions subsequently repeated for iterative-diversity reception. The output port of the selector 68 is connected for writing these complex QAM symbol map coordinates to the input port of a delay memory 69 that delays the FEC coding of individual bits of the initial transmissions subsequently once-repeated for iterative-diversity reception. The delay can be prescribed fixed delay or, alternatively, can be programmable responsive to delay specified by bits of TPS coding. In either case, the delay is such that the output port of the delay memory 69 supplies complex symbol map coordinates in the transmissions subsequently repeated for iterative-diversity reception concurrently with the complex symbol map coordinates in the corresponding final transmissions supplied from the output port of the selector 67. The output port of the selector 69 is connected for supplying the delayed complex QAM symbol map coordinates to a second input port of the maximal-ratio QAM combiner 70.

The QAM combiner 70 is connected for receiving pilot-carrier-energy information from the pilot and TPS carriers processor 65 shown in FIG. 11. The pilot and TPS carriers processor 65 squares the real and imaginary terms of each unmodulated pilot carrier, sums the resulting squares and square-roots the sum to determine the root-mean-square (RMS) energy of that unmodulated pilot carrier. This procedure can be carried out for each unmodulated pilot carrier using read-only memory addressed by the real and imaginary terms of each successively considered unmodulated pilot carrier. The RMS energies of the unmodulated pilot carriers are then summed by an accumulator, which determines the total RMS energy of the unmodulated pilot carriers for each OFDM symbol epoch. The maximal-ratio QAM combiner 70 weights the complex QAM symbol map coordinates received at its first and second input ports in a ratio dependent on their respective total RMS energies and then adds those coordinates as so weighted to generate complex QAM symbol map coordinates supplied at its output port.

FIG. 12 shows the maximal-ratio QAM combiner 70 response supplied to the input port of a de-mapper 80 for successive QAM symbol constellations. The de-mapper 80 responds to the soft complex QAM coordinates descriptive of successive QAM symbol constellations to recover a number of soft bits of FEC coding from each constellation. By way of example, FIG. 12 shows the de-mapper 80 being of a type to recover six soft bits of one-half-rate or one-third-rate FEC coding from each successive one of 64QAM symbol constellations. The de-mapper 80 can instead be of a type to recover eight soft bits of one-half-rate FEC coding from each successive one of 256QAM symbol constellations, or of a type to recover nine soft bits of one-third-rate FEC coding from each successive one of 512QAM symbol constellations. The demapper 80 supplies the soft bits of FEC coding from its output port to the input port of a soft-input/soft-output decoder 81 of the forward-error-correction coding of bits.

The output port of the SISO decoder 81 is connected for supplying the soft data bits of its decoding results to the input port of a de-interleaver 82 for de-interleaving the convolutional byte interleaving of 8-bit bytes introduced at the DTV transmitter—e.g., as introduced by the convolutional byte interleaver 14 shown in FIG. 2. The output port of the byte de-interleaver 82 is connected for supplying soft data bits without byte interleaving to the input port of a quantizer 83. The byte de-interleaver 82 processes soft data bits, so its memory requirements are apparently quite large. However, the SISO decoder 81 usually includes memory for the soft bits in an entire time-slice, which memory supports iterative-decoding procedures. In actual practice, appropriate addressing of this memory is apt to perform the byte de-interleaving function that FIG. 12 shows the separate byte de-interleaver 82 for performing.

The output port of the quantizer 83 is connected for providing hard decisions concerning the bits of shortened Reed-Solomon codewords to the input port of an 8-bit-byte former 84. The output port of the 8-bit-byte former 84 is connected for supplying 8-bit bytes of the 208-byte RS codewords as received in TRUE or ONEs' complemented form to the respective input ports of a logic inverter 85 and of a decoder 86 for (204, 188) Reed-Solomon coding. The output port of the logic inverter 85 is connected for supplying 8-bit bytes of 208-byte codewords to the input port of a decoder 87 for (204, 188) Reed-Solomon coding. These 208-byte codewords ONEs' complement the 208-byte RS codewords as received in TRUE or ONEs' complemented form at the input port of the logic inverter 85.

In the prior-art DTV receivers of COFDM signals, the RS decoders for (204, 188) Reed-Solomon coding used decoding algorithms that located byte errors, besides subsequently correcting them. These decoding algorithms are capable of correcting no more than eight byte errors. If an RS decoder for (204, 188) RS coding is supplied the locations of byte errors by external means, it can employ a decoding algorithm that is capable of correcting up to sixteen byte errors. The soft data bits supplied from the cascaded SISO decoder 81 and byte de-interleaver 82 contain confidence-level information that can be analyzed to locate byte errors for RS decoding. The output port of the byte de-interleaver 82 is connected for supplying soft data bits without byte interleaving to a bank 88 of exclusive-OR gates. The bank 88 of XOR gates exclusive-ORs the hard data bit of each soft data bit with the remaining bits of that soft bit expressive of the level of confidence that the hard data bit is correct. The result of this operation is the generation of a plurality of bits expressing in absolute terms the level of lack of confidence that the hard data bit is correct. A selector 89 selects the largest level of lack of confidence in the bits of each successive 8-bit byte, to express the lack of confidence in the correctness of the byte considered as a whole. An adaptive threshold detector 90 compares the levels of lack of confidence for each byte in each successive (204, 188) RS codeword to a threshold value to generate a byte error indication for each byte having a level of lack of confidence that exceeds the threshold value. If the adaptive threshold detector 90 detects more than sixteen erroneous bytes in an RS codeword, that RS codeword is re-read from memory supportive of the decoder 81 and the de-interleaver 82 for application to the input ports of the quantizer 83 and the bank 88 of XOR gates. The adaptive threshold detector 90 then adjusts the threshold value for that particular RS codeword individually, raising it from a prescribed initial level, attempting to reduce the number of byte errors detected in the RS codeword to no more than sixteen. When the number of byte errors detected in the RS codeword after threshold adjustment when necessary is no more than sixteen, the adaptive threshold detector 90 then indicates to the RS decoders 86 and 87 the locations of the byte errors in the (204, 188) RS codeword that is next to be corrected.

A selector 91 has a first input port connected for receiving 188-byte data packets from the output port of the RS decoder 86 and a second input port connected for receiving 188-byte data packets from the output port of the RS decoder 87. The selector 91 reproduces at its output port a selected one of each pair of 188-byte data packets concurrently received at its first and second input ports. The output port of the selector 91 is connected for supplying the 188-byte data packets it reproduces to the input port of a data de-randomizer 92 shown in FIG. 13.

The selector 91 is connected for receiving indications from the RS decoder 86 as to whether or not the RS decoder 86 finds each of the 188-byte data packets supplied from its output port to be correct. If the RS decoder 86 indicates that the 188-byte data packet it supplies is correct, this indication conditions the selector 91 to reproduce that data packet at its output port. The RS decoder 86 will extend a 204-byte RS codeword to the 255 bytes of a supposed full-length RS codeword using all-ZEROs "virtual" bytes as a preliminary step in decoding procedure. Absent a received 204-byte RS codeword transmitted in the TRUE logic sense having been corrupted by noise or by signal fading, a correct or correctable full-length 255-byte RS codeword will be formed from that 204-byte RS codeword that contains a 188-byte data packet suitable for reproduction in the selector 91 response.

The RS decoder 86 also uses all-ZEROs "virtual" bytes to extend a received ONEs' complemented 204-byte RS codeword instead of the all-ONEs "virtual" bytes needed for possibly producing a correct 255-byte full-length RS codeword. The RS decoder 86 will not consider the received ONEs' complemented 204-byte RS codeword to be a correct (204, 188) RS codeword nor to be correctable to one. The RS decoder 86 will indicate to the selector 91 that the 188-byte data packet currently supplied from its output port is incorrect.

The selector 91 is connected for also receiving indications from the RS decoder 87 as to whether or not the RS decoder 87 finds each of the 188-byte data packets supplied from its output port to be correct. If the RS decoder 87 indicates that the 188-byte data packet it supplies is correct, this indication conditions the selector 91 to reproduce that data packet at its output port. The logic inverter 85 responds to a correct or correctable ONEs' complemented 204-byte RS codeword supplied from the output port of the 8-bit-byte former 84 to supply that 204-byte RS codeword in TRUE logic sense to the RS decoder 87. The RS decoder 87 will extend this 204-byte codeword to the 255 bytes of a full-length RS codeword using all-ZEROs "virtual" bytes as a preliminary step in decoding procedure. Absent the received 204-byte codeword having been corrupted by noise or by signal fading, a correct or correctable full-length 255-byte RS codeword will be formed that contains a 188-byte data packet suitable for reproduction in the selector 91 response.

The logic inverter 85 responds to a correct or correctable 204-byte codeword supplied in TRUE logic sense from the output port of the 8-bit-byte former 84 to supply that 204-byte codeword with ONEs' complemented bits to the RS decoder

87. The RS decoder 87 will extend this 204-byte codeword to the 255 bytes of a supposed full-length RS codeword using all-ZEROs "virtual" bytes as a preliminary step in decoding procedure. This will not form a correct or correctable full-length 255-byte RS codeword, since the 51 virtual bytes should be all-ONEs bytes rather than all-ZEROs bytes. The RS decoder 87 will not consider this response from the logic inverter 85 to be a correct (204, 188) RS codeword nor to be correctable to one. The RS decoder 87 will indicate to the selector 91 that the 188-byte data packet currently supplied from its output port is incorrect.

The selector 91 will never receive indications from the RS decoder 86 and the RS decoder 87 that the data packets they concurrently supply are both correct. However, the selector 91 can receive indications from the RS decoder 86 and the RS decoder 87 that the data packets they concurrently supply are both incorrect when (204, 188) RS codewords as transmitted in TRUE or ONEs' complemented form are corrupted by noise or by signal fading. In such case, if connected simply as shown in FIG. 12, the selector 91 is conditioned to reproduce the incorrect 188-byte packet supplied from the RS decoder 86.

Referring now to FIG. 13, the data de-randomizer 92 exclusive-ORs 188-byte data packets supplied from the output port of the selector 91 with a prescribed pseudo-random binary sequence to produce de-randomized 188-byte data packets from its output port. The stationary DTV receiver from this point on resembles a mobile/handheld (M/H) receiver for DTV transmissions made using 8VSB, as specified by the standard directed to broadcasting digital television and digital data to mobile receivers adopted by ATSC on 15 Oct. 2009. The transmissions to stationary DTV receivers are presumed to use internet protocol—e.g., as transmitted by the transmitter apparatus of FIGS. 1 and 2 when the IP encapsulator 2 is used. The IP data supplied from the output port of the data de-randomizer 92 in FIG. 13 essentially correspond to the IP data that an M/H receiver recovers from M/H transmissions made using 8VSB. The transmissions to stationary DTV receivers may instead be made using a protocol similar to DVB-T or to 8VSB as specified in the 1995 ATSC Digital Television Standard, which standards relied on MPEG-2 transport-stream packets exclusively. In such case, the de-randomized 188-byte transport-stream packets from the output port of the data de-randomizer 92 will be supplied directly to a decoder for the video data packets and to a decoder for the audio data packets, much as done in prior-art DTV receivers.

FIG. 13 shows the input port of a parsing unit 93 for parsing the data stream into internet-protocol (IP) packets connected for receiving de-randomized IPE packets from the output port of the data de-randomizer 92. The IP-packet parsing unit 93 performs this parsing responsive to two-byte row headers respectively transmitted at the beginning of each 188-byte IPE packet. This row header indicates where the earliest start of an IP packet occurs within that 188-byte IPE packet. If a short IP packet is completely contained within a 188-byte IPE packet, the IP-packet parsing unit 93 calculates the start of a later IP packet proceeding from the packet length information contained in the earlier IP packet from that same 188-byte IPE packet.

The IP-packet parsing unit 93 is connected for supplying IP packets to a decoder 94 for cyclic-redundancy-check coding in IP packets. Each IP packet begins with a nine-byte header and concludes with a four-byte, 32-bit checksum for CRC coding of that IP packet. The decoder 94 is constructed to preface each IP packet that it reproduces with a prefix bit indicating whether or not error has been detected in that IP packet. The decoder 94 is connected to supply these IP packets as so prefaced to a detector 95 of a "well-known" SMT address and to a delay unit 96. The delay unit 96 delays the IP packets supplied to a packet selector 97 for selecting SMT IP packets from other IP packets. The delay unit 96 provides delay of a part of an IP packet header interval, which delay is long enough for the detector 95 to ascertain whether or not the "well-known" SMT address is detected.

If the detector 95 does not detect the "well-known" SMT address in the IP packet, the detector 95 output response conditions the packet selector 97 to reproduce the IP packet for application to a packet sorter 98 as input signal thereto. The packet sorter 98 sorts out those IP packets in which the preface provides no indication of CRC coding error for writing to a cache memory 99 for IP packets. The prefatory prefix bit before each of the IP packets that indicates whether there is CRC code error in its respective bytes is omitted when writing the cache memory 99. The cache memory 99 temporarily stores at least those IP packets not determined to contain CRC code error for possible future reading to the later stages 100 of the receiver.

If the detector 95 does detect the "well-known" SMT address in the IP packet, establishing it as an SMT IP packet, the detector 95 output response conditions the packet selector 97 to reproduce the SMT IP packet for application to an SMT information processing unit 101, which includes circuitry for generating control signals for the later stages 100 of the mobile receiver. FIG. 18 shows the SMT information processing unit 101 connected for receiving FIC information from the TPS carriers processor 65 in FIG. 11. The SMT information processing unit 101 integrates this information with information from SMT IP packets during the generation of Service Map Data. The Service Map Data generated by the SMT information processing unit 101 is written into memory 102 for temporary storage therein and subsequent application to the later stages 100 of the mobile receiver. The SMT information processing unit 101 relays those SMT IP packets that have bit prefixes that do not indicate error in the packets to a user interface 103. The user interface 103 includes an Electronic Service Guide (ESG) and apparatus for selectively displaying the ESG on the viewing screen of the mobile receiver.

FIGS. 14, 15, 16 and 13 together provide a generic schematic diagram of a mobile DTV receiver adapted for iterative-diversity reception of COFDM signals as transmitted by the portions of the DTV transmitter depicted in FIGS. 3 and 4. COFDM transmissions to mobile DTV receivers are presumed to employ 64QAM symbol constellations, rather than the 256QAM or 512QAM symbol constellations used in transmissions to stationary DTV receivers. Rather than 8K carrier waves in the COFDM used in transmissions to stationary DTV receivers, the COFDM used in transmissions to mobile DTV receivers uses only 4K carrier waves. The portion of the mobile DTV receiver shown in FIG. 14 differs from the portion of the stationary DTV receiver shown in FIG. 11 insofar as to take these differences into account. Otherwise, however, elements 104, 105, 106, 107, 108, 109, 110, 111 and 112 shown in FIG. 14 correspond in general function to elements 58, 59, 60, 61, 62, 63, 64, 65 and 66, respectively, shown in FIG. 11. Usually, the reception antenna 104 of the mobile DTV receiver shown in FIG. 14 will differ structurally from the reception antenna 58 of the stationary DTV receiver shown in FIG. 11, of course.

FIG. 14 shows a front-end tuner 105 having an input port connected for receiving RF signals captured by the reception antenna 104. The front-end tuner 105 is further connected for receiving automatic frequency and phase control (AFPC) signal for its final local oscillator from an AFPC generator

106. The output port of the front-end tuner 105 is connected for supplying digitized samples of baseband COFDM signal to the input port of a cyclic prefix detector 107. The output port of the cyclic prefix detector 107 is connected to supply indications of the phasing of COFDM symbols to a first of two input ports of timing synchronization apparatus 108. A first of two output ports of the timing synchronization apparatus 108 is connected for supplying gating control signal to the control input port of a guard-interval-removal unit 109. The signal input port of the guard-interval-removal unit 109 is connected for receiving digitized samples of baseband COFDM signal from the output port of the front-end tuner 105. The output port of the guard-interval-removal unit 109 is connected for supplying the input port of an OFDM demodulator 110 with windowed portions of the baseband COFDM signal that contain effective COFDM samples. A second of the output ports of the timing synchronization apparatus 108 is connected for supplying the OFDM demodulator 110 with synchronizing information concerning the effective COFDM samples.

A first output port of the OFDM demodulator 110 is connected for supplying demodulated pilot carrier information to the input port of a pilot and TPS carriers processor 111. A first of four output ports of the pilot and TPS carriers processor 111 is connected for supplying more accurate window positioning information to the second input port of the timing synchronization apparatus 108. The second output port of the pilot and TPS carriers processor 111 is connected for supplying the TPS information to the SMT information processing unit 101 shown in FIG. 13. The third output port of the pilot and TPS carriers processor 111 is connected for forwarding unmodulated pilot carriers to the input port of the AFPC generator 106 that supplies AFPC signal to the front-end tuner 105 for controlling the final local oscillator therein. The fourth output port of the pilot and TPS carriers processor 111 is connected for supplying information concerning the respective energies of unmodulated pilot carriers to the maximal-ratio QAM combiner 70 shown at the foot of FIG. 14.

A second output port of the OFDM demodulator 110 is connected to supply demodulated complex digital coordinates of successive 64QAM symbol constellations to a first input port of a frequency-domain channel equalizer 112. FIG. 14 shows the frequency-domain channel equalizer 112 having a second input port connected for receiving pilot carriers supplied from the first input port of the OFDM demodulator 110. The output port of the channel equalizer 112 is connected for supplying equalized carriers conveying FEC coding in QAM format to the input ports of selectors 113 and 114. The selector 113 is operable for reproducing at its output port just those transmissions that are not repeated and the final ones of those transmissions repeated for iterative-diversity reception. The selector 114 is operable for reproducing at its output port just the initial ones of those transmissions subsequently repeated for iterative-diversity reception. The output port of the selector 114 is connected for writing to the input port of a delay memory 115 that delays the initial transmissions subsequently once-repeated for iterative-diversity reception. The delay is such that the transmissions subsequently repeated for iterative-diversity reception are supplied from the output port of the delay memory 115 concurrently with the corresponding final transmissions as repeated for iterative-diversity reception that are supplied from the output port of the selector 113. FIG. 14 shows the output port of the selector 113 connected to the first input port of the maximal-ratio QAM combiner 70. FIG. 14 shows the output port of the delay memory 115 connected to the second input port of the maximal-ratio QAM combiner 70. The output port of the maximal-ratio QAM combiner 70 is connected for supplying complex coordinates of 64QAM symbol constellations to the input port of the 64QAM symbol constellation de-mapper 80 shown in FIG. 15.

The FIG. 15 portion of the M/H DTV receiver operates in large part substantially the same as the FIG. 12 portion of the stationary DTV receiver. Elements 80, 81, 82, 83, 84, 85, 86, 87, 88, 89, 90 and 91 of the FIG. 15 portion of the M/H DTV receiver are identified by the same reference numerals as the corresponding elements of the FIG. 12 portion of the stationary DTV receiver that perform similar functions. In FIG. 15 the output port of the selector 91 connects to the input port of an extended-byte former 116, rather than connecting directly to the input port of the data de-randomizer 92 as in FIG. 12.

The extended-byte former 116 appends to each 8-bit byte of the 188-byte data packets supplied to its input port a few bits indicative of a respective lack-of-confidence level in that byte to generate a respective extended byte supplied from its output port. The bits indicative of a respective lack-of-confidence level in a byte are supplied from the output port of a selector 117. The selector 117 selectively reproduces either (a) bits descriptive of a level of lack of confidence in a byte, which bits are supplied to a first of its two input ports from the output port of the selector 89, or (b) bits descriptive of the lowest possible level of lack of confidence in a byte, which bits are applied to its second input port. Selection by the selector 117 is controlled by indications from the RS decoders 86 and 87 as whether either of the 188-byte data packets they respectively supply at a current time is correct. When the indications are that one of these packets is correct, the selector 117 is conditioned to reproduce the bits of the lowest possible lack-of-confidence level applied to its second input port. When the indications are that neither one of these 188-byte packets is correct, the selector 117 is conditioned to reproduce the bits descriptive of a level of lack of confidence in a byte, as supplied to its first input port from the output port of the selector 89. The extended-byte former 116 supplies at is output port extended bytes of the data field of each IPE packet in a time-slice.

Referring now to FIG. 16, the extended bytes of the data field of each IPE packet are written into a successive respective row of extended-byte storage locations in a random-access memory 118 operated to perform the matrix-type block de-interleaving procedure that is a first step of the routine for decoding transverse Reed-Solomon (TRS) coding. The RAM 118 is subsequently read one column of extended bytes at a time to a decoder 119 of (255, 191) Reed-Solomon coding. The extension bits accompanying the 8-bit bytes of each TRS code are used to help locate byte errors for the TRS code. Such previous location of byte errors facilitates successful use of a Reed-Solomon decoding algorithm capable of correcting more byte errors than an algorithm that must locate byte errors as well as correct them.

FIG. 16 shows in detail an arrangement 120 of elements 121-128 that locates byte errors for the decoder 119 for (255, 191) transverse Reed-Solomon coding. Also, FIG. 16 explicitly shows a TRS decoding controller 129 that controls the procedures for decoding (255, 191) transverse Reed-Solomon coding in the mobile DTV receiver shown in FIGS. 14, 15, 16 and 13. The 8-bit data bytes that have been corrected insofar as possible by the RS decoder 119 are written, column by column, into respective columns of byte-storage locations of a random-access memory 130. The RAM 130 is operated to perform the matrix-type block re-interleaving procedure for data in further steps of the TRS decoding routine. In a final step of the TRS decoding routine, the byte-storage locations in the RAM 130 are read from row-by-row for supplying reproduced randomized M/H data to the input port of the data de-randomizer 92 shown in the FIG. 13 portion of the M/H receiver. FIG. 16 does not explicitly show the connections of the TRS decoding controller 129 to the RAM 118 and to the RAM 130 for controlling their respective writing and reading operations. FIG. 16 does not explicitly show the connections of the TRS decoding controller 129 to the decoder 119 for controlling its decoding of (255, 191) TRS coding.

Initially, the decoder 119 is operated so as to attempt to correct the TRS codeword using a byte-error-location-and-correction decoding algorithm. If the TRS codeword has too many byte errors to be corrected by this algorithm, the decoder 119 then resorts to a byte-error-correction-only decoding algorithm. The extension bits accompanying each successive 8-bit byte of a TRS codeword from the RAM 116 are supplied to a comparator 121 used as a threshold detector. The extension bits indicate the likelihood that the 8-bit byte is in error, and comparator 121 compares them to an error threshold. If the likelihood that the 8-bit byte is in error exceeds the error threshold, the comparator 121 responds with a logic ONE indicative that the byte is presumably in error. Otherwise, the comparator 121 responds with a logic ZERO indicative that the byte is presumably correct.

FIG. 16 shows the sum output signal from a clocked digital adder 122 supplied to the comparator 121 as the error threshold. The value of the error threshold is initialized in the following way at the outset of each TRS codeword being read from the RAM 118. A two-input multiplexer 123 is connected to supply its response as a first of two summand signals supplied to the adder 122, the second summand signal being arithmetic one. The sum output signal from the clocked adder 122 is applied as one of two input signals to the multiplexer 123, and an initial error threshold value less one is applied as the other input signal to the multiplexer 123. Just before each TRS codeword is read from the RAM 118 a respective pulsed logic ONE is generated by TRS decoding controller 129. The pulsed logic ONE is applied as control signal to the multiplexer 123, conditioning it to reproduce the initial error threshold value less one in its response supplied to the adder 122 as a summand input signal. The clocked adder 122 receives its clock signal from an OR gate 124 connected to receive the pulsed logic ONE at one of its input connections. The OR gate 124 reproduces the pulsed logic ONE in its response, which clocks an addition by the adder 122. The adder 122 adds its arithmetic one summand input signal to the initial error threshold value less one summand input signal received from the multiplexer 123, generating the initial error threshold value as its sum output signal supplied to the comparator 121.

The pulsed logic ONE also resets to arithmetic zero the output count from a byte-error counter 125 that is connected for counting the number of logic ONEs that the comparator 121 generates during each TRS codeword. This output count is applied as subtrahend input signal to a digital subtractor 126. A read-only memory 127 supplies the binary number 100 0000, equal to the number of parity bytes in each of the (255, 191) TRS codewords, which number is supplied as minuend input signal to the digital subtractor 126. Alternatively, the minuend input signal is simply a hard-wired binary number 100 0000. A minus-sign-bit detector 128 generates a logic ONE if and when the number of byte errors in a TRS codeword counted by the counter 125 exceeds the number of parity bytes in a TRS codeword. This logic ONE is supplied to the TRS decoding controller 129 as an indication that the current TRS codeword is to be read out from the RAM 118 again. This logic ONE is supplied to the OR gate 124 as an input signal thereto. The OR gate 124 responds with a logic ONE that resets the counter 125 to zero output count and that clocks the clocked digital adder 122. Normally, the multiplexer 123 reproduces the error threshold supplied as sum output from the adder 122. This reproduced error threshold is applied to the adder 122 as a summand input signal, connecting the clocked adder 122 for clocked accumulation of arithmetic ones in addition to the previous error threshold. The logic ONE from the OR gate 124 causes the error threshold supplied as sum output from the adder 122 to be incremented by arithmetic one, which tends to reduce the number of erroneous bytes located within the TRS codeword upon its being read again from the RAM 118.

If and when the number of erroneous bytes located in the TRS codeword is fewer than the number of parity bytes that the ROM 127 indicates that the TRS codeword should have, the TRS decoding controller 129 will cause the next TRS codeword in the RS Frame to be processed if such there be. The TRS decoding controller 129 will initiate reading such next TRS codeword from the RAM 118 to the RS decoder 119 and writing the RS decoding results from the just previous RS codeword into the RAM 118.

FIG. 17 is a more detailed schematic diagram showing the interconnection of elements 71, 72, 73, 74, 75, 76, 77, 78 and 79 of the maximal-ratio QAM combiner 70 shown in FIGS. 11 and 14. In the stationary DTV receiver of FIGS. 11, 12 and 13, the QAM combiner 70 shown in FIG. 11 is connected for receiving pilot-carrier-energy information from the pilot and TPS carriers processor 65. In the mobile DTV receiver of FIGS. 14, 15, 16 and 13 the QAM combiner 70 shown in FIG. 14 is connected for receiving pilot-carrier-energy information from the pilot and TPS carriers processor 111. The pilot and TPS carriers processor 65 or 111 squares the real and imaginary terms of each unmodulated pilot carrier, sums the resulting squares and square-roots the sum to determine the root-mean-square (RMS) energy of that unmodulated pilot carrier. This procedure can be carried out for each unmodulated pilot carrier using read-only memory addressed by the real and imaginary terms of each successively considered unmodulated pilot carrier. The RMS energies of the unmodulated pilot carriers are then summed by an accumulator to determine the total RMS energy of the unmodulated pilot carriers for each OFDM symbol epoch.

The value of the total RMS energy is supplied from the pilot and TPS carriers processor 65 or 111 to the respective input ports of selectors 71 and 72. (Some shim delay is likely to be included in this connection to compensate for the latent delay through the frequency-domain equalizer 66 or 112 exceeding the latent delay through the pilot and TPS carriers processor 65 or 111.) The selector 71 reproduces at its output port the total energy of the unmodulated pilot carriers during those transmissions that are not repeated and the final ones of the those transmissions repeated for iterative-diversity reception. The selector 72 reproduces at its output port the total energy of the unmodulated pilot carriers during the initial ones of those transmissions repeated for iterative-diversity reception. A delay memory 73 is connected for delaying the selector 72 response to supply a delayed selector 72 response concurrent with the selector 71 response.

A digital adder 74 is connected for adding the selector 71 response and the delayed selector 72 response read from the delay memory 73. The sum output response from the adder 74 combines the total energies of the initial and final transmissions for iterative-diversity reception, to be used for normalizing the weighting of the responses from the soft-data-bits selectors 71 and 72.

A read-only memory 75 is connected for multiplying the response from the soft-data-bits selector 71 by the total energy of a final transmission for iterative-diversity reception. A read-only memory 76 is connected for multiplying the response from the soft-data-bits selector 72 by the total energy of the corresponding initial transmission for iterative-diversity reception. The product from the ROM 75 is a weighted response from the soft-data-bits selector 72 that is then normalized with respect to the total energies of the initial and final transmissions for iterative-diversity reception. A read-only memory 77 is connected for performing this normalization, dividing the product from the ROM 75 by the sum output response from the adder 74. The product from the ROM 75 is a weighted response from the soft-data-bits selector 72 that is then normalized with respect to the total energies of the initial and final transmissions for iterative-diversity reception. A read-only memory 78 is connected for performing this normalization, dividing the product from the ROM 76 by the sum output response from the adder 74. A digital adder 79 is connected for summing the respective quotients from the ROMs 77 and 78 to generate the maximal-ratio QAM combiner response. This response is written to the de-mapper 80 of 64 QAM symbol constellations shown in FIG. 12 or in FIG. 15.

One skilled in digital design is apt to perceive that, alternatively, normalization of the coefficients for weighting of the responses from the soft-data-bits selectors 71 and 72 can be performed before such weighting, rather than after. A single read-only memory can be designed to perform the combined functions of the ROMs 75 and 77; and a single read-only memory can be designed to perform the combined functions of the ROMs 76 and 78. Alternatively, a very large single read-only memory can be designed to perform the combined functions of the digital adder 79 and of the ROMs 75, 76, 77 and 78. The computations can be performed by digital circuitry other than read-only memories, but problems with proper timing are considerably more difficult.

The operation of the maximal-ratio QAM combiner 70 following a change in RF channel or sub-channel is of interest. Following such a change, a DTV receiver as described supra will not have foregoing initial transmissions for iterative-diversity reception stored in its delay memory 69 or 115. So, the DTV receiver erases the contents of the delay memory 69 or 115 in bulk. The pilot and TPS carriers processor 65 or 111 will not have supplied the maximal-ratio QAM combiner 70 with information concerning the RMS-energy of pilot carriers accompanying the foregoing initial transmissions for iterative-diversity reception. Accordingly, the DTV receiver erases the contents of delay memory within the maximal-ratio QAM combiner 70 that stores such information. This erasure conditions the maximal-ratio QAM combiner 70 for single-transmission reception until the delay memory 73 therein refills with information concerning the RMS-energy of pilot carriers accompanying the foregoing initial transmissions for iterative-diversity reception. During this delay in the maximal-ratio QAM combiner 70 beginning iterative-diversity reception, the delay memory 69 or 115 fills with initial transmissions for iterative-diversity reception to be supplied with delay to the QAM combiner 70 when iterative-diversity reception begins.

FIGS. 18 and 19 combine with FIG. 13 thereafter to provide a generic schematic diagram of alternative DTV receivers for iterative-diversity stationary reception of COFDM signals as transmitted by the transmitter depicted in FIGS. 1 and 2. The alternative DTV receivers shown in FIGS. 18, 19 and 13 differ from those shown in FIGS. 11, 12 and 13 in that the circuit elements 67, 68, 69, 70 and 80 are replaced by other circuit elements. FIG. 18 shows the output port of the frequency-domain channel equalizer 66 connected directly to the input port of a de-mapper 131 of QAM symbol constellations. The QAM symbol constellations are 64QAM symbol constellations in some embodiments of the alternative DTV receivers, 256QAM symbol constellations in other embodiments, and 512QAM symbol constellations in still other embodiments.

FIG. 18 shows the output port of the de-mapper 131 connected for supplying soft bits of FEC coding to the input port of a selector 132. The selector 132 selectively reproduces soft bits of FEC coding just from those transmissions that are not repeated and from the final ones of those transmissions that are repeated for iterative-diversity reception. The output port of the selector 132 is connected to supply these soft bits of FEC coding to a first of two input ports of a maximal-ratio code combiner 133.

The output port of the de-mapper 131 is further connected for supplying soft bits of FEC coding to the input port of a selector 134. The selector 134 selectively reproduces soft bits of FEC coding from just the initial ones of transmissions subsequently repeated for iterative-diversity reception. The output port of the selector 134 is connected to supply these soft bits of FEC coding to the input port of a delay memory 135 reproduces these soft bits after a delay, which can be a prescribed fixed delay. Alternatively, the delay can be programmable responsive to delay specified by bits of TPS coding. In either case, the delay is such that the output port of the delay memory 135 supplies delayed soft bits of FEC coding from the initial transmissions concurrently with the soft bits of FEC coding from the corresponding final transmissions supplied from the output port of the selector 132. The output port of the selector delay memory 135 is connected for supplying the delayed soft bits of FEC coding from the initial transmissions to the second input port of the maximal-ratio code combiner 133.

The maximal-ratio code combiner 133 is connected for receiving pilot-carrier-energy information from the pilot and TPS carriers processor 65, although FIG. 18 does not explicitly show the connection. The pilot and TPS carriers processor 65 squares the real and imaginary terms of each unmodulated pilot carrier, sums the resulting squares and square-roots the sum to determine the RMS energy of that unmodulated pilot carrier. The RMS energies of the unmodulated pilot carriers are then summed by an accumulator, which determines the total RMS energy of the unmodulated pilot carriers for each OFDM symbol epoch. The maximal-ratio code combiner 133 weights the soft bits of FEC coding received at its first and second input ports in a ratio dependent on their respective total RMS energies and then adds those coordinates as so weighted to generate code-combined soft bits of FEC coding.

FIG. 19 shows apparatus for inclusion in alternative stationary DTV receivers that is similar to the FIG. 12 apparatus except for the omission of the de-mapper 80 of 64QAM symbol constellations. FIG. 19 shows the input port of the SISO decoder 81 connected for receiving soft data bits from the output port of the maximal-ratio code combiner 133 shown in FIG. 18.

FIGS. 20 and 21 combine with FIGS. 16 and 13 thereafter to provide a generic schematic diagram of alternative DTV receivers for iterative-diversity mobile reception of COFDM signals as transmitted by the transmitter depicted in FIGS. 3 and 4. The alternative DTV receivers shown in FIGS. 20, 21, 16 and 13 differ from those shown in FIGS. 14, 15, 16 and 13 in that the circuit elements 113, 114, 115, 70 and 80 are replaced by other circuit elements.

In FIG. 20 the output port of the frequency-domain channel equalizer 112 connects directly to the input port of a de-mapper 136 of 64QAM symbol constellations. The output port of the de-mapper 136 is connected for supplying soft bits of FEC coding to the input port of a selector 137. The selector 137 selectively reproduces soft bits of FEC coding just from those transmissions that are not repeated and from the final ones of those transmissions that are repeated for iterative-diversity reception. The output port of the selector 137 is connected to supply these soft bits of FEC coding to a first of two input ports of a maximal-ratio code combiner 138.

The output port of the de-mapper 136 is further connected for supplying soft bits of FEC coding to the input port of a selector 139. The selector 139 selectively reproduces soft bits of FEC coding from just the initial ones of transmissions subsequently repeated for iterative-diversity reception. The output port of the selector 139 is connected to supply these soft bits of FEC coding to the input port of a delay memory 140 reproduces these soft bits after a delay, which can be a prescribed fixed delay. Alternatively, the delay can be programmable responsive to delay specified by bits of TPS coding. In either case, the delay is such that the output port of the delay memory 140 supplies delayed soft bits of FEC coding from the initial transmissions concurrently with the soft bits of FEC coding from the corresponding final transmissions supplied from the output port of the selector 137. The output port of the selector delay memory 140 is connected for supplying the delayed soft bits of FEC coding from the initial transmissions to the second input port of the maximal-ratio code combiner 138.

The maximal-ratio code combiner 138 is connected for receiving pilot-carrier-energy information from the pilot and TPS carriers processor 111, although FIG. 20 does not explicitly show the connection. The pilot and TPS carriers processor 111 squares the real and imaginary terms of each unmodulated pilot carrier, sums the resulting squares and square-roots the sum to determine the RMS energy of that unmodulated pilot carrier. The RMS energies of the unmodulated pilot carriers are then summed by an accumulator, which determines the total RMS energy of the unmodulated pilot carriers for each OFDM symbol epoch. The maximal-ratio code combiner 138 weights the soft bits of FEC coding received at its first and second input ports in a ratio dependent on their respective total RMS energies and then adds those coordinates as so weighted to generate code-combined soft bits of FEC coding.

FIG. 21 shows apparatus for inclusion in alternative mobile DTV receivers that is similar to the FIG. 15 apparatus except for the omission of the de-mapper 80 of 64QAM symbol constellations. FIG. 21 shows the input port of the SISO decoder 81 connected for receiving soft data bits from the output port of the maximal-ratio code combiner 138 shown in FIG. 20.

Figure 22:
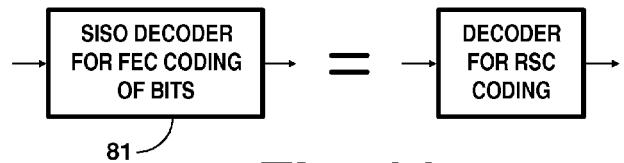

FIG. 22 shows the decoder 81 being a decoder for recursive systematic convolutional (RSC) coding. Such a decoder 81 is used in FIG. 12 and FIG. 18 portions of stationary DTV receivers when the encoder 15 for FEC coding bits in the transmitter shown in FIGS. 1 and 2 is an encoder for RSC coding as shown in FIG. 5. Such a decoder 81 is used also in FIG. 15 and FIG. 20 portions of mobile DTV receivers when the encoder 42 for FEC coding bits in the transmitter shown in FIGS. 3 and 4 is an encoder for RSC coding as shown in FIG. 5.

Figure 23:
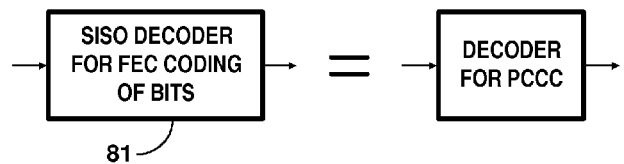

FIG. 23 shows the decoder 81 being a decoder for parallel concatenated convolutional coding (PCCC). Such a decoder 81 is used in FIG. 12 and FIG. 18 portions of stationary DTV receivers when the encoder 15 for FEC coding bits in the transmitter shown in FIGS. 1 and 2 is an encoder for PCCC as shown in FIG. 6. Such a decoder 81 is used also in FIG. 15 and FIG. 20 portions of mobile DTV receivers when the encoder 42 for FEC coding bits in the transmitter shown in FIGS. 3 and 4 is an encoder for PCCC as shown in FIG. 6.

Figure 24:
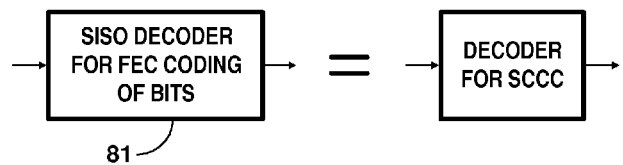

FIG. 24 shows the decoder 81 being a decoder for serial concatenated convolutional coding (SCCC). Such a decoder 81 is used in FIG. 12 and FIG. 18 portions of stationary DTV receivers when the encoder 15 for FEC coding bits in the transmitter shown in FIGS. 1 and 2 is an encoder for SCCC as shown in FIG. 7. Such a decoder 81 is used also in FIG. 15 and FIG. 20 portions of mobile DTV receivers when the encoder 42 for FEC coding bits in the transmitter shown in FIGS. 3 and 4 is an encoder for SCCC as shown in FIG. 7.

Figure 25:
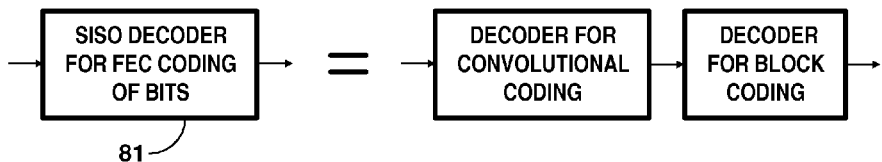

FIG. 25 shows the decoder 81 being a cascade connection of a decoder for convolutional coding followed by a decoder for block coding. Such a decoder 81 is used in FIG. 12 and FIG. 18 portions of stationary DTV receivers when the encoder 15 for FEC coding bits in the transmitter shown in FIGS. 1 and 2 is an encoder for product coding as shown in FIG. 8. Such a decoder 81 is used also in FIG. 15 and FIG. 20 portions of mobile DTV receivers when the encoder 42 for FEC coding bits in the transmitter shown in FIGS. 3 and 4 is an encoder for product coding as shown in FIG. 8. The FIG. 8 encoder for product coding is a cascade connection of an encoder for block coding followed by an encoder for convolutional coding.

Figure 26:
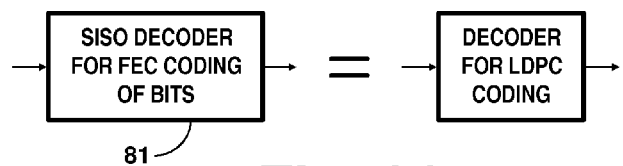

FIG. 26 shows the decoder 81 being a decoder for low-density parity-check (LDPC) coding. Such a decoder 81 is used in FIG. 12 and FIG. 18 portions of stationary DTV receivers when the encoder 15 for FEC coding bits in the transmitter shown in FIGS. 1 and 2 is an encoder for LDPC coding as shown in FIG. 9. Such a decoder 81 is used also in FIG. 15 and FIG. 20 portions of mobile DTV receivers when the encoder 42 for FEC coding bits in the transmitter shown in FIGS. 3 and 4 is an encoder for LDPC coding as shown in FIG. 9.

FIGS. 27, 28 and 29 combine with FIG. 13 thereafter to provide a schematic diagram of a DTV receiver for iterative-diversity stationary reception of COFDM signals, as transmitted by a transmitter as depicted in FIGS. 1 and 2 that uses the FIG. 10 encoder for FEC coding. The FIG. 27 DTV receiver apparatus differs from the FIG. 11 DTV receiver apparatus in that the circuit elements 67, 68, 69 and 70 are replaced by the circuit elements 131, 132, 134 and 135 as shown in FIG. 18. The FIG. 27 DTV receiver apparatus omits the maximal-ratio code combiner 133 shown in the FIG. 18 DTV receiver apparatus. FIG. 27 shows the soft bits of FEC coding from COFDM transmissions that are not repeated and from final ones of COFDM transmissions for iterative-diversity reception, as selectively reproduced at the output port of the selector 132, being supplied to the input ports of selectors 141 and 142 in FIG. 28. FIG. 27 shows the soft bits of FEC coding from initial ones of COFDM transmissions for iterative-diversity reception, as selectively reproduced at the output port of the selector 134 and delayed by the delay memory 135, being supplied to the input ports of selectors 143 and 144 in FIG. 28.

FIG. 28 shows the selector 141 connected for selectively reproducing at its output port just the soft parity bits from the one-half-rate convolutional coding (CC) supplied to its input port from the output port of the selector 132. The output port of the soft-parity-bits selector 141 is connected to supply these selectively reproduced soft parity bits as write input signal to a memory 145 for temporarily storing the soft parity bits of the one-half-rate CC for each successive odd-numbered time-slice.

FIG. 28 shows the selector 142 connected for selectively reproducing at its output port just the soft data bits from the one-half-rate CC supplied to its input port from the output port of the selector 132. FIG. 28 shows the selector 143 connected for selectively reproducing at its output port just the soft data bits from the one-half-rate CC read to its input port from the delay memory 135. A maximal-ratio code combiner 146 is connected for receiving at a first of its two input ports the soft data bits selectively reproduced at the output port of the soft-data-bits selector 142. The second input port of the maximal-ratio code combiner 146 is connected for receiving the soft data bits selectively reproduced at the output port of the soft-data-bits selector 143. The output port of the maximal-ratio code combiner 146 is connected for supplying best soft estimates of the data bits of the one-half-rate CC as write input signal to a memory 147, which temporarily stores those soft data bits.

The memory 147 also temporarily stores soft extrinsic data bits determined during the subsequent turbo decoding procedures. Soft data bits are read from the memory 147 without being combined with corresponding soft extrinsic data bits during the initial half cycle of an iterative turbo decoding procedure. Thereafter, when soft data bits are read from the memory 147 during subsequent half cycles of the iterative turbo decoding procedure, the soft data bits have respectively corresponding soft extrinsic data bits additively combined therewith. The soft extrinsic data bits temporarily stored in the memory 147 are updated responsive to the results of decoding CC each half cycle of the iterative turbo decoding procedure.

FIG. 28 shows the selector 144 connected for selectively reproducing at its output port just the soft parity bits from the one-half-rate CC read to its input port from the delay memory 135. The output port of the soft-parity-bits selector 144 is connected to supply these selectively reproduced soft parity bits as write input signal to a memory 148 for temporarily storing the soft parity bits of the one-half-rate CC for each successive even-numbered time-slice.

The memories 145, 147 and 148 together temporarily store all the components of the PCCC for a given service to be received by the fixed-site DTV receiver depicted in FIGS. 27, 28, 29 and 13. The PCCC is turbo decoded by soft-input/soft-output decoders 149 and 150 in FIG. 28, which preferably employ the sliding-window log-MAP algorithm. The term "log-MAP" is short for "logarithmic maximum a posteriori". During the initial half of each cycle of turbo decoding, the SISO decoder 149 decodes one-half-rate CC that includes soft parity bits from an odd-numbered time-slice of the service being received. During the final half of each cycle of turbo decoding, the SISO decoder 150 decodes one-half-rate CC that includes soft parity bits from an even-numbered time-slice of the service being received. The soft data bits that the SISO decoders 149 and 150 supply from their respective output ports as respective decoding results are compared to combined soft data bits and soft extrinsic data bits read from the memory 147. This is done to generate updated soft extrinsic data bits to be written back to the memory 147. At the conclusion of turbo decoding, combined soft data bits and soft extrinsic data bits are read from the memory 147 to supply an ultimate turbo decoding result.

FIG. 28 shows a soft-symbols selector 151 that selects soft data bits and soft parity bits to be supplied from first and second output ports thereof, respectively, to first and second input ports of the SISO decoder 149 during the initial half of each cycle of turbo decoding. The soft-symbols selector 151 relays soft data bits additively combined with soft extrinsic data bits, if any, as read to a first input port thereof from the memory 147, thus to generate the soft data bits supplied to the first input port of the SISO decoder 149. The soft-symbols selector 151 reproduces the soft parity bits read to a second input port thereof from the memory 148, thus generating the soft parity bits supplied to the second input port of the SISO decoder 149. In actual practice, the soft-symbols selector 151 will usually be incorporated into the structures of the memories 147 and 148.

The soft data bits supplied from the output port of the SISO decoder 149 as decoding results during the initial half of each cycle of turbo decoding are supplied to a first of two input ports of an extrinsic-data-feedback processor 152. The processor 152 differentially combines soft data bits read from the memory 147 with corresponding soft data bits of the SISO decoder 149 decoding results to generate extrinsic data feedback written into the memory 147 to update the soft extrinsic data bits temporarily stored therein.

FIG. 28 shows a soft-symbols selector 153 that selects soft data bits and soft parity bits to be supplied as input soft symbols to a soft-symbols interleaver 154. The soft-symbols interleaver 154 responds to supply interleaved soft data bits and interleaved soft parity bits from first and second output ports thereof, respectively, to first and second input ports of the SISO decoder 150 during the final half of each cycle of turbo decoding. The soft symbols selector 153 relays soft data bits additively combined with soft extrinsic data bits, if any, as read to a first input port thereof from the memory 147, thus to generate the soft data bits supplied to the soft-symbols interleaver 154. The soft-symbols selector 153 reproduces the soft parity bits read to a second input port thereof from the memory 145, thus to generate the soft parity bits supplied to the soft symbols interleaver 154. The interleaving provided by soft-symbols interleaver 154 complements the symbol de-interleaving provided by the symbols de-interleaver 54 in the FIG. 10 encoder for FEC coding.

The soft data bits supplied from the output port of the SISO decoder 150 as decoding results during the final half of each cycle of turbo decoding are supplied to the input port of a soft-bits de-interleaver 155 in FIG. 28. FIG. 28 shows the output port of the soft-bits de-interleaver 155 connected to a first of two input ports of an extrinsic data feedback processor 156. The de-interleaving provided by soft-bits interleaver 155 complements the bit interleaving provided by the bits interleaver 52 in the FIG. 10 encoder for FEC coding. The processor 156 differentially combines soft data bits read from the memory 147 with corresponding soft data bits of the soft-bits de-interleaver 155 response to generate extrinsic data feedback written into the memory 147 to update the soft extrinsic data bits temporarily stored therein.

In actual practice, the soft-symbols selector 153 will usually be incorporated into the structures of the memories 145 and 147. The soft-symbols interleaver 154 will usually not appear as a separate physical element either. Instead, its function is subsumed into the memories 145 and 147 by suitable addressing of them when reading soft data bits and soft parity bits directly to the first and second input ports of the SISO decoder 150. The soft-bits de-interleaver 155 need not appear as a separate physical element either, its function being subsumed into the memory 147 by suitable addressing during operation of the extrinsic feedback data processor 156.

After the last half cycle of the iterative turbo decoding procedure, soft data bits as additively combined with respectively corresponding soft extrinsic data bits are read from the memory 147 to the input port of the byte de-interleaver 82 depicted in FIG. 29. FIG. 29 shows DTV receiver apparatus similar to that shown in FIG. 12, except that the de-mapper 80 for 64QAM symbol constellations and the SISO decoder 81 for FEC coding are both omitted. Read addressing for the memory 147 when reading to the byte de-interleaver 82 follows the same order as write addressing when originally written with soft data bits from the code combiner 146. The output port of the data de-randomizer 92 shown in FIG. 29 connects to the input port of the IP packet parsing unit 93 shown in FIG. 13.

Alternatively, the read addressing for the memory 147 during reading an ultimate turbo decoding result therefrom can be such as to counteract the convolutional byte interleaving introduced at the DTV transmitter by the FIG. 2 convolutional byte interleaver 14. This subsumes the byte de-interleaving within the reading of an ultimate turbo decoding result from the memory 147, which avoids the need for extra memory to support byte de-interleaving. The byte de-interleaver 82 shown in FIG. 29 is, then, replaced by direct connection from a read output port of the memory 147 to the respective input ports of the quantizer 83 and the bank 88 of XOR gates.

FIGS. 30, 31 and 32 combine with FIGS. 16 and 13 thereafter to provide a schematic diagram of a DTV receiver for iterative-diversity mobile reception of COFDM signals, as transmitted by a transmitter as depicted in FIGS. 3 and 4 that uses the FIG. 10 encoder for FEC coding. The FIG. 30 DTV receiver apparatus differs from the FIG. 14 DTV receiver apparatus in that the circuit elements 114, 115, 116 and 70 are replaced by the circuit elements 136, 137, 139 and 140 as shown in FIG. 20. The FIG. 30 DTV receiver apparatus omits the maximal-ratio code combiner 138 shown in the FIG. 20 DTV receiver apparatus. FIG. 30 shows the soft bits of FEC coding from COFDM transmissions that are not repeated and from final ones of COFDM transmissions for iterative-diversity reception, as selectively reproduced at the output port of the selector 137, being supplied to the input ports of selectors 141 and 142 in FIG. 31. FIG. 30 shows the soft bits of FEC coding from initial ones of COFDM transmissions for iterative-diversity reception, as selectively reproduced at the output port of the selector 139 and delayed by the delay memory 140, being supplied to the input ports of selectors 143 and 144 in FIG. 31.

Except for the foregoing input connections and somewhat different ultimate output connection from the memory 147 therein, the FIG. 31 DTV receiver apparatus is similar to the FIG. 28 DTV receiver apparatus. After the last half cycle of the iterative turbo decoding procedure in the FIG. 31 DTV receiver apparatus, soft data bits as additively combined with respectively corresponding soft extrinsic data bits are read from the memory 147 to the input port of the byte de-interleaver 82 depicted in FIG. 32. FIG. 32 shows DTV receiver apparatus similar to that shown in FIG. 15, except that the de-mapper 80 for 64QAM symbol constellations and the SISO decoder 81 for FEC coding are both omitted. Read addressing for the memory 147 when reading to the byte de-interleaver 82 follows the same order as write addressing when originally written with soft data bits from the code combiner 146. The output port of the extended-byte former 116 shown in FIG. 32 connects to the input port of the RAM 118 shown in FIG. 16.

Alternatively, the read addressing for the memory 147 during reading an ultimate turbo decoding result therefrom can be such as to counteract the convolutional byte interleaving introduced at the DTV transmitter by the FIG. 4 convolutional byte interleaver 42. This subsumes the byte de-interleaving within the reading of an ultimate turbo decoding result from the memory 147, which avoids the need for extra memory to support byte de-interleaving. The byte de-interleaver 82 shown in FIG. 32 is, then, replaced by direct connection from a read output port of the memory 147 to the respective input ports of the quantizer 83 and the bank 88 of XOR gates.

There is another technique available for determining whether a (204, 188) RS codeword was transmitted in TRUE form or in ONEs' complemented form, although it will not withstand the effects of noise and fading as well as the technique described supra with regard to FIGS. 12 and 15. The DTV receiver can make such determination based on examination of the first through fourth bytes of the (204, 188) RS codeword containing an IPE packet, provided that these header bytes have not been corrupted by noise. The first byte of a TRUE (204, 188) RS codeword is a synchronization byte for transport-stream (TS) data packets as specified by the MPEG-2 standard. Also, the thirteen bits occupying the last five bit-places of the second byte and all eight bit-places of the third byte of a TRUE (204, 188) RS codeword contain a prescribed packet identifier (PID) for the IPE packet supposing the IPE packet conforms to the structure of TS packets specified by the MPEG-2 standard. Since IPE packets are peculiar to DTV broadcasting, the first three bytes of their 4-byte headers can be standardized, and the eight bits in the fourth byte in the header of each IPE packet can be used to indicate the beginning byte of an IP packet in that particular IPE packet.

FIG. 33 shows a modification of the DTV receiver apparatus depicted in any one of FIGS. 12, 15, 19, 21, 29 and 32 in which modification the determination as to whether a (204, 188) RS codeword was transmitted in TRUE form or in ONEs' complemented form is aided by analysis of the header portion of the 188-byte IPE packet within that 204-byte RS codeword. In FIG. 33 the CORRECT? indications from the decoders 86 and 87 for (204, 188) RS coding are not supplied directly to the selector 91 as control bits, but rather indirectly as described following. The CORRECT? indications from the decoder 86 are applied to a first of two input connections of an OR gate 157 having an output connection for supplying the selector 91 first ones of its two control bits. The CORRECT? indications from the decoder 87 are applied to a first of two input connections of an OR gate 158 having an output connection for supplying the selector 91 second ones of its two control bits.

A selector 160 of bits in the bit-places of the header of each IPE packet in the response of the RS decoder 86 is connected for gating those selected bits to a bank 161 of exclusive-OR gates. The XOR gates in the bank 161 of them exclusive-OR the selected bits with the prescribed values of those bits within a TRUE (204, 188) RS codeword containing an IPE packet. The selector 160 comprises a shift register for temporarily storing the selected bits as gated from the bit-serial response of the RS decoder 86, the contents of which shift register after its being filled are supplied in parallel to the bank 161 of XOR gates.

If the (204, 188) RS codeword were indeed transmitted in TRUE form, rather than in bit-complemented form, the respective responses of the XOR gates in the bank 161 of them should all be logic ZEROs. If a few of the selected bits from the IPE packet header have been corrupted by noise, ONEs may appear in some of the responses of the XOR gates receiving those selected bits even though the (204, 188) RS codeword was transmitted in TRUE form.

If the (204, 188) RS codeword were instead transmitted in bit-complemented form, the respective responses of the XOR gates in the bank 161 of them should all be logic ONEs. If a few of the selected bits from the IPE packet header have been corrupted by noise, ZEROs may appear in some of the responses of the XOR gates receiving those selected bits even though the (204, 188) RS codeword was transmitted in TRUE form.

FIG. 33 shows an accumulator 162 for summing the ONEs in the responses of the XOR gates in the bank 161 of them to respective bits selected from each IPE packet header. The accumulator 162 comprises a tree of adders for summing the responses of the XOR gates in the bank 161 of them. The accumulator 162 is connected for supplying the resultant sum to the minuend input port of a digital subtractor 163 that employs twos' complement arithmetic. The subtrahend input port of the subtractor 163 has a subtrahend number hardwired thereto which is equal to one half the number of bits that the selector 160 selects from the header of each IPE packet. FIG. 33 shows this subtrahend number as being binary twelve, the presumption being that the first three bytes of the IPE packet header have constant prescribed values.

So long as more than twelve of the bits that the selector 160 selects from the header of each IPE packet correspond to the prescribed values for these bits in a TRUE (204, 188) RS codeword, the difference output signal from the subtractor 163 will be negative. Therefore, the sign bit of the difference signal will be a ONE. The sign bit of the difference signal from the subtractor 163 is applied to the second input connection of the OR gate 157. The response of the OR gate 157 will be a ONE if the sign bit applied to its second input connection is a ONE, whether or not the CORRECT? indication supplied to its first input connection from the RS decoder 86 is a ONE. If the CORRECT? indication applied to the first input connection of the OR gate 157 is a ONE, indicating it to be TRUE that the IPE packet supplied from the RS decoder 86 is presumably free of any byte error and confirming that the (204, 188) RS codeword was indeed transmitted in TRUE form, the sign bit supplied to the second input connection of the OR gate 157 is perforce a ONE also.

A selector 164 of bits in the bit-places of the header of each IPE packet in the response of the RS decoder 87 is connected for gating those selected bits to a bank 165 of exclusive-OR gates. The XOR gates in the bank 165 of them exclusive-OR the selected bits with the prescribed values of those bits within a TRUE (204, 188) RS codeword containing an IPE packet. An accumulator 166 is connected for summing the ONEs in the responses of the XOR gates in the bank 165 of them to the respective bits selected from each IPE packet header. The accumulator 166 is connected to supply the resultant sum to the minuend input port of a digital subtractor 167. The subtrahend input port of the subtractor 167 has a subtrahend number hardwired thereto which is equal to one half the number of bits that the selector 164 selects from the header of each IPE packet. The sign bit of the difference signal from the subtractor 167 is applied to the second input connection of the OR gate 158. The elements 164, 165, 166 and 167 correspond in structure to the elements 160, 161, 162 and 163, respectively.

If the (204, 188) RS codeword were indeed transmitted in bit-complemented form, rather than in TRUE form, the respective responses of the XOR gates in the bank 161 of them should all be logic ZEROs. If a few of the selected bits from the IPE packet header have been corrupted by noise, ONEs may appear in some of the responses of the XOR gates receiving those selected bits even though the (204, 188) RS codeword was transmitted in bit-complemented form.

If the (204, 188) RS codeword were instead transmitted in TRUE form, the respective responses of the XOR gates in the bank 165 of them should all be logic ONEs. If a few of the selected bits from the IPE packet header have been corrupted by noise, ZEROs may appear in some of the responses of the XOR gates receiving those selected bits even though the (204, 188) RS codeword was transmitted in TRUE form.

So long as more than twelve of the bits that the selector 165 selects from the header of each IPE packet correspond to the prescribed values for these bits in a TRUE (204, 188) RS codeword, the difference output signal from the subtractor 167 will be negative, and its sign bit will be a ONE. The sign bit of the difference signal from the subtractor 167 is applied to the second input connection of the OR gate 158. The response of the OR gate 158 will be a ONE if the sign bit applied to its second input connection is a ONE, whether or not the CORRECT? indication supplied to its first input connection from the RS decoder 87 is a ONE. If the CORRECT? indication applied to the first input connection of the OR gate 158 is a ONE, indicating it to be TRUE that the IPE packet supplied from the RS decoder 87 is presumably free of any byte error and confirming that the (204, 188) RS codeword was indeed transmitted in ONEs' complemented form, the sign bit supplied to the second input connection of the OR gate 158 is perforce a ONE also.

At most, only one of the RS decoders 86 and 87 will supply a respective CORRECT? indication that is a ONE indicative that it is TRUE that the IPE packet supplied as response therefrom is free of any byte error. If the CORRECT? indication applied to the first input connection of the OR gate 157 is a ONE, the selector 91 is conditioned the same as in the configurations shown in FIGS. 12, 15, 19, 21, 29 and 32. The response of the OR gate 157 will be a ONE, conditioning the selector 191 to reproduce the correct IPE packet supplied thereto from the RS decoder 86. If the CORRECT? indication applied to the first input connection of the OR gate 158 is a ONE, the selector 91 is also conditioned the same as in the configurations shown in FIGS. 12, 15, 19, 21, 29 and 32. The response of the OR gate 158 will be a ONE, conditioning the selector 191 to reproduce the correct IPE packet supplied thereto from the RS decoder 87.

When the RS decoders 86 and 87 supply respective CORRECT? indications that are both ZEROs, indicating that neither of the RS decoders 86 and 87 supplies an IPE packet free of any byte error, the selector 91 is apt to be conditioned differently in the FIG. 33 configuration than in the configurations shown in FIGS. 12, 15, 19, 21, 29 and 32. At most, only one of the digital subtractors 163 and 167 will generate a respective difference signal that is negative and so has a sign bit that is a ONE. If the sign bit supplied from the digital subtractor 163 to the second input connection of the OR gate 157 is a ONE, the response of the OR gate 157 is a ONE, and consequently the selector 91 is conditioned to reproduce the 188-byte IPE packet in the response from the RS decoder 86. If the sign bit supplied from the digital subtractor 167 to the second input connection of the OR gate 158 is a ONE, the response of the OR gate 158 is a ONE, and consequently the selector 91 is conditioned to reproduce the 188-byte IPE packet in the response from the RS decoder 87. This latter characteristic facilitates the 188-byte IPE packet in the response from the RS decoder 87 being chosen correctly when the (204, 188) RS codeword containing it was transmitted in bit-complemented form. The number N used by the FIG. 2 comparator 13 and by the FIG. 4 comparator 41 can be made larger and closer to decimal 816 with less risk of error in the selection of one of the 188-byte responses from the RS decoders 86 and 87 to be reproduced by the selector 91 in the response therefrom.

There is a possibility that corruption of received signals by noise will occasionally lead to the subtractors 163 and 167 generating respective zero-valued difference signals concurrently. This can only occur when neither of the RS decoders 86 and 87 is able to generate a correct IPE packet in its response, so the RS decoders 86 and 87 will supply respective CORRECT? indications that are both ZEROs. The OR gate 157 will respond to the ZEROs at both of its input connections to supply a ZERO response to the selector 91 as a first of two bits of the control signal therefor. The OR gate 158 will respond to the ZEROs at both of its input connections to supply a ZERO response to the selector 91 as a second of its two bits of the control signal therefor. The double-ZERO control signal conditions the selector 91 to reproduce as its own response the 188-byte response of the RS decoder 86 on the chance that it is an IPE packet that may be partially useful despite containing too many byte errors to be correctable.

FIG. 34 shows a modification of the DTV receiver apparatus depicted in any one of FIGS. 12, 19 and 29 in which modification a microprocessor 168 replaces elements 83, 84, 85, 86, 87, 88, 89, 90 and 91. FIG. 35 shows a modification of the DTV receiver apparatus depicted in any one of FIGS. 15, 21 and 32 in which modification a microprocessor 169 replaces elements 116 and 117 in addition to replacing elements 83, 84, 85, 86, 87, 88, 89 and 90. Rather than performing two decoding operations in parallel on (204, 188) RS codewords analogous to the parallel operations of the decoders 86 and 87, a microprocessor is likely to perform similar decoding operations seriatim, one after the other.

FIG. 36 is an informal flow chart illustrating a general method of such operation of the microprocessors 168 and 169. In an initial step 171 of the FIG. 36 method, each soft bit of the de-interleaved bytes supplied from the de-interleaver 82 is processed by the microprocessor to separate the hard data bit of that soft bit from its confidence-level bits. Then, in a succeeding step 172 the microprocessor exclusive-ORs the hard data bit of each soft bit with its confidence-level bits to generate bits descriptive of a level of lack of confidence in that hard data bit. In a succeeding step 173 the microprocessor ascertains the largest level of lack of confidence among the hard data bits in each 8-bit byte and ascribes that level of lack of confidence to the entire byte. The microprocessor appends the bits descriptive of the respective lack of confidence in each 8-bit byte to generate a respective extended byte.

In a further step 174 the microprocessor flags the sixteen highest lack of confidence levels amongst the bytes of each 204-byte shortened Reed-Solomon codeword. The microprocessor appends a further bit to each extended byte to convey the flag. This flag can be used to locate byte errors for a decoding algorithm for (204, 188) Reed-Solomon coding, which algorithm is capable of correcting up to sixteen byte errors. Alternatively, the step 174 can be deferred until decoding of RS coding requires bye-error location information.

In a step 175 bytes of the hard bits separated in step 171 and the respective extensions of these bytes generated in steps 172, 173 and 174 are temporarily stored in extended-byte storage locations within memory for the microprocessor. A step 176 is reached following a new (204, 188) shortened Reed-Solomon codeword with extended bytes being written into the microprocessor memory to be temporarily stored therein. In the step 176 the microprocessor attempts to decode the new (204, 188) shortened Reed-Solomon codeword temporarily stored in its memory as if that codeword is temporarily stored in TRUE form. In designs preferred for better decoding capability, the step 176 of attempted decoding of the (204, 188) RS codeword is a compound step composed of substeps, including an initial substep of attempted decoding of the (204, 188) RS codeword using an algorithm that locates byte errors as well as subsequently correcting them. If this initial substep is unable to decode the (204, 188) RS codeword correctly, subsequent substeps perform selective erasure of bytes of the (204, 188) RS codeword flagged as having the highest level(s) of lack of confidence in their being correct and then attempt decoding of the (204, 188) RS codeword using an algorithm that tries only to correct byte errors by filling in erasures. The step 176 concludes with a substep of indicating whether or not the ultimate result of attempted decoding of the (204, 188) RS codeword is a "correct" IPE packet free of any discernible byte error. The step 176 is followed by a decision step 177 selecting the route through further steps of the method of operating the microprocessor 168 or 169, depending on whether or not the ultimate result of attempted decoding of the (204, 188) RS codeword is a "correct" IPE packet free of any discernible byte error.

If the result of attempted decoding of the (204, 188) RS codeword as temporarily stored in microprocessor memory continues to be an IPE packet with discernible byte error, the microprocessor next considers the possibility that the (204, 188) RS codeword was ONEs' complemented before FEC coding of its bits. In a step 178 the microprocessor ONEs' complements the (204, 188) RS codeword temporarily stored in its memory, updating the contents of the memory accordingly. Then, microprocessor operation loops back to the step 176 of attempting to decode the (204, 188) shortened Reed-Solomon codeword, attempting to decode that RS codeword as if it were converted to TRUE form in step 178.

If the ultimate result of attempted decoding of the (204, 188) RS codeword as temporarily stored in microprocessor memory is a "correct" IPE packet free of any discernible byte error, the microprocessor proceeds to step 179 of the general method of its operation illustrated in FIG. 35. In the step 179 the microprocessor 168 forwards the "correct" IPE packet free of any discernible byte error to the data de-randomizer 92 as shown in FIG. 33. In the step 179 the microprocessor 169 forwards the "correct" IPE packet free of any discernible byte error to the RAM 118 as shown in FIG. 35. Furthermore, in the step 179 the microprocessor 169 forwards to the RAM 118 respective byte extensions descriptive of the bytes of each 188-byte IPE packet. These byte extensions are indicative of the lowest lack of confidence level for each of these bytes in the IPE packet, which the microprocessor has determined to be free of any discernible byte error.

FIG. 37 is an informal flow chart illustrating further detail in the FIG. 36 method of operation of microprocessors 168 and 169 depicted in FIGS. 38 and 39. Some of this detail concerns the operation of a loop counter in each microprocessor for controlling operations regarding the looping of RS-decoding step 176, decision step 177, and bit-complementing step 178. In a step 180 the microprocessor resets the loop counter to an initial zero count responsive to each YES decision in the decision step 177 that an IPE packet resulting from the RS-decoding step 176 is "correct".

In a step or steps 181 after the step 180, each succeeding NO decision from the decision step 177 advances the loop count by one. In a step 182 the microprocessor 168 responds to each non-zero even count from the loop counter to forward the IPE packet temporarily stored in its memory to the data de-randomizer 92. In the step 182 the microprocessor 169 responds to each non-zero even count from the loop counter to forward the IPE packet temporarily stored in its memory to the RAM 118 shown in FIG. 16. Furthermore, in the step 182 the microprocessor 169 forwards to the RAM 118 respective byte extensions descriptive of the bytes of each 188-byte IPE packet as were determined in the step 173. Responsive to an even count being reached by the loop counter therein, either by being reset to zero or by reaching a higher even count by incrementation in steps 181, in a step 183 the microprocessor reads a new (204, 188) RS codeword temporarily stored in its memory to be used in the next step 176 of attempting to decode that new (204, 188) RS codeword.

FIG. 38 is an informal flow chart illustrating a modification of the method shown in FIGS. 36 and 37. In the FIG. 38 modification the step 182 shown in FIG. 37 is replaced by a series of steps 184, 185, 186, 187 and 188.

Responsive to each count output greater than zero from the loop counter implemented therein, the microprocessor selects in the step 184 those bits of the header of the IPE packet temporarily stored in the microprocessor memory that should be of prescribed values to be exclusive-ORed with those prescribed values in a succeeding step 185. Then, if and only if the XORing results are mostly ZEROs, the current IPE packet as temporarily stored in the microprocessor 168 memory is forwarded in a next step 186 to the data de-randomizer 92. Or, if and only if the XORing results are mostly ZEROs, the current IPE packet as temporarily stored in the microprocessor 169 memory is forwarded in the next step 186 to the RAM 118 together with a respective level of lack of confidence for each byte of the forwarded IPE packet. The IPE packet forwarded by the microprocessor in the step 186 is known still to contain so many erroneous bytes that it could not be corrected by decoding of the (204, 188) RS codeword the IPE packet was contained within. FIG. 37 shows the step 186 of forwarding the current IPE packet as temporarily stored in memory within the microprocessor 168 or 169 succeeded by a step 187 of resetting the loop counter to zero count, so as to progress to a new step 183 and subsequently to a new step 176.

FIG. 39 shows modifications of the DTV receiver apparatus depicted in any one of FIGS. 15, 21 and 32. The FIG. 39 modifications differ from the FIG. 33 modifications of any one of FIGS. 15, 21 and 32 in that the RS decoders 86 and 87 supply successive pairs of concurrent (204, 188) RS codewords to respective input connections of a selector 191 for selectively reproducing one of the (204, 188) RS codewords from each pair of them. The selector 191 replaces the selector 91 used in FIG. 33 for selectively reproducing one of each pair of 188-byte data packets concurrently supplied from the RS decoders 86 and 87.

FIG. 40 depicts apparatus for decoding two-dimensional, cross-interleaved Reed-Solomon coding (CIRC). The first of three input ports of a selector 192 of write input signal for a subsequent FEC-frame memory 194 is connected for receiving the (204, 188) RS codewords selectively reproduced from the output port of the selector 191 depicted in FIG. 39. The selector 192 selectively reproduces from an output port thereof each successive one of these (204, 188) RS codewords for application to an input port of an extended-byte former 193 that appends extension bits to each byte regarding a respective level of lack of confidence as to whether that byte is correct. These extension bits are supplied to a further input port of the extended-byte former 193 from the output port of the selector 117. When the selector 192 relays to the extended-byte former 193 a (204, 188) RS codeword with byte error therein, as reproduced from the selector 191 in FIG. 39, the extension bits the selector 117 supplies from its output port selectively reproduce bits supplied to a first of its two input ports from the output port of the selector 89 of the largest lack-of-confidence level for the bits of each byte of that (204, 188) RS codeword. The selector 89 is that depicted in any one of FIGS. 15, 21 and 32 that is modified per FIG. 39. When the selector 192 relays to the extended-byte former 193 a (204, 188) RS codeword with no detectable bit error, the extension bits the selector 117 supplies from its output port selectively reproduce bits supplied to a second of its two input ports. These bits define the lowest possible level of lack of confidence in each byte of that (204, 188) RS codeword. FIG. 40 shows the FEC-frame memory 194 for bytes of data plus respective byte extensions expressive of lack of confidence in each byte as being triple-ported. The output port of the extended-byte former 193 connects to a random-access port of this FEC-frame memory 194. The bytes of each successive (204, 188) RS codeword supplied from the selector 191 in FIG. 39, reproduced in the selector 192 response, and extended by the extended-byte former 193 are written via this random-access port to over-write the previous contents a respective row of extended-byte storage locations in the FEC-frame memory 194.

Control of the operation of the apparatus depicted in FIGS. 43 and 44 is facilitated by (a) keeping track of the number of rows of extended-byte storage locations in the FEC-frame memory 194 that temporarily store (204, 188) RS codewords known to be correct and (b) keeping track of the number of columns of extended-byte storage locations in the FEC-frame memory 194 that temporarily store (255, 191) TRS codewords known to be correct. The apparatus for doing this is not depicted in FIGS. 39 and 40, however.

If the number of rows of extended-byte storage locations in the FEC-frame memory 194 that temporarily store correct (204, 188) RS codewords reaches a 255 count after initially writing an FEC-frame into the memory 194, there is no need for further RS decoding of the memory 194 content. Responsive to this 255 count being reached, the 191 correct (204, 188) RS codewords containing respective IPE packets of data rather than of parity bytes of TRS codewords are read from the memory 194 in the same order they were written into the memory 194. The input port of an IPE packet selector 195 is connected for receiving these 191 correct (204, 188) RS codewords read from the memory 194. The IPE packet selector 195 reproduces at its output port the respective IPE packet contained in each successive correct (204, 188) RS codeword read from the memory 194 when there is no need for further RS decoding of the memory 194 content. These successive IPE packets are supplied from the output port of the IPE packet selector 195 to the input port of the data de-randomizer 92 in FIG. 13.

If the count of the number of correct (204, 188) RS codewords temporarily stored in respective rows of extended-byte storage locations in the FEC-frame memory 194 is less than 255 after extended bytes of 255 successive (204, 188) RS codewords have been written into respective rows of extended-byte storage locations in the FEC-frame memory 194, decoding of the FEC Frame proceeds with decoding the (255, 191) TRS codewords temporarily stored in respective columns of extended-byte storage locations within the memory 194. One after another of the columns of 255 extended-byte storage locations that contain extended bytes from IPE packets has the extended bytes respectively stored therein copied into respective plural-bit stages of a shift register within the memory 194. The extended bytes copied into the 255 successive stages of this shift register are then read serially from the shift register to be supplied from the memory 194 via a first serial output thereof. The 255 bytes of a (255, 191) TRS codeword contained within the read-out from each column of extended-byte storage locations are supplied as input signal to a TRS decoder 196 for transverse (255, 191) Reed-Solomon coding.

FIG. 40 shows the byte extensions of these 255 bytes supplied as input signal to an adjustable threshold detector 197 for locating the bytes most likely to be in error in each (255, 191) TRS codeword. FIG. 40 shows the adjustable threshold detector 197 connected for supplying the TRS decoder 196 indications of the locations of the bytes most likely to be in error in each (255, 191) TRS codeword. These indications enable the TRS decoder 196 to perform erasure decoding with erasures of its bytes that the adjustable threshold detector 197 indicates most probable to be in error. This correction-only decoding algorithm permits the correction of as many as 64 erroneous bytes in each (255, 191) TRS codeword. Transverse (255, 191) RS coding provides four times greater capability for correction of sustained burst error than does lateral (204, 188) RS coding.

In some embodiments of the FIG. 40 CIRC decoding apparatus, the TRS decoder 196 employs a byte-error-location-and-correction algorithm for initially attempting to recover a correct (255, 191) TRS codeword. Occasionally, a correct (255, 191) TRS codeword recovered by such decoding algorithm might not be recoverable using the correction-only decoding algorithm of erasure decoding. If a correct (255, 191) TRS codeword is not recovered by initially attempting the byte-error-location-and-correction algorithm, the extended bytes temporarily stored in the column of extended-byte storage locations within the memory 194 can be read again to the TRS decoder 196 and the adjustable threshold detector 197. In this subsequent attempt to recover a correct (255, 191) TRS codeword, the TRS decoder 196 performs erasure decoding with erasures of its bytes that the adjustable threshold detector 197 indicates most probable to be in error. In variants of the FIG. 40 CIRC decoding apparatus, the TRS decoder 196 employs only a byte-error-location-and-correction algorithm for attempting to recover a correct (255, 191) TRS codeword.

After the TRS decoder 196 performs its forward-error-correction procedures on a (255, 191) TRS codeword, it indicates whether or not the (255, 191) TRS codeword resulting from those forward-error-correction procedures has detectable byte error therein. If the TRS decoder 196 indicates that the (255, 191) TRS codeword resulting from those forward-error-correction procedures has detectable byte error therein, FEC-frame decoding procedure advances to attempting to decode the next (255, 191) TRS codeword, if any, temporarily stored in the next column of extended-byte storage locations within the memory 194.

The (255, 191) TRS codeword produced at the output port of the TRS decoder 196 as the result of forward-error-correction procedures thereon is supplied to a second input connection of the selector 192 of write input signal for the subsequent FEC-frame memory 194. If the TRS decoder 196 indicates that the (255, 191) TRS codeword resulting from those forward-error-correction procedures has no detectable byte error therein, the selector 192 responds to such indication by selectively reproducing the correct TRS codeword at its output port, for application to the input port of the extended-byte former 193. The extended-byte former 193 appends to each byte extension bits regarding a respective level of lack of confidence as to whether that byte is correct, and supplies extended bytes of the TRS codeword from its output port to the random-access port of the FEC-frame memory 194. The extended bytes of the TRS codeword are written back into the same column of extended-byte storage locations from which that TRS codeword was read to the TRS decoder 196 for forward-error-correction procedures. The extended bytes of the TRS codeword over-write their previous values temporarily stored in the same extended-byte storage locations.

When the TRS decoder 196 indicates that a correct (255, 191) TRS codeword is supplied from its output port to the second input connection of the selector 192 of write input signal for the subsequent FEC-frame memory 194, the selector 117 responds to supply extension bits to the extended-byte former 193 that define the lowest possible level of lack of confidence in each byte of that (255, 191) TRS codeword. This lowest possible level of lack of confidence in each byte of that (255, 191) TRS codeword will subsequently over-write the previous level of lack of confidence in that byte temporarily stored in the FEC-frame memory. The count of correct (255, 191) TRS codewords in the FEC-frame memory is incremented by one; and FEC-frame decoding procedure advances to attempting to decode the next (255, 191) TRS codeword, if any, temporarily stored in the next column of extended-byte storage locations within the memory 194.

After attempts have been made to decode all the (255, 191) TRS codewords temporarily stored in respective columns of extended-byte storage locations within the memory 194, a count of the correct ones of those 188 TRS codewords determines what is next to be done. If the count of correct (255, 191) TRS codewords temporarily stored in the FEC-frame memory 194 is 188, there is no need for further RS decoding of the memory 194 content. Responsive to this 188 count being reached, those 191 of the (204, 188) RS codewords containing IPE packets of data rather than TRS parity bytes are read from the memory 194 to the input port of the IPE packet selector 195 in the same order they were written into the memory 194. The IPE packet selector 195 reproduces at its output port the respective IPE packet contained in each successive (204, 188) RS codeword read from the memory 194 when there is no need for further RS decoding of the memory 194 content. These successive IPE packets are supplied from the output port of the IPE packet selector 195 to the input port of the data de-randomizer 92 in FIG. 13.

After attempts have been made to decode all the (255, 191) TRS codewords temporarily stored in respective columns of extended-byte storage locations within the FEC-frame memory 194, the count of correct TRS codewords temporarily stored therein may be less than 188. If this is the case, further decoding of at least the incorrect ones of the (204, 188) RS codewords temporarily stored in the 255 rows of extended-byte storage locations within the memory 194 proceeds. One after another of the rows of 204 extended-byte storage locations temporarily storing bytes of (204, 188) RS codewords to be decoded have the extended bytes stored therein copied into respective plural-bit stages of a shift register within the memory 194. The extended bytes copied into the 204 successive stages of this shift register are then read serially from the shift register to be supplied from the memory 194 via a second serial output thereof. The 204 bytes of a (204, 188) RS codeword contained within the read-out from each row of extended-byte storage locations are supplied as input signal to an RS decoder 198 for lateral (204, 188) Reed-Solomon coding.

FIG. 40 shows the byte extensions of these 204 bytes supplied as input signal to an adjustable threshold detector 199 for locating the bytes most likely to be in error in each (204, 188) RS codeword. FIG. 40 shows the adjustable threshold detector 199 connected for supplying the RS decoder 198 indications of the locations of the bytes most likely to be in error in each (204, 188) RS codeword. These indications enable the RS decoder 198 to perform erasure decoding with erasures of its bytes that the adjustable threshold detector 199 indicates most probable to be in error.

In some embodiments of the FIG. 40 CIRC decoding apparatus, the RS decoder 198 employs a byte-error-location-and-correction algorithm for initially attempting to recover a correct (204, 188) RS TRS codeword. Occasionally, a correct (255, 191) TRS codeword recovered by such decoding algorithm might not be recoverable using the correction-only decoding algorithm of erasure decoding. If a correct (204, 188) RS TRS codeword is not recovered by initially attempting the byte-error-location-and-correction algorithm, the extended bytes temporarily stored in the column of extended-byte storage locations within the memory 194 can be read again to the RS decoder 198 and the adjustable threshold detector 199. In this subsequent attempt to recover a correct (204, 188) RS codeword, the RS decoder 198 performs erasure decoding with erasures of its bytes that the adjustable threshold detector 199 indicates most probable to be in error. In variants of the FIG. 40 CIRC decoding apparatus, the RS decoder 198 employs only a byte-error-location-and-correction algorithm for attempting to recover a correct (204, 188) RS codeword.

After the RS decoder 198 performs its forward-error-correction procedures on a (204, 188) RS codeword, it indicates whether or not the (204, 188) RS codeword resulting from those forward-error-correction procedures has detectable byte error therein. If the RS decoder 198 indicates that the (204, 188) RS codeword resulting from those forward-error-correction procedures has detectable byte error therein, FEC-frame decoding procedure advances to attempting to decode the next (204, 188) RS codeword, if any, temporarily stored in the next column of extended-byte storage locations within the memory 194.

The (204, 188) RS codeword produced at the output port of the RS decoder 198 as the result of forward-error-correction procedures thereon is supplied to a third input connection of the selector 192 of write input signal for the subsequent FEC-frame memory 194. If the RS decoder 198 indicates that the (204, 188) RS codeword resulting from those forward-error-correction procedures has no detectable byte error therein, the selector 192 responds to such indication by selectively reproducing the correct RS codeword at its output port, for application to the input port of the extended-byte former 193. The extended-byte former 193 appends to each byte extension bits regarding a respective level of lack of confidence as to whether that byte is correct, and supplies extended bytes of the RS codeword from its output port to the random-access port of the FEC-frame memory 194. The extended bytes of the RS codeword are written back into the same row of extended-byte storage locations from which that RS codeword was read to the RS decoder 198 for forward-error-correction procedures. The extended bytes of the RS codeword over-write their previous values temporarily stored in the same extended-byte storage locations.

When the RS decoder 198 indicates that a correct (204, 188) RS codeword is supplied from its output port, the selector 190 responds to supply extension bits to the extended-byte former 193 that define the lowest possible level of lack of confidence in each byte of that (204, 188) RS codeword. This lowest possible level of lack of confidence in each byte of that (204, 188) RS codeword will subsequently over-write the previous level of lack of confidence in that byte temporarily stored in the FEC-frame memory. The count of correct (204, 188) RS codewords in the FEC-frame memory is incremented by one; and FEC-frame decoding procedure advances to attempting to decode the next incorrect (204, 188) RS codeword, if any, temporarily stored in a succeeding row of extended-byte storage locations within the memory 194.

After attempts have been made to decode all the incorrect (204, 188) RS codewords temporarily stored in respective rows of extended-byte storage locations within the memory 194, a count of the correct (204, 188) RS codewords temporarily within the memory 194 determines what is next to be done. If the number of rows of extended-byte storage locations in the FEC-frame memory 194 that temporarily store correct (204, 188) RS codewords reaches a 255 count, there is no need for further RS decoding of the memory 194 content. Responsive to this 255 count being reached, the 191 correct (204, 188) RS codewords containing respective IPE packets of data rather than of parity bytes of TRS codewords are read from the memory 194 to the input port of the IPE packet selector 195 in the same order they were written into the memory 194. The IPE packet selector 195 reproduces at its output port the respective IPE packet contained in each successive (204, 188) RS codeword read from the memory 194 when there is no need for further RS decoding of the memory 194 content. These successive IPE packets are supplied from the output port of the IPE packet selector 195 to the input port of the data de-randomizer 92 in FIG. 13.

After attempts have been made to decode all the incorrect (204, 188) RS codewords temporarily stored in respective rows of extended-byte storage locations within the memory 194, the count of correct RS codewords temporarily stored therein may be less than 255. If the count of correct RS codewords temporarily stored in the FEC-frame memory 194 is unchanged from the count of them upon their being initially written into the memory 194, further decoding of the TRS codewords and RS codewords cannot produce improved decoding results. (That is, unless erasure decoding of RS coding or TRS coding has been deferred up to this point, relying on just an error-location-and-correction algorithm for such decoding.) Responsive to this unchanged count of correct (204, 188) RS codewords, the 191 (204, 188) RS codewords containing respective IPE packets of data rather than of parity bytes of TRS codewords are read from the memory 194 to the input port of the IPE packet selector 195 in the same order they were written into the memory 194. The IPE packet selector 195 reproduces at its output port the respective IPE packet contained in each successive (204, 188) RS codeword read from the memory 194, when further decoding of the TRS codewords and RS codewords will be unproductive of improved decoding results. These successive IPE packets are supplied from the output port of the IPE packet selector 195 to the input port of the data de-randomizer 92 in FIG. 13.

If the count of correct (204, 188) RS codewords temporarily stored in the memory 194 has not reached 255, but is increased from the count of them made upon their being initially written into the memory 194, further decoding of the TRS codewords and RS codewords may be able to produce improved decoding results, providing time is available for such further decoding. If time for further decoding is not available, the 191 (204, 188) RS codewords containing respective IPE packets of data rather than of parity bytes of TRS codewords are read from the memory 194 to the input port of the IPE packet selector 195 in the same order they were written into the memory 194. The IPE packet selector 195 reproduces at its output port the respective IPE packet contained in each successive (204, 188) RS codeword read from the memory 194, when there is to be no further decoding of the TRS codewords and RS codewords. These successive IPE packets are supplied from the output port of the IPE packet selector 195 to the input port of the data de-randomizer 92 in FIG. 13. Occasionally, a correct IPE packet may be selected from a (204, 188) RS codeword containing byte error, owing to the byte error being confined to the parity bytes of the RS codeword. IP packets may be correct although contained in part in some of the IPE packets selected from (204, 188) RS codeword containing byte errors. The likelihood of such IP packets being correct can be determined by decoding the error-detecting cyclic-redundancy-check (CRC) coding of each IP packet.

If further decoding of the TRS codewords and RS codewords is undertaken, the extended bytes of incorrect (255, 191) TRS codewords temporarily stored in respective columns of storage locations within the FEC-frame memory 194 are read to the TRS decoder 196 and the adjustable threshold detector 197. If the TRS decoder 196 is able to correct an incorrect (255, 191) TRS codeword, the corrected TRS codeword is used to over-write the corresponding previously incorrect (255, 191) TRS codeword temporarily stored in a column of storage locations within the memory 194, and the count of correct (255, 191) TRS codewords temporarily stored within the memory 194 is incremented by one.

If the count of correct (255, 191) TRS codewords temporarily stored in the FEC-frame memory 194 reaches 188, there is no need for further RS decoding of the memory 194 content. If the count of correct (255, 191) TRS codewords temporarily stored in the FEC-frame memory 194 remains unchanged after all second attempts of decoding the incorrect (255, 191) TRS codewords temporarily stored in the FEC-frame memory 194, further decoding of the RS codewords and TRS codewords will be unproductive of improved decoding results. If either of these conditions obtains, those 191 of the (204, 188) RS codewords containing IPE packets of data rather than TRS parity bytes are read from the memory 194 to the input port of the IPE packet selector 195 in the same order they were written into the memory 194. The IPE packet selector 195 reproduces at its output port the respective IPE packet contained in each successive (204, 188) RS codeword read from the memory 194 when there is no need for further RS decoding of the memory 194 content. These successive IPE packets are supplied from the output port of the IPE packet selector 195 to the input port of the data de-randomizer 92 in FIG. 13.

If the count of correct (255, 191) TRS codewords temporarily stored in the FEC-frame memory 194 is changed after all second attempts of decoding the incorrect (255, 191) TRS codewords temporarily stored in the FEC-frame memory 194, further decoding of the RS codewords and TRS codewords could produce improved decoding results. The extended bytes of incorrect (204, 188) RS codewords temporarily stored in respective rows of storage locations within the FEC-frame memory 194 are read to the RS decoder 198 and the adjustable threshold detector 199. If the RS decoder 198 is able to correct an incorrect (204, 188) RS codeword, the corrected RS codeword is used to over-write the corresponding previously incorrect (204, 188) RS codeword temporarily stored in a row of storage locations within the memory 194, and the count of correct (204, 188) RS codewords temporarily stored within the memory 194 is incremented by one.

If the count of correct (204, 188) RS codewords temporarily stored in the FEC-frame memory 194 reaches 255, there is no need for further TRS decoding of the memory 194 content. If the count of correct (204, 188) RS TRS codewords temporarily stored in the FEC-frame memory 194 remains unchanged after all second attempts of the RS decoder 198 to decode the incorrect (204, 188) RS codewords temporarily stored in the FEC-frame memory 194, further decoding of the TRS codewords and RS codewords will be unproductive of improved decoding results. If either of these conditions obtains, those 191 of the (204, 188) RS codewords containing IPE packets of data rather than TRS parity bytes are read from the memory 194 to the input port of the IPE packet selector 195 in the same order they were written into the memory 194. The IPE packet selector 195 reproduces at its output port the respective IPE packet contained in each successive (204, 188) RS codeword read from the memory 194 when there is no need for further RS decoding of the memory 194 content. These successive IPE packets are supplied from the output port of the IPE packet selector 195 to the input port of the data de-randomizer 92 in FIG. 13.

If the count of correct (204, 188) RS codewords temporarily stored in the FEC-frame memory 194 is changed after all second attempts of the RS decoder 198 to decode the incorrect (204, 188) RS codewords temporarily stored in the FEC-frame memory 194, further decoding of the TRS codewords and RS codewords could produce improved decoding results, providing time is available for such further decoding. The cycle of attempting to improve TRS decoding results and then to improve RS decoding results can be repeated until all IPE packets temporarily stored in the FEC-frame memory 194 are corrected or until no further improvement in decoding results is noted.

In a variation of the operation of the FIG. 40 operation described supra, the correctness of all 191 of the (204, 188) RS codewords containing IPE packets filled with IP data rather than TRS parity bytes is tracked. The count of correct ones of the (204, 188) RS codewords containing IPE packets filled with IP data rather than TRS parity bytes can reach 191 before a count of all correct (204, 188) RS codewords reaches 255. This is especially so if the parity bytes of TRS codewords are later in time than their parity bytes. Decoding time can be cut by responding to the earlier reached 191 count to read those 191 of the (204, 188) RS codewords containing IPE packets of data rather than TRS parity bytes from the memory 194 to the input port of the IPE packet selector 195 in the same order they were written into the memory 194. The IPE packet selector 195 reproduces at its output port the respective IPE packet contained in each successive (204, 188) RS codeword read from the memory 194 when no need for further RS decoding of the memory 194 content is determined this alternative way. These successive IPE packets are supplied from the output port of the IPE packet selector 195 to the input port of the data de-randomizer 101 in FIG. 13.

FIG. 41 shows a modification of the FIG. 2 portion of the COFDM transmitter in which the encoder 15 for FEC coding of bits is of the sort shown in FIG. 10. This modification permits stationary DTV receivers to use maximal ratio QAM combiners for improving the iterative-diversity reception of data bits. The respective input ports of the selectors 50 and 51 are still connected for receiving the response of the convolutional byte interleaver 14 shown in FIG. 2. The output port of the selector 50 of odd-numbered time-slices still connects to the input port of the data bits interleaver 52, and the output port of the data bits interleaver 52 still connects to the input port of the encoder 53 for one-half-rate convolutional coding (CC). However, in FIG. 41 the output port of the selector 51 of even-numbered time-slices connects directly to the input port of the encoder 57 for one-half-rate convolutional coding (CC) rather than connecting via the delay memory 56 as shown in FIG. 10. FIG. 41 shows the output port of the time-division multiplexer 55 for odd and even coded-time-slices connected to the input port of a mapper 200 for 256QAM symbol constellations. The mapper 200 is a particular species of the generic mapper 16 for QAM symbol constellations shown in FIG. 2, and its output port connects to the input port of the parser 17 of effective OFDM symbol blocks.

FIG. 41 shows the symbols de-interleaver 54 being replaced by random-access memories 201 and 202, followed by a selector 203 of 8-bit Gray labeling. The output port of the selector 203 connects to the first input port of the time-division multiplexer 55 for supplying the 8-bit Gray labeling that the multiplexer 55 relays to the 256QAM symbol constellation mapper 200 during odd-numbered time-slices. The RAM 201 has a write-input port connected to be written with the data bits of one-half-rate CC of initial transmissions that are subsequently repeated for iterative-diversity reception, as supplied from the first output port of the CC encoder 53. The RAM 201 has a read-output port connected for supplying bytes of data bits to a first input port of the selector 203 of 8-bit Gray labeling. The RAM 202 has a write-input port connected to be written with the parity bits of the one-half-rate CC of the initial transmissions that subsequently are repeated for iterative-diversity reception, as supplied from the second output port of the CC encoder 53. The RAM 202 has a read-output port connected for supplying bytes of parity bits to a second input port of the selector 203 of 8-bit Gray labeling. The write addressing and read addressing of the RAMs 201 and 202 cooperate to implement coded (or "implied") symbol interleaving of the one-half-rate CC of initial transmissions that subsequently are repeated for iterative-diversity reception. This form of symbol interleaving cooperates with the bit de-interleaver 52 preceding the encoder 53 of one-half-rate CC to restore the order of the data bits supplied from the output port of the selector 203 to be the same as from the output port of the selector 50. The read addressing of the RAMs 201 and 202 is such as to read alternately from their serial output ports, each 8-bit Gray label for data bits followed by a respective 8-bit Gray label for parity bits.

In FIG. 41 the delay to compensate for the latencies of the bits de-interleaver 52 and of the RAMs 201 and 202 is provided for by random-access memories 204 and 205. The RAM 204 has a write-input port connected to be written with the data bits of one-half-rate CC of those transmissions that are not repeated and of the final ones of those transmissions that are repeated, as supplied from the first output port of the CC encoder 57. The RAM 204 has a read-output port connected for supplying bytes of data bits to a first input port of a selector 206 of the 8-bit Gray labeling used by the 256QAM symbol constellation mapper 200 during even time-slices. The RAM 205 has a write-input port connected to be written with the parity bits of the one-half-rate CC of those transmissions that are not repeated and of the final ones of those transmissions that are repeated for iterative-diversity reception, as supplied from the second output port of the CC encoder 57. The RAM 205 has a read-output port connected for supplying bytes of parity bits to a second input port of the selector 206 of the 8-bit Gray labeling used by the 256QAM symbol constellation mapper 200 during even-numbered time-slices. The read addressing of the RAMs 204 and 205 is such as to read alternately from their read-output ports, each 8-bit Gray label for data bits followed by a respective 8-bit Gray label for parity bits. FIG. 41 shows the read-output port of the selector 206 connected to supply the second input port of the time-division multiplexer 55 with 8-bit Gray labels for 256QAM constellation maps in even-numbered time-slices of COFDM signals intended for iterative-diversity reception.

The time-division multiplexer 55 and the selectors 203 and 206 are depicted as physically separate elements as an aid to the reader in understanding the desired operation of the FIG. 41 configuration. In actual practice the functions of the time-division multiplexer 55 and of the selectors 203 and 206 can be subsumed into the read-control circuits of the RAMs 201, 202, 204 and 205, providing that the read-output ports of those RAMs are tri-state buffered.

FIG. 42 shows a modification of the FIG. 4 portion of the COFDM transmitter in which the encoder 43 is of the sort shown in FIG. 10. This modification permits mobile DTV receivers to use maximal ratio QAM combiners for improving the iterative-diversity reception of data bits. The respective input ports of the selectors 50 and 51 are still connected for receiving the response of the convolutional byte interleaver 42 shown in FIG. 4. The output port of the selector 50 of odd-numbered time-slices still connects to the input port of the data bits interleaver 52, and the output port of the data bits interleaver 52 still connects to the input port of the encoder 53 for one-half-rate convolutional coding (CC). However, in FIG. 42 the output port of the selector 51 of even-numbered time-slices connects directly to the input port of the encoder 57 for one-half-rate convolutional coding (CC), rather than connecting via the delay memory 56 as shown in FIG. 10.

FIG. 42 shows the symbols de-interleaver 54 being replaced by random-access memories 207 and 208, followed by a selector 209 of 6-bit Gray labeling. The output port of the selector 209 connects to the first input port of the time-division multiplexer 55 for supplying the 6-bit Gray labeling that the multiplexer 55 relays to the 64QAM symbol constellation mapper 44 during odd-numbered time-slices. The RAM 207 has a write-input port connected to be written with the data bits of one-half-rate CC of initial transmissions that subsequently are repeated for iterative-diversity reception, as supplied from the first output port of the CC encoder 53. The RAM 207 has a read-output port connected for supplying data bits to a first input port of the selector 209 of the 6-bit Gray labeling used by the 64QAM symbol constellation mapper 44 during odd-numbered time-slices. The RAM 208 has a write-input port connected to be written with the parity bits of the one-half-rate CC of the initial transmissions that subsequently are repeated for iterative-diversity reception, as supplied from a second output port of the CC encoder 53. The RAM 208 has a read-output port connected for supplying data bits to a second input port of the selector 209 of the 6-bit Gray labeling used by the 64QAM symbol constellation mapper 95 during odd-numbered time-slices. The write addressing and read addressing of the RAMs 207 and 208 cooperate to implement coded (or "implied") symbol interleaving of the one-half-rate CC of initial transmissions that subsequently are repeated for iterative-diversity reception. FIG. 42 shows the output port of the selector 209 connected for supplying a first input port of the time-division multiplexer 55 with 6-bit Gray labels for 64QAM constellation maps for just data bits, alternating with 6-bit Gray labels for 64QAM constellation maps for just parity bits.

In FIG. 42 the delay to compensate for the latencies of the bits de-interleaver 52 and of the RAMs 207 and 208 is provided for by random-access memories 210 and 211. The RAM 210 has a write-input port connected to be written with the data bits of one-half-rate CC of those transmissions that are not repeated and of the final ones of those transmissions that are repeated, as supplied from a first output port of the CC encoder 57. The RAM 210 has a read-output port connected for supplying data bits to a first input port of a selector 212 of the 6-bit Gray labeling used by the 64QAM symbol constellation mapper 44 during even-numbered time-slices. The RAM 211 has a write-input port connected to be written with the parity bits of the one-half-rate CC of those transmissions that are not repeated and of the final ones of those transmissions that are repeated for iterative-diversity reception, as supplied from a second output port of the CC encoder 57. The RAM 211 has a read-output port connected for supplying parity bits to a second input port of the selector 212 of the 6-bit Gray labeling used by the 64QAM symbol constellation mapper 44 during even-numbered time-slices. FIG. 42 shows the output port of the selector 212 connected for supplying the second input port of the time-division multiplexer 55 with 6-bit Gray labels for 64QAM constellation maps for just data bits, alternating with 6-bit Gray labels for 64QAM constellation maps for just parity bits.

The time-division multiplexer 55 and the selectors 209 and 212 are depicted as physically separate elements as an aid to the reader in understanding the desired operation of the FIG. 42 configuration. In actual practice the functions of the time-division multiplexer 55 and of the selectors 209 and 212 can be subsumed into the read-control circuits of the RAMs 207, 208, 210 and 211, providing that the read-output ports of those RAMs are tri-state buffered.

FIGS. 43 and 44 show modifications made to FIGS. 11 and 12 of the stationary DTV receiver of FIGS. 11, 12 and 13 in an alternative stationary DTV receiver suited for receiving transmissions from the DTV transmitter of FIGS. 1, 2, 3 and 4 with its FIG. 2 portion modified per FIG. 41. FIG. 43 differs from FIG. 11 in that the maximal-ratio QAM combiner 70 does not receive the coordinates of 256QAM symbol constellations that map parity bits of the CC components of PCCC transmitted for iterative-diversity reception.

FIG. 43 shows the maximal-rate QAM combiner 70 for combining the complex coordinates of 256QAM symbol constellations descriptive of data bits, as selected from the final transmissions for iterative-diversity reception, with the complex coordinates of corresponding 256QAM symbol constellations descriptive of data bits, as earlier selected from the initial transmissions for iterative-diversity reception. The complex coordinates of 256QAM symbol constellations descriptive of just data bits, as selected from the final transmissions for iterative-diversity reception, are supplied to a first input port of the QAM combiner 70 from the output port of a selector 213. The input port of the selector 213 is connected for receiving the complex coordinates of 256QAM symbol constellations from the final transmissions that are repeated for iterative-diversity reception, as reproduced at the output port of the selector 67. The complex coordinates of 256QAM symbol constellations descriptive of just data bits, as selected from the delayed initial transmissions for iterative-diversity reception, are supplied to a second input port of the QAM combiner 70 from the output port of a selector 214. The input port of the selector 214 is connected for receiving the delayed response of the delay memory 69 to the complex coordinates of 256QAM symbol constellations, as selected by the selector 68 from the initial transmissions for iterative-diversity reception. The output port of the QAM combiner 70 connects to the input port of a de-mapper 215 for 64QAM symbol constellations, which de-mapper 215 is depicted in FIG. 44.

FIG. 44 shows the input port of the de-mapper 215 of 256QAM symbol constellations connected for receiving the response of the QAM combiner 70, which response supplies the complex coordinates of 256QAM symbol constellations descriptive of data bits of the PCCC. The de-mapper 215 de-maps these data bits, supplying soft data bits of the PCCC from its output port to the random-access port of the memory 147 for soft data bits and extrinsic data. The soft data bits are written into the storage locations for soft data bits within the memory 147.

FIG. 44 shows a selector 216 with an input port connected for receiving the response of the selector 67 shown in FIG. 43. The selector 216 is operable for selectively reproducing the complex coordinates of 256QAM symbol constellations descriptive of parity bits from the final transmissions for iterative-diversity reception. The output port of the selector 216 is connected for supplying these selectively reproduced complex coordinates to the input port of a de-mapper 217 of 256QAM symbol constellations. The de-mapper 217 de-maps a first set of PCCC parity bits, supplying them from its output port to the write-input port of the memory 145 for that first set of PCCC parity bits.

FIG. 44 shows a selector 218 with an input port connected for receiving the response of the delay memory 69 shown in FIG. 43. The selector 218 is operable for selectively reproducing the complex coordinates of 256QAM symbol constellations descriptive of parity bits from the delayed initial transmissions for iterative-diversity reception. The output port of the selector 218 is connected for supplying these selectively reproduced complex coordinates to the input port of a de-mapper 219 of 256QAM symbol constellations. The de-mapper 219 de-maps a second set of PCCC parity bits, supplying them from its output port to the write-input port of the memory 148 for that second set of PCCC parity bits.

The memories 145, 147 and 148 together temporarily store all the components of the PCCC for a given service to be received by the stationary DTV receiver depicted in FIGS. 43, 44 and 13. The PCCC is turbo decoded by soft-input/soft-output decoders 149 and 150 in FIG. 44 in cooperation with the elements 151-156, operation being similar to that described supra with reference to FIG. 28. At the conclusion of turbo decoding, combined soft data bits and soft extrinsic data bits are read from the memory 147 to supply an ultimate turbo decoding result to the input port of the byte de-interleaver 82 shown in FIG. 29.

FIGS. 45 and 46 show modifications made to FIGS. 14 and 15 of the M/H DTV receiver of FIGS. 14, 15, 16 and 13 in an alternative M/H DTV receiver suited for receiving transmissions from the DTV transmitter of FIGS. 1, 2, 3 and 4 with its FIG. 4 portion modified per FIG. 42. FIG. 45 differs from FIG. 14 in that the maximal-ratio QAM combiner 70 does not receive the coordinates of 64QAM symbol constellations that map parity bits of the CC components of PCCC transmitted for iterative-diversity reception.

FIG. 45 shows the maximal-rate QAM combiner 70 for combining the complex coordinates of 64QAM symbol constellations descriptive of data bits, as selected from the final transmissions for iterative-diversity reception, with the complex coordinates of corresponding 64QAM symbol constellations descriptive of data bits, as earlier selected from the initial transmissions for iterative-diversity reception. The complex coordinates of 64QAM symbol constellations descriptive of just data bits, as selected from the final transmissions for iterative-diversity reception, are supplied to a first input port of the QAM combiner 70 from the output port of a selector 220. The input port of the selector 220 is connected for receiving the complex coordinates of 64QAM symbol constellations from the final transmissions that are repeated for iterative-diversity reception, as reproduced at the output port of the selector 113. The complex coordinates of 64QAM symbol constellations descriptive of just data bits, as selected from the delayed initial transmissions for iterative-diversity reception, are supplied to a second input port of the QAM combiner 70 from the output port of a selector 221. The input port of the selector 221 is connected for receiving the delayed response of the delay memory 115 to the complex coordinates of 64QAM symbol constellations, as selected by the selector 114 from the initial transmissions for iterative-diversity reception. The output port of the QAM combiner 70 connects to the input port of a de-mapper 222 for 64QAM symbol constellations, which de-mapper 222 is depicted in FIG. 46.

FIG. 46 shows the input port of the de-mapper 222 of 64QAM symbol constellations connected for receiving the response of the QAM combiner 70, which response supplies the complex coordinates of 64QAM symbol constellations descriptive of data bits of the PCCC. The de-mapper 222 de-maps these data bits, supplying soft data bits of the PCCC from its output port to the random-access port of the memory 147 for soft data bits and extrinsic data. The soft data bits are written into the storage locations for soft data bits within the memory 147.

FIG. 46 shows a selector 223 with an input port connected for receiving the response of the selector 113 shown in FIG. 45. The selector 223 is operable for selectively reproducing the complex coordinates of 64QAM symbol constellations descriptive of parity bits from the final transmissions for iterative-diversity reception. The output port of the selector 223 is connected for supplying these selectively reproduced complex coordinates to the input port of a de-mapper 224 of 64QAM symbol constellations. The de-mapper 224 de-maps a first set of PCCC parity bits, supplying them from its output port to the write-input port of the memory 145 for that first set of PCCC parity bits.

FIG. 46 shows a selector 225 with an input port connected for receiving the response of the delay memory 115 shown in FIG. 45. The selector 225 is operable for selectively reproducing the complex coordinates of 64QAM symbol constellations descriptive of parity bits from the delayed initial transmissions for iterative-diversity reception. The output port of the selector 225 is connected for supplying these selectively reproduced complex coordinates to the input port of a de-mapper 226 of 64QAM symbol constellations. The de-mapper 226 de-maps a second set of PCCC parity bits, supplying them from its output port to the write-input port of the memory 148 for that second set of PCCC parity bits.

The memories 145, 147 and 148 together temporarily store all the components of the PCCC for a given service to be received by the M/H DTV receiver depicted in FIGS. 45, 46, 32, 16 and 13. The PCCC is turbo decoded by soft-input/soft-output decoders 149 and 150 in FIG. 46 in cooperation with the elements 151-156, operation being similar to that described supra with reference to FIG. 31. At the conclusion of turbo decoding, combined soft data bits and soft extrinsic data bits are read from the memory 147 to supply an ultimate turbo decoding result to the input port of the byte de-interleaver 82 shown in FIG. 32.

The DTV transmitter apparatus and DTV receiver apparatus embodying aspects of the invention that are described supra apply (204, 188) Reed-Solomon coding to 188-byte IPE packets in their entirety. In slightly different embodiments of these aspects of the invention, the initial synchronization bytes of the IPE packets are not included in the RS coding of the remaining bytes of each IPE packet. RS coding of the remaining bytes of each IPE packet can then use somewhat different RS coding, such as the (207, 187) Reed-Solomon coding used in 8VSB DTV broadcasting, as will be apparent to one skilled in the art of designing DTV systems.

The portion of a DTV transmitter depicted in FIG. 2 can be modified to include a byte de-interleaver for 188-byte data packets received from the FIG. 1 portion of the DTV transmitter. That byte de-interleaver de-interleaves bytes of the 188-byte data packets supplied to the input port of the RS encoder 9, so as to complement the subsequent interleaving of those bytes by the convolutional byte interleaver 14. This provides for the byte interleaving by the convolutional byte interleaver 14 to be "coded" or "implied" byte interleaving, wherein the bytes of 188-byte data packets are arranged in their original order in the response of the byte interleaver 14. The FIG. 12 portion of a DTV receiver capable of usefully receiving the transmissions from a DTV transmitter modified in this way will be modified to include a byte interleaver before the data de-randomizer 92, which byte interleaver complements the de-interleaving by the byte de-interleaver 82.

The portion of a DTV transmitter depicted in FIG. 3 can be modified to include a byte de-interleaver for the multiplexer 27 response. That byte de-interleaver de-interleaves bytes of the internet-protocol (IP) packets supplied to the input ports of the TRS encoders 28 and 29, so as to complement the subsequent interleaving of those bytes in the TRS encoder 28 or 29 and in the convolutional byte interleaver 42 in FIG. 4. This arranges for the bytes of the internet protocol packets to be restored to their original order in the response of the byte interleaver 42. The FIG. 16 portion of a DTV receiver capable of usefully receiving the transmissions from a DTV transmitter modified in this way will be modified to provide byte interleaving before the data de-randomizer 92, which byte interleaving restores the bytes of the IP packets to their original order. This byte interleaving is provided by suitable write addressing and read addressing of the RAM 118 so as to complement the byte de-interleaving provided by the byte de-interleaver 82 and the RAM 118.

In the DTV broadcast systems described above and illustrated in the drawings, convolutional byte interleaving is interposed between the apparatus for generating shortened RS codewords and the encoder for FEC coding the bits of those codewords. While the ONEs' complementing of the bits of those shortened RS codewords that have an excessive number of ZEROs in them increases the density of ONEs in the convolutional byte interleaving results, there is still the outside chance that the encoder for FEC coding the bits of the byte-interleaved shortened RS codewords will encounter a sequence of bits having a low density of ONEs. In a receiver for COFDM DTV signals bit intervals are synchronized during the QAM de-mapping procedures, before procedures for decoding the FEC coding of bits. This makes it practical to transmit the FEC coding of bits in temporally shuffled form, to be restored to original order before decoding that FEC coding. Accordingly, COFDM DTV transmitters can be designed in which the apparatus for generating shortened RS codewords supplies those codewords without byte interleaving to the encoder for FEC coding the bits of those codewords. The FEC-coded bytes of the shortened RS codewords can then be subjected to convolutional interleaving to accommodate RS decoding in the COFDM receiver. The COFDM receiver uses de-interleaving to chop up long intervals of signal corruption in the codestream reproduced by de-mapper of QAM symbol constellations so as to disperse lesser amounts of the signal corruption among a greater number of shortened RS codewords, making it more likely that RS decoding procedures can reproduce data correctly. The chopping up of long intervals of signal corruption in the codestream reproduced by de-mapper of QAM symbol constellations also disperses lesser amounts of the signal corruption throughout the decoding of the FEC coding of the bits of RS codewords, however, tending to increase the number of running errors that occur in the results of decoding convolutional FEC coding of the bits of RS codewords. This taxes the decoding of the shortened RS codewords, which is a reason for not preferring modification of the DTV broadcast systems described in this paragraph if the FEC coding of the bits of RS codewords involves convolutional coding. If the FEC coding of the bits of RS codewords is LDPC coding, that form of coding does not generate running errors.

A COFDM DTV transmitter as shown in FIGS. 3 and 4 can be modified to replace the convolutional interleaver 42 with a direct connection from the output port of the selector 39 to the input port of the encoder 43 for FEC encoding bits. The FIG. 16 portion of a DTV receiver capable of usefully receiving the transmissions from a DTV transmitter modified in this way will be modified to replace the de-interleaver 82 with direct connections from the output port of the SISO decoder 81 to the input port of the quantizer 83 and to the input port of the bank 88 of XOR gates. The DTV receiver then depends on the decoder 119 of (255, 191) TRS coding to correct long drop-outs in received signal strength. Drop-outs that are too long to be corrected are not dispersed by the byte de-interleaving and re-interleaving procedures carried out using the RAMs 118 and 130, so such a drop-out affects fewer IP packets than might be the case otherwise.

FIG. 47 is an informal flow chart illustrating in more generic form the method for decoding concatenated coding of data bits in electronic apparatus, which concatenated coding was generated by further coding a collection of shortened Reed-Solomon codewords some of which are TRUE in form and some of which are FALSE in form. The collection of shortened Reed-Solomon codewords is a succession of shortened Reed-Solomon codewords when the shortened Reed-Solomon codewords are decoded serially per FIG. 47, rather than to some extent being decoded in parallel. A first step 301 of the method as illustrated in FIG. 47 is decoding the inner coding of the concatenated coding. If the results of the decoding step 301 comprise byte-interleaved shortened Reed-Solomon codewords, a second step 302 of the method is de-interleaving those byte-interleaved shortened Reed-Solomon codewords to generate de-interleaved shortened Reed-Solomon codewords for subsequent steps 303 and 305 of the method. If the results of the decoding step 301 comprise shortened Reed-Solomon codewords that are not byte-interleaved, the second step 302 of the method essentially consists of forwarding these shortened Reed-Solomon codewords directly to steps 303 and 305 of the method illustrated in FIG. 47.

In the step 303 of the method illustrated in FIG. 47 a ZEROs-fill technique is used for lengthening each shortened Reed-Solomon codeword to generate a respective full-length Reed-Solomon codeword. This step 303 generates a first collection of possibly TRUE full-length Reed-Solomon codewords supplied one at a time for a subsequent step 304 of attempting to decode each of said first collection of possibly TRUE full-length Reed-Solomon codewords, to generate a first set of respective data packets as decoding results together with respective indications as to whether each of that first set of data packets is correct.

In the step 305 of the method illustrated in FIG. 47 the bits of the shortened Reed-Solomon codewords are ONEs' complemented. This step 305 is followed by a step 306 of using the ZEROs-fill technique to lengthen each of said shortened Reed-Solomon codewords having had its bits ONEs' complemented. This step 306 generates a second collection of possibly TRUE full-length Reed-Solomon codewords supplied one at a time for a subsequent step 307 of attempting to decode each of said second collection of possibly TRUE full-length Reed-Solomon codewords, to generate a second set of respective data packets as decoding results together with respective indications as to whether each of that second set of data packets is correct.

In the final step 308 of the method illustrated in FIG. 47 final decoding results are generated by selecting data packets resulting from the decoding steps 304 and 307 that are indicated to be correct. If desired, these final decoding results are augmented by data packets from the decoding step 304 that, like corresponding bit-complemented data packets from the decoding step 307, are indicated not to be correct. In variants of the method of decoding illustrated in FIG. 47, steps 305, 306 and 307 are performed only on RS codewords that the decoding step 304 indicates not to be correct.

FIG. 48 is an informal flow chart illustrating in generic form a method for decoding concatenated coding of data bits in electronic apparatus that is alternative to the method illustrated in FIG. 47, but provides equivalent overall operation. The concatenated coding was generated by further coding a collection of shortened Reed-Solomon codewords, some of which are TRUE in form and some of which are FALSE in form. The collection of shortened Reed-Solomon codewords is a succession of shortened Reed-Solomon codewords when the shortened Reed-Solomon codewords are decoded serially per FIG. 48, rather than to some extent being decoded in parallel. A first step 401 of the method as illustrated in FIG. 48 is decoding the inner coding of the concatenated coding. If the results of the decoding step 401 comprise byte-interleaved shortened Reed-Solomon codewords, a second step 402 of the method is de-interleaving those byte-interleaved shortened Reed-Solomon codewords to generate de-interleaved shortened Reed-Solomon codewords for subsequent steps 403 and 405 of the method. If the results of the decoding step 401 comprise shortened Reed-Solomon codewords that are not byte-interleaved, the second step 402 of the method essentially consists of forwarding these shortened Reed-Solomon codewords directly to steps 403 and 405 of the method illustrated in FIG. 48.

In the step 403 of the method illustrated in FIG. 48 a ZEROs-fill technique is used for lengthening each shortened Reed-Solomon codeword to generate a respective full-length Reed-Solomon codeword. This step 403 generates a first collection of possibly TRUE full-length Reed-Solomon codewords supplied one at a time for a subsequent step 404 of attempting to decode each of said collection of possibly TRUE full-length Reed-Solomon codewords, to generate a first set of respective data packets as decoding results together with respective indications as to whether each of that first set of data packets is correct.

In the step 405 of the method illustrated in FIG. 48 a ONEs-fill technique is used for lengthening each shortened Reed-Solomon codeword to generate a respective full-length Reed-Solomon codeword. This step 405 generates a collection of possibly FALSE full-length Reed-Solomon codewords supplied one at a time for a subsequent step 406 of attempting to decode each of said collection of possibly FALSE full-length Reed-Solomon codewords, to generate a second set of respective data packets as decoding results together with respective indications as to whether each of that second set of data packets is correct. The data packets in this second set of data are supplied one at a time for a subsequent step 407 of having all their bits, except for their respective transport-error-indicator (TEI) bits, ONEs' complemented.

In the final step 408 of the method illustrated in FIG. 48 final decoding results are generated by selecting data packets resulting from the decoding step 404 and the bit-complementing step 407 that are indicated to be correct. If desired, these final decoding results are augmented by data packets from the decoding step 404 that, like corresponding bit-complemented data packets from the bit-complementing step 407, are indicated not to be correct. In variants of the method of decoding illustrated in FIG. 48, steps 405, 406 and 407 are performed only on RS codewords that the decoding step 404 indicates not to be correct.

FIG. 49 is an informal flow chart illustrating a procedure carried out by modifications that can be introduced between the data de-randomizer 92 and the IP packet parsing unit 93 in the DTV receiver apparatus depicted in FIG. 13. The response from the output port of the data de-randomizer 92 may occasionally contain a salvageable IP packet, despite the selector 91 having made an erroneous selection of a FALSE rather than TRUE (204, 188) RS packet. The FIG. 49 procedure attempts to use the CRC coding of that IP packet to control conversion of de-randomized data extracted from a FALSE (204, 188) RS packet to de-randomized data as would be extracted from a TRUE (204, 188) RS packet, thus to generate a corrected stream of de-randomized data that is supplied to the input port of the IP packet parsing unit 93. The procedure illustrated in FIG. 49 involves a considerable amount of computation, which can be carried out in a microprocessor that not only replaces the FIG. 34 microprocessor 168 but further replaces the data de-randomizer 92 also.

An initial step 501 in the FIG. 49 procedure is to establish a window spanning a plurality, P in number, of successive 184-byte segments of the IP data stream supplied from the data de-randomizer 92. This window is stepped forward in time at least one 184-byte segment with each successive performance of the FIG. 49 procedure. The number P of successive 184-byte segments in the stepped window is chosen one 184-byte segment longer than needed to span the longest IP packet permitted in the DTV broadcast system.

In substeps of a next step 502 in the FIG. 49 procedure, the window established in step 501 is modified in a number of different ways by ONEs' complementing all the bits in one or more of the 184-byte segments of the IP data stream within the original window. These substeps in the step 502 are not explicitly shown in FIG. 49. These substeps generate a plurality, one less than two raised to the power P, of further possible windows of P successive 184-byte segments of the IP data stream for analysis in following steps 503, 504 and 505 of the FIG. 49 procedure.

In substeps of the next step 503 in the FIG. 49 procedure, each of the plurality, two raised to the power P, of possible windows of P successive 184-byte segments of the IP datastream is parsed to locate the complete IP packets therein. The headers of each IP packet contains information concerning where in the IP datastream the next IP packet begins. Subsequently in substeps of the next step 504 in the FIG. 49 procedure, the CRC coding of the first complete IP packet in each of the possible windows is decoded to determine whether or not that first complete IP packet is correct. If that first complete IP packet spans nearly the whole of each window, that packet will be found to be correct in no more than one of the plurality, two raised to the power P, of possible windows of P successive 184-byte segments of the IP data stream. The less of each of these windows that contains the first complete IP packet spans, the more likely it is that packet will be found to be correct in more than one of these possible windows. In substeps of the subsequent decision step 505 in the FIG. 49 procedure, the CRC decoding results from the step 504 in regard to each of the possible windows are evaluated in order to decide whether that window contains a correct first complete IP packet.

If the decision in a substep of the step 505 is YES that one of the windows does contain a correct first complete IP packet, the FIG. 49 procedure proceeds to a compound step 506. In an initial substep of the step 506, all of the 184-byte segments except the last that contain the correct first complete IP packet are forwarded to the IP packet parsing unit 93. Then, in a final substep of the step 506, the FIG. 49 procedure loops back to step 501 after stepping the stepped window forward in time to begin with the 184-byte segment in which the correct first complete IP packet concludes.

If the ultimate decision in step 505 is NO that none of the windows contains a correct first complete IP packet, the FIG. 49 procedure proceeds to a compound step 507. In an initial substep of the step 507, only the initial 184-byte segment of the stepped window from the previous step 501 is forwarded to the IP packet parsing unit 93. Then, in a final substep of the step 507, the FIG. 49 procedure loops back to step 501 after stepping the stepped window forward in time to begin one 184-byte segment later than previously.

There is little if any need for the FIG. 49 procedure to be carried out by modifications introduced between the data de-randomizer 92 and the IP packet parsing unit 93 in the DTV receiver apparatus depicted in FIGS. 14, 15, 16 and 13. The decoding of the (255, 191) TRS coding by the decoder 119 in FIG. 16 can usually correct for the selector 91 occasionally making an erroneous selection of a FALSE rather than TRUE (204, 188) RS packet.

FIGS. 50 and 51 together provide a schematic diagram of a portion of a COFDM transmitter similar to those used for transmitting DVB-T2 signals, which transmitter ONEs' complements selected BCH block codes to remedy low densities of ONEs in them before subsequent LDPC coding. FIG. 50 shows apparatus for processing time-slices of data for assembly into baseband frames. Apparatus for forward-error-correction coding the baseband frames and generating subsequent COFDM signals is shown in FIG. 51.

A multiplexer 231 of time-sliced services for assembly into baseband frames is shown at mid-page of FIG. 50. The multiplexer 231 successively selects time-slices of various services to be reproduced in its response, which is supplied as input signal to a baseband frame assembler 232. The baseband frame assembler 232 is similar to that used in a transmitter of DVB-T2 signals. FIG. 50 shows an exemplary arrangement of elements 233, 234, 235, 236, 237 and 238 for supplying the multiplexer 231 with time-slices of data from a plurality of services scheduled for iterative-diversity reception.

Data concerning a first of the services to be transmitted twice to enable iterative-diversity reception are supplied to the input port of a data randomizer 233. The data randomizer 233 is connected for supplying its response to the random-access port of a dual-port random-access memory 234 for being written into temporary storage locations therein. The RAM 234 is capable of temporarily storing a number at least 32M+1 of time-slices of the first service, each to be transmitted twice, one time-slice more than M super-frames apart, to enable iterative-diversity reception by stationary DTV receivers. The dual-port RAM 234 has a serial output port connected to a first input port of the multiplexer 231 of time-sliced services. Successive time-slices of the first service are read from the RAM 234, one odd-numbered time-slice per super-frame, to support initial transmissions of those time-slices. The successive time-slices of the first service are read again from the RAM 234, one even-numbered time-slice per super-frame, to support the final transmissions of those time-slices.

Data concerning a second of the services to be transmitted twice to enable iterative-diversity reception by stationary DTV receivers are supplied to the input port of a data randomizer 235. The data randomizer 235 is connected for supplying its response to the random-access port of a dual-port random-access memory 236 for being written into temporary storage locations therein. The RAM 236 is capable of temporarily storing a number, at least 32M+1, of time-slices of the second service to be transmitted twice to enable iterative-diversity reception. The dual-port RAM 236 has a serial output port connected to a second input port of the multiplexer 231. Successive time-slices of the second service are read from the RAM 236, one odd-numbered time-slice per super-frame, to support initial transmissions of those time-slices. The successive time-slices of the second service for reception by stationary DTV receivers are read again from the RAM 236, one even-numbered time-slice per super-frame, to support the final transmissions of those time-slices.

Data concerning a third of the services to be transmitted twice to enable iterative-diversity reception by stationary DTV receivers are supplied to the input port of a data randomizer 237. The data randomizer 237 is connected for supplying its response to the random-access port of a dual-port random-access memory 238 for being written into temporary storage locations therein. The RAM 238 is capable of temporarily storing a number, at least 32M+1, of time-slices of the third service to be transmitted twice to enable iterative-diversity reception by stationary DTV receivers. The dual-port RAM 238 has a serial output port connected to a third input port of the multiplexer 231. Successive time-slices of the third service for reception by stationary DTV receivers are read from the RAM 238, one odd-numbered time-slice per super-frame, to support initial transmissions of those time-slices. The successive time-slices of the third service for reception by stationary DTV receivers are read again from the RAM 238, one even-numbered time-slice per super-frame, to support the final transmissions of those time-slices.

Alternatively, the data randomizers 233, 235 and 237 can be connected after the RAMs 234, 236 and 238, rather than before. Each of the data randomizers 233, 235 and 237 exclusive-ORs the bits of a data stream with the bits of a standardized pseudo-random binary sequence. Data randomization of the final 187 bytes of the MPEG-2 transport-stream packets can also be done using a single data randomizer connected just after the output port of the multiplexer 231. Connecting the data randomizers 233, 235 and 237 before the RAMs 234, 236 and 238 allows the data randomizers to operate at the slower rate that these RAMs can be written, rather than at a higher rate at which these RAMs must be read.

FIG. 51 shows a connection for supplying IP packets from the baseband frame assembler 232 to the input port of a BCH encoder 239 for shortened BCH block coding. The BCH encoder 239 generates shortened BCH codewords, each formed using an all-ZEROs fill as the virtual bytes of the full-length BCH codeword. The output signal from the BCH encoder 239 reproduces the baseband frames read to the BCH encoder 239, following each segment of systematic bits k in number with a number t of parity bits to form a respective BCH codeword as calculated by the BCH encoder 239. The output port of the BCH encoder 239 is connected for supplying successive BCH codewords to the input port of a logic inverter 240 and to the first of two input ports of a selector 241. The output port of the logic inverter 240 connects to the second input port of the selector 241, supplying it with ONEs' complemented BCH codewords.

A counter 242 is connected for counting the number of ONEs in each shortened BCH codeword generated by the BCH encoder 239. A comparator 243 is connected for receiving counts supplied from the counter 242 and determining whether or not the final count of ONEs in each shortened BCH codeword is less than a prescribed number N'. If the comparator 243 determines that the count of ONEs in a shortened BCH codeword is at least that prescribed number N', it supplies an indication of this that conditions the selector 241 to reproduce at its output port the shortened BCH codeword that the BCH encoder 239 supplies to the first input port of the selector 241. If the comparator 243 determines that the count of ONEs in a BCH codeword is less than the prescribed number N', it supplies an indication of this that conditions the selector 241 to reproduce at its output port the ONEs' complemented shortened BCH codeword that the logic inverter 240 supplies to the second input port of the selector 241. The prescribed number N' will customarily be substantially smaller than half the maximum number of ONEs possible in a shortened BCH codeword. A smaller prescribed number N' reduces problems that arise in a DTV receiver when it is unable to determine whether ones of the shortened BCH codewords it receives were transmitted in TRUE form or in ONEs' complemented form. This difficulty arises owing to those codewords having been corrupted during their transmission. Using a smaller prescribed number N' reduces the likelihood that shortened BCH codewords are transmitted in ONEs' complemented form. The DTV receiver can then be designed to presume that any badly corrupted shortened BCH codewords it receives were transmitted in TRUE form, which presumption will more likely than not be correct.

FIG. 51 shows the output port of the selector 241 connected for supplying its response, the shortened BCH codewords in TRUE form or in ONEs' complemented form, to the input port of a encoder 244 for LDPC coding of bits. The output port of the LDPC encoder 244 is connected to the input port of a bit interleaver 245 that spreads successive bits of its input signal apart when reproducing them in the output signal that the bit interleaver 245 supplies from its output port to the input port of a QAM symbol interleaver 246. The spreading of successive bits by the bit interleaver 245 tends to dispose them in different QAM symbols, and the QAM symbol interleaver 246 shuffles the ordering of the QAM symbols in its response supplied from its output port to the input port of a QAM symbol constellation mapper 247 for 64QAM, for 256QAM or for QAM symbol constellations with still more lattice points. The output port of the QAM symbol constellation mapper 247 is connected to the input port of a parser 248 for effective OFDM symbol blocks.

The block parser 248 parses a stream of complex samples supplied from the QAM symbol constellation mapper 247 into uniform-length sequences of complex samples, each of which sequences is associated with a respective effective OFDM symbol. The output port of the block parser 248 is connected to a first input port of a pilot and TPS signal insertion unit 249, a second input port of which unit 249 is connected to receive Transmission Parameters Signaling (TPS) bits from a TPS signal generator 250. The pilot and TPS signal insertion unit 249 inserts these TPS bits, which are to be conveyed by dedicated carriers (TPS Pilots), into each effective OFDM symbol block. The pilot and TPS signal insertion unit 249 inserts other bits descriptive of unmodulated carriers of predetermined amplitude and predetermined phase into each effective OFDM symbol block. An output port of the pilot and TPS signal insertion unit 249 is connected for supplying the effective OFDM symbol blocks with pilot carriers inserted therein to the input port of an OFDM modulator 251.

The OFDM modulator 251 has 1K, 2K, 4K, 8K, 16K or 32K carriers capability. The OFDM modulator 251 includes a serial-to-parallel converter for converting the serially generated complex digital samples of the effective OFDM symbols to parallel complex digital samples for inverse discrete Fourier transformation (I-DFT). The OFDM modulator 251 further includes a parallel-to-serial converter for converting the parallel complex digital samples of the I-DFT results to serial complex digital samples of the I-DFT results supplied from the output port of the OFDM modulator 251 to the input port of a guard-interval-and-cyclic-prefix insertion unit 252. FIG. 43 shows the output port of the guard-interval-and-cyclic-prefix insertion unit 21 connected for supplying successive complex digital samples of a COFDM signal to a third input port of the all-services multiplexer 22.

FIGS. 52 and 53 successively combine with FIG. 13 thereafter to provide a schematic diagram of a receiver for iterative-diversity reception of COFDM signals transmitted by a DTV transmitter as depicted in FIGS. 50 and 51. The elements 259, 260, 261, 262, 263, 264, 265, 266, 267, 268, 269 and 270 shown in FIG. 52 correspond in general function to elements 59, 60, 61, 62, 63, 64, 65, 66, 67, 68, 69 and 70, respectively, shown in FIG. 11. The elements 259, 260, 261, 262, 263, 264, 265, 266, 267, 268, 269 and 270 shown in FIG. 52 also correspond in general function to elements 105, 106, 107, 108, 109, 110, 111, 112, 113, 114, 115 and 70, respectively, shown in FIG. 14. FIG. 52 shows a reception antenna 258 connected to the input port of a front-end tuner 259, which antenna 258 employs different structures depending on whether or not the receiver is designed to move during its reception of COFDM signals.

FIG. 52 shows an AFPC generator 260 connected for supplying automatic frequency and phase control (AFPC) signal for controlling the final local oscillator of the front-end tuner 259. The output port of the front-end tuner 259 is connected for supplying digitized samples of baseband COFDM signal to the input port of a cyclic prefix detector 261. The output port of the cyclic prefix detector 261 is connected to supply indications of the phasing of COFDM symbols to a first of two input ports of timing synchronization apparatus 262. A first of two output ports of the timing synchronization apparatus 262 is connected for supplying gating control signal to the control input port of a guard-interval-removal unit 263. The signal input port of the guard-interval-removal unit 263 is connected for receiving digitized samples of baseband COFDM signal from the output port of the front-end tuner 259. The output port of the guard-interval-removal unit 263 is connected for supplying the input port of an OFDM demodulator 264 with windowed portions of the baseband COFDM signal that contain effective COFDM samples. A second of the output ports of the timing synchronization apparatus 262 is connected for supplying the OFDM demodulator 264 with synchronizing information concerning the effective COFDM samples.

A first output port of the OFDM demodulator 264 is connected for supplying demodulated pilot carrier information to the input port of a pilot and TPS carriers processor 265. A first of four output ports of the pilot and TPS carriers processor 265 is connected for supplying more accurate window positioning information to the second input port of the timing synchronization apparatus 262. The second output port of the pilot and TPS carriers processor 265 is connected for supplying the TPS information to the SMT information processing unit 101 shown in FIG. 13. The third output port of the pilot and TPS carriers processor 265 is connected for forwarding unmodulated pilot carriers to the input port of the AFPC generator 260 that supplies AFPC signal to the front-end tuner 259 for controlling the final local oscillator therein. The fourth output port of the pilot and TPS carriers processor 265 is connected for supplying information concerning the respective energies of unmodulated pilot carriers to the maximal-ratio QAM combiner 270 shown at the foot of FIG. 52.

A second output port of the OFDM demodulator 264 is connected to supply complex digital coordinates of successive QAM symbol constellations to a first input port of a frequency-domain channel equalizer 266. FIG. 52 shows the frequency-domain channel equalizer 266 having a second input port connected for receiving pilot carriers supplied from the first input port of the OFDM demodulator 264. The output port of the channel equalizer 264 is connected for supplying equalized carriers conveying FEC coding in QAM format to the input ports of selectors 267 and 268. The selector 267 is operable for reproducing at its output port just those transmissions that are not repeated and the final ones of those transmissions repeated for iterative-diversity reception. The selector 268 is operable for reproducing at its output port just the initial ones of those transmissions subsequently repeated for iterative-diversity reception. The output port of the selector 268 is connected for writing to the input port of a delay memory 269 that delays the initial transmissions subsequently once-repeated for iterative-diversity reception. The delay is such that the transmissions subsequently repeated for iterative-diversity reception are supplied from the output port of the delay memory 269 concurrently with the corresponding final transmissions as repeated for iterative-diversity reception that are supplied from the output port of the selector 268. The output port of the selector 267 connects to the first input port of the maximal-ratio QAM combiner 270, and the output port of the delay memory 269 connects to the second input port of the maximal-ratio QAM combiner 270. The output port of the maximal-ratio QAM combiner 270 is connected for supplying complex coordinates of QAM symbol constellations to the input port of the QAM symbol constellation de-mapper 271 shown in FIG. 53.

FIG. 53 shows the maximal-ratio QAM combiner 270 response supplied to the input port of a de-mapper 271 for successive QAM symbol constellations. The de-mapper 271 responds to the soft complex QAM coordinates descriptive of successive QAM symbol constellations to recover a number of soft bits of FEC coding from each constellation. The de-mapper 271 supplies the soft bits of FEC coding from its output port to the input port of a QAM symbol de-interleaver 272, which de-interleaves the interleaving of QAM symbols performed at the DTV transmitter. The QAM symbol interleaver 246 performs such interleaving in the portion of the DTV transmitter that FIG. 51 shows, for example, subsequent to the bit interleaver 247 having interleaved the bits of previous LDPC coding. FIG. 53 shows the output port of the QAM symbol de-interleaver 272 connected to the input port of a bit de-interleaver 273 which de-interleaves the interleaving of bits of LDPC coding performed at the DTV transmitter. The QAM symbol de-interleaver 272 and the bit interleaver 247 preserve the confidence-level information in the soft bits of the de-mapper 271 response they process. The output port of the bit de-interleaver 273 is connected for supplying the soft bits of LDPC coding reproduced therefrom to the input port of a soft-input/soft-output decoder 274 for LDPC coding. The SISO decoder 274 for LDPC coding customarily comprises memory for storing time-slices of LDPC coding, which memory supports iterative-decoding procedures. In actual practice, appropriate initial write addressing of this memory is apt to perform the functions of the QAM symbol de-interleaver 272 and the bit interleaver 247 that FIG. 53 shows separate structures for performing such functions.

The output port of the SISO decoder 274 for LDPC coding is connected for supplying the soft data bits of its decoding results to the input port to the input port of a quantizer 275. The output port of the quantizer 275 is connected for providing hard decisions concerning the bits of shortened BCH codewords to the input port of a bitstream de-multiplexer 276. The output port of the bitstream de-multiplexer 276 is connected for supplying de-multiplexed bitstreams of the shortened BCH codewords as received in TRUE or ONEs' complemented form to the respective input ports of a bank 277 of logic inverters for the respective bitstreams of BCH coding and to the input port of a decoder 278 for BCH coding. The output ports of the bank 277 of logic inverters are connected for supplying shortened BCH codewords to the input port of a decoder 279 for BCH coding. These 208-byte codewords ONEs' complement the shortened BCH codewords as received in TRUE or ONEs' complemented form at the input ports of the bank 277 of logic inverters.

The soft bits of BCH coding supplied from the SISO decoder 274 for LDPC coding contain confidence-level information that can be analyzed to locate byte errors for decoding that BCH coding. The output port of the SISO decoder 274 for LDPC coding is connected for supplying soft bits of BCH coding to a bank 280 of exclusive-OR gates. The bank 280 of XOR gates exclusive-ORs the hard data bit of each soft data bit with the remaining bits of that soft bit expressive of the level of confidence that the hard data bit is correct. The result of this operation is the generation of a plurality of bits expressing in absolute terms the level of lack of confidence that the hard data bit is correct. An adaptive threshold detector 281 detects which bits of each successive BCH codeword have levels of lack of confidence that exceed a threshold value and supplies indications of the occurrences of such bits to the decoder 278, to the decoder 279 and to a counter 282 as input to be counted. The decoders 278 and 279 utilize such indications for erasure of the bits of each successive BCH codeword having levels of lack of confidence that exceed a threshold value.

The counter 282 counts the occurrences of bits in each successive BCH codeword having levels of lack of confidence that exceed the current threshold value. The counter 282 is connected to supply that count both to the adaptive threshold detector 281 and to a unit 283 to control decoding of LDPC coding. One or both of the adaptive threshold detector 281 and the unit 283 contains a comparator for determining whether the count of possible bit errors associated with a BCH codeword exceeds the error-correction capability of each of the decoders 278 and 279.

If this be the case, count output from the counter 282 is reset to zero in preparation for a recount, and the adaptive threshold detector 281 adjusts the threshold value for that BCH codeword individually, upward from the prescribed normal threshold value, so as to reduce a recount of possible bit errors associated with that BCH codeword. The unit 283 to control decoding of LDPC coding conditions memory in the SISO decoder 274 to re-read the soft bits of the last BCH codeword to the input ports of the quantizer 275 and the bank 280 of XOR gates.

If the number of bits in each successive BCH codeword having levels of lack of confidence that exceed the current threshold value is within the error-correction capability of each of the decoders 278 and 279, the adaptive threshold detector 281 utilizes the prescribed normal threshold value when the processing of the next successive BCH codeword begins.

A selector 284 has a first input port connected for receiving systematic bits from the output port of the decoder 278 for BCH codewords and a second input port connected for receiving systematic bits from the output port of the decoder 279 for BCH codewords. The selector 284 reproduces at its output port systematic bits received at a currently selected one of its first and second input ports. The output port of the selector 284 is connected for supplying these reproduced results of decoding BCH codewords to the input port of a data de-randomizer 92 shown in FIG. 13.

The selector 284 is connected for receiving indications from the decoder 278 as to whether or not the decoder 278 finds the results of decoding each BCH codeword to be correct. If the decoder 278 indicates that the systematic bits of the decoding results supplied from its output port are correct, this indication conditions the selector 284 to reproduce these systematic bits at its output port. The decoder 278 for BCH codewords will extend a shortened BCH codeword to full length using all-ZEROs "virtual" bytes as a preliminary step in decoding procedure. Absent a received BCH codeword transmitted in the TRUE logic sense having been corrupted by noise or by signal fading, a correct or correctable full-length BCH codeword will be formed from that shortened BCH codeword. The decoder 278 for BCH codewords will signal the selector 284 that the systematic bits decoded from the BCH codeword and supplied from the output port of the decoder 278 to the first input port of the selector 284 are suitable for reproduction in the selector 284 response. That is, the decoder 278 for BCH codewords found the decoded systematic bits to be correct as received or was able to correct any erroneous one or ones of these bits.

Since shortened BCH codewords are non-transparent, a shortened correct or correctable full-length BCH codeword is very unlikely be formed from a shortened BCH codeword transmitted in the FALSE logic sense even if corrupted by noise or by signal fading. The decoder 278 for BCH codewords will signal the selector 284 that the systematic bits of the BCH codeword reproduced at the output port of the decoder 278 and applied to the first input port of the selector 284 are not suitable for reproduction in the selector 284 response. That is, the decoder 278 for BCH codewords found the extracted systematic bits supplied from the output port of the decoder 278 to have contained error as received which error the decoder 278 was unable to correct.

The decoder 279 for BCH codewords uses all-ZEROs "virtual" bytes to extend a shortened BCH codeword as ONEs' complemented by the bank 277 of logic inverters. The decoder 279 will not consider a BCH codeword received in a TRUE logic sense and subsequently ONEs' complemented by the bank 277 of logic inverters to be a correct BCH codeword nor to be correctable to one, so the decoder 279 will indicate to the selector 284 that the systematic bits from the response of the bank 277 of logic inverters that are currently reproduced at the output port of the decoder 279 and applied to the second input port of the selector 284 are incorrect.

The decoder 279 may consider a BCH codeword received in a FALSE logic sense and subsequently ONEs' complemented by the bank 277 of logic inverters to be a correct BCH codeword or to be correctable to one. In such case the decoder 279 will indicate to the selector 284 that the systematic bits currently supplied from its output port are correct.

If the decoder 278 indicates that the systematic bits supplied from its output port are correct, this indication conditions the selector 284 to reproduce those systematic bits at its output port. If the decoder 278 indicates that the systematic bits supplied from its output port are correct, this indication conditions the selector 284 to reproduce those systematic bits at its output port. The selector 284 will never receive indications from both the decoder 278 and the decoder 279 that the systematic bits they concurrently respectively supply are correct. However, the selector 284 can receive indications from both the decoder 278 and the decoder 279 that the systematic bits they concurrently respectively supply are incorrect when BCH codewords as transmitted in TRUE or ONEs' complemented form are corrupted by noise or by signal fading. In such case, if connected simply as shown in FIG. 53, the selector 284 is conditioned to reproduce the systematic bits supplied from the decoder 278 even though those systematic bits contain error.

FIGS. 54 and 55 successively combine with FIG. 13 thereafter to provide a schematic diagram of an alternative receiver for iterative-diversity reception of COFDM signals as transmitted by a DTV transmitter as depicted in FIGS. 50 and 51. The elements 258, 259, 260, 261, 262, 263, 264, 265 and 266 shown in FIG. 54 correspond in structure and function to similarly numbered elements shown in FIG. 52. FIG. 54 shows the output port of the frequency-domain channel equalizer 266 connected directly to the input port of a de-mapper 284 of QAM symbol constellations. The QAM symbol constellations are 64QAM symbol constellations in some embodiments of the alternative DTV receivers, 256QAM symbol constellations in other embodiments, and 1024QAM symbol constellations in still other embodiments.

The de-mapper 284 responds to the soft complex QAM coordinates descriptive of successive QAM symbol constellations to recover a number of soft bits of FEC coding from each constellation. The de-mapper 284 supplies the soft bits of FEC coding from its output port to the input port of a QAM symbol de-interleaver 285, which de-interleaves the interleaving of QAM symbols performed at the DTV transmitter. FIG. 54 shows the output port of the QAM symbol de-interleaver 285 connected to the input port of a bit de-interleaver 286 which de-interleaves the interleaving of bits of LDPC coding performed at the DTV transmitter. The QAM symbol de-interleaver 285 and the bit interleaver 286 preserve the confidence-level information in the soft bits of the de-mapper 284 response they process.

The output port of the bit de-interleaver 286 is connected for supplying the soft bits of LDPC coding reproduced therefrom to the input port of a selector 287. The selector 287 selectively reproduces soft bits of FEC coding just from those transmissions that are not repeated and from the final ones of those transmissions that are repeated for iterative-diversity reception. The output port of the selector 287 is connected to supply these soft bits of FEC coding to a first of two input ports of a maximal-ratio code combiner 290.

The output port of the de-mapper 286 is further connected for supplying soft bits of FEC coding to the input port of a selector 288. The selector 288 selectively reproduces soft bits of FEC coding from just the initial ones of transmissions subsequently repeated for iterative-diversity reception. The output port of the selector 288 is connected to supply these soft bits of FEC coding to the input port of a delay memory 289 reproduces these soft bits after a delay, which can be a prescribed fixed delay. Alternatively, the delay can be programmable responsive to delay specified by bits of TPS coding. In either case, the delay is such that the output port of the delay memory 289 supplies delayed soft bits of FEC coding from the initial transmissions concurrently with the soft bits of FEC coding from the corresponding final transmissions supplied from the output port of the selector 288. The output port of the selector delay memory 289 is connected for supplying the delayed soft bits of FEC coding from the initial transmissions to the second input port of the maximal-ratio code combiner 290.

The maximal-ratio code combiner 290 is connected for receiving pilot-carrier-energy information from the pilot and TPS carriers processor 265, although FIG. 54 does not explicitly show the connection. The pilot and TPS carriers processor 265 squares the real and imaginary terms of each unmodulated pilot carrier, sums the resulting squares and square-roots the sum to determine the RMS energy of that unmodulated pilot carrier. The RMS energies of the unmodulated pilot carriers are then summed by an accumulator, which determines the total RMS energy of the unmodulated pilot carriers for each OFDM symbol epoch. The maximal-ratio code combiner 290 weights the soft bits of FEC coding received at its first and second input ports in a ratio dependent on their respective total RMS energies and then adds those coordinates as so weighted to generate code-combined soft bits of FEC coding.

FIG. 55 shows the input port of the SISO decoder 274 connected for receiving soft data bits from the output port of the maximal-ratio code combiner 290 shown in FIG. 54. The elements 258, 274, 275, 276, 277, 278, 279, 280, 281, 282, 283 and 284 shown in FIG. 55 correspond in structure and function to similarly numbered elements shown in FIG. 53.

The output port of the selector 284 is connected for supplying reproduced results of decoding BCH codewords to the input port of a data de-randomizer 92 shown in FIG. 13.

The codewords of BCH coding employed in the DVB-T2 and DVB-SH standards can each contain 16,200 bits or 64,800 bits. Sequences of bits that have low densities of ONEs are apt to be of substantially shorter length than 16,200 bits. If sequences of bits that have low densities of ONEs are to be selectively ONEs' complemented, then, it is advantageous to employ shorter BCH codewords.

Persons skilled in the art of designing DTV systems are apt to discern that various modifications and variations can be made in the specifically described apparatuses without departing from the spirit or scope of the invention. Accordingly, it is intended that these modifications and variations of the specifically described apparatus be considered to result in further embodiments of the invention, which are included within the scope of the appended claims and their equivalents.

The claims following this detailed specification use the term "lateral-data packets" as a collective description of 188-byte IPE packets, MPEG-2 data packets and other similar packets, collectively. The term is intended to be further collectively descriptive of the 187-byte packets that exclude the initial synchronization bytes of the IPE packets, MPEG-2 data packets and other similar packets. The data in these "lateral-data" packets are considered lateral data as referred to the signal offered for convolutional byte interleaving in DTV transmitter apparatus or recovered after de-interleaving of the convolutional byte interleaving in DTV receiver apparatus. The Reed-Solomon codewords formed from these lateral-data packets are termed lateral RS codewords. The claims following this detailed specification use the term "transversal-data packets" to describe the data packets subjected to full-length 255-byte RS coding, such as the 191-byte packets used in (255, 191) RS coding. The data in these "transversal-data" packets are considered transversal data as referred to the lateral data in the signal offered for convolutional byte interleaving in DTV transmitter apparatus or recovered after de-interleaving of the convolutional byte interleaving in DTV receiver apparatus. The Reed-Solomon codewords formed from these lateral-data packets are termed transversal RS codewords.

In the appended claims, the word "said" rather than the word "the" is used to indicate the existence of an antecedent basis for a term being provided earlier in the claims. The word "the" is used for purposes other than to indicate the existence of an antecedent basis for a term having being provided earlier in the claims, the usage of the word "the" for other purposes being consistent with customary grammar in the American English language.

What is claimed is:
1. Receiver apparatus for digital television signals that transmit via an orthogonal frequency-division modulated carrier wave of electromagnetic energy successive shortened Reed-Solomon (RS) codewords encoding respective lateral-data packets, selected ones of which shortened RS codewords have had their bits ONEs' complemented, said receiver apparatus comprising:
a tuner for converting a selected orthogonal frequency-division modulated carrier wave of electromagnetic energy modulated in accordance with a digital television signal to a baseband digital television signal;
a decoder for decoding forward-error-correction coding of bits of said baseband digital television signal, thus to recover byte-interleaved shortened RS codewords, selected ones of which shortened RS codewords were transmitted after having had their bits ONEs' complemented;

a byte de-interleaver for de-interleaving said byte-interleaved shortened RS codewords, thus to recover successive shortened RS codewords, selected ones of which were transmitted after having had their bits ONEs' complemented;

RS decoding apparatus configured for determining whether each of said successive shortened RS codewords was transmitted after said having had its bits ONEs' complemented, attempting to decode each of said successive shortened RS codewords to reproduce with possible corrections of any erroneous bytes therein a respective lateral-data packet coded within each of said successive shortened RS codewords whether or not that said successive shortened RS codeword had the bits thereof ONEs' complemented before its transmission, and determining which ones of said respective lateral-data packets as so reproduced are correct for being free of any detectable byte errors in bytes thereof; and further receiving apparatus for utilizing ones of said lateral-data packets as so reproduced by said RS decoding apparatus, including at least those that are determined to be correct.

2. Receiver apparatus for digital television signals transmitting via a carrier wave of electromagnetic energy successive shortened Reed-Solomon (RS) codewords encoding respective data packets, selected ones of which shortened RS codewords have had their bits ONEs' complemented, said receiver apparatus comprising:

a tuner for converting a selected carrier wave of electromagnetic energy modulated in accordance with a digital television signal to a baseband digital television signal;

a decoder for decoding forward-error-correction coding of bits of said baseband digital television signal, thus to recover byte-interleaved shortened RS codewords, selected ones of which shortened RS codewords were transmitted after having had their bits ONEs' complemented;

a byte de-interleaver for de-interleaving said byte-interleaved shortened RS codewords, thus to recover successive shortened RS codewords, selected ones of which were transmitted after having had their bits ONEs' complemented;

exclusive-ORing apparatus for exclusive ORing the hard data bit of each soft-decision from said byte de-interleaver response with the bits expressing the level of confidence in that hard data bit, thus to generate bits expressive of an absolute value of the level of lack-of-confidence in that hard data bit;

apparatus for selecting the largest absolute value of the level of lack-of-confidence in the eight hard data bits of each byte of said of successive shortened RS codewords to be ascribed to that byte as the absolute value of the level of lack-of-confidence in that byte;

RS decoding apparatus for determining whether each of said successive shortened RS codewords was transmitted after said having had its bits ONEs' complemented, attempting to decode each of said successive shortened RS codewords to reproduce it with possible corrections of any erroneous bytes therein as a respective one of a succession of lateral RS decoding results whether or not that said successive shortened RS codeword had the bits thereof ONEs' complemented before its transmission, and determining whether or not each said lateral RS decoding result is correct for being free of any detectable byte errors in bytes thereof;

an extended-byte-organized memory for temporarily storing bytes of 255 successive ones of said shortened RS codewords supplied as respective ones of said lateral RS decoding results from said RS decoding apparatus together with respective byte extensions descriptive of the absolute values of the levels of lack-of-confidence in the byte that is extended, the byte extensions for bytes of each said shortened RS codeword reproduced by said RS decoding apparatus that is determined to be correct having the lowest possible level of lack-of-confidence therein ascribed to them, the byte extensions for bytes of each said shortened RS codeword reproduced by said RS decoding apparatus that is determined not to be correct having ascribed to them respective levels of lack-of-confidence from said apparatus for selecting the largest absolute value of the level of lack-of-confidence in the eight hard data bits of each byte of said successive shortened RS codewords to be ascribed to that byte as the absolute value of the level of lack-of-confidence in that byte, said extended-byte-organized memory configured for having the extended bytes of said successive shortened RS codewords reproduced by said RS decoding apparatus written to successive rows of extended-byte storage locations therein for temporary storage, said extended-byte-organized memory further configured for having the extended bytes of full-length Reed-Solomon codewords read from or written to respective columns of extended-byte storage locations therein, said extended-byte-organized memory also further configured for having the extended bytes of shortened Reed-Solomon codewords read from or written to respective columns of extended-byte storage locations therein;

a TRS decoder for full-length Reed-Solomon codewords read from respective columns of extended-byte storage locations in said extended-byte-organized memory, said TRS decoder configured for attempting to decode each of said full-length RS codewords not known to be free from discernible byte error to correct every discernible byte error therein, each of said full-length RS codewords having its bytes most probable to be in error located for said TRS decoder depending on absolute values of the levels of lack-of-confidence in them as expressed in their respective extensions, said TRS decoder connected for updating the extended bytes of each full-length RS codeword that it corrects by over-writing the former extended bytes thereof temporarily stored in one of said columns of extended-byte storage locations in said extended-byte-organized memory, in which said updating the byte extensions for bytes of each said full-length RS codeword that said TRS decoder corrects have the lowest possible level of lack-of-confidence therein ascribed to them;

an RS decoder for shortened Reed-Solomon codewords read from respective rows of extended-byte storage locations in said extended-byte-organized memory, said RS decoder configured for attempting to decode each of said shortened RS codewords not known to be free from discernible byte error to correct every discernible byte error therein, each of said shortened RS codewords having its bytes most probable to be in error located for said RS decoder depending on absolute values of the levels of lack-of-confidence in them as expressed in their respective extensions, said RS decoder connected for updating the extended bytes of each shortened RS codeword that it corrects by over-writing the former extended bytes thereof temporarily stored in one of said rows of extended-byte storage locations in said extended-byte-organized memory, in which said updating the byte extensions for bytes of each said shortened RS codeword that said RS decoder corrects have the lowest possible level of lack-of-confidence therein ascribed to them;

an IPE packet selector for selectively reproducing respective IPE packets from shortened RS codewords read from said extended-byte-organized memory after TRS-decoding and RS-decoding procedures concerning them have been completed; and apparatus for utilizing ones of said lateral-data packets selectively reproduced by said IPE packet selector.

3. Receiver apparatus as set forth in claim 2, wherein said apparatus for utilizing ones of said lateral-data packets selectively reproduced by said IPE packet selector comprises:

a data de-randomizer connected for de-randomizing data from said lateral-data packets that have been subjected to further correction by said TRS decoder, thus to generate respective packets of de-randomized data;

an IP-packet parsing unit for parsing successive internet-protocol (IP) packets transported by successive ones of said packets of de-randomized data;

a CRC decoder for decoding cyclic redundant coding (CRC) of said successive IP packets as parsed by said IP-packet parsing unit, thus to generate indications as to whether or not each of said successive IP packets is apt to be correct; and apparatus for utilizing ones of said successive IP packets indicated as being apt to be correct.

4. Receiver apparatus for digital television signals that transmit via an orthogonal frequency-division modulated carrier wave of electromagnetic energy successive shortened Bose-Chaudhuri-Hocquenghem (BCH) codewords encoding respective data packets, selected ones of which shortened BCH codewords have had their bits ONEs' complemented, said receiver apparatus comprising:

a tuner for converting a selected orthogonal frequency-division modulated carrier wave of electromagnetic energy modulated in accordance with a digital television signal to a baseband digital television signal;

a decoder to decode forward-error-correction (FEC) coding of bits of said baseband digital television signal, thus to recover shortened BCH codewords, selected ones of which shortened BCH codewords were transmitted after having had their bits ONEs' complemented;

BCH decoding apparatus configured for determining whether each of said successive shortened BCH codewords was transmitted after said having had its bits ONEs' complemented, attempting to decode each of said successive shortened BCH codewords to reproduce with possible corrections of any erroneous bytes therein a respective lateral-data packet coded within each of said successive shortened BCH codewords whether or not that said successive shortened BCH codeword had the bits thereof ONEs' complemented before its transmission, and determining which ones of said respective data packets as so reproduced are correct for being free of any detectable byte errors in bytes thereof; and further receiving apparatus for utilizing ones of said data packets as so reproduced by said BCH decoding apparatus, including at least those that are determined to be correct.

5. Receiver apparatus for digital television signals that transmit via a carrier wave of electromagnetic energy successive shortened Bose-Chaudhuri-Hocquenghem (BCH) codewords encoding respective data packets, selected ones of which shortened BCH codewords have had their bits ONEs' complemented, said receiver apparatus comprising:

a tuner for converting a selected carrier wave of electromagnetic energy modulated in accordance with a digital television signal to a baseband digital television signal;

a decoder to decode forward-error-correction (FEC) coding of bits of said baseband digital television signal, thus to recover shortened BCH codewords, selected ones of which shortened BCH codewords were transmitted after having had their bits ONEs' complemented;

BCH decoding apparatus configured for determining whether each of said successive shortened BCH codewords was transmitted after said having had its bits ONEs' complemented, attempting to decode each of said successive shortened BCH codewords to reproduce with possible corrections of any erroneous bytes therein a respective lateral-data packet coded within each of said successive shortened BCH codewords whether or not that said successive shortened BCH codeword had the bits thereof ONEs' complemented before its transmission, and determining which ones of said respective data packets as so reproduced are correct for being free of any detectable byte errors in bytes thereof, wherein said BCH decoding apparatus is particularly configured for attempting to decode each of said successive shortened BCH codewords, both as if it were transmitted after having had its bits ONEs' complemented and if it were transmitted without having had its bits ONEs' complemented, and for determining from any successful result of attempting to decode each of said successive shortened BCH codewords, whether it were transmitted after having had its bits ONEs' complemented or were transmitted without having had its bits ONEs' complemented; and further receiving apparatus for utilizing ones of said data packets as so reproduced by said BCH decoding apparatus, including at least those that are determined to be correct.

6. Receiver apparatus as set forth in claim 5, wherein said BCH decoding apparatus comprises:

a first BCH decoder for shortened BCH codewords connected for decoding successive ones of said shortened BCH codewords recovered by said decoder to decode FEC coding of bits of said baseband digital television signal and for correcting insofar as possible any erroneous bits within data packets conveyed by respective ones of these successive ones of said shortened BCH codewords, said first BCH decoder configured for supplying said respective data packets as possibly corrected together with respective indications as to whether each said data packet supplied from said first BCH decoder is free from detectable error;

a logic inverter connected for ONE's complementing each bit of said successive shortened BCH codewords recovered by said decoder to decode FEC coding of bits of said baseband digital television signal, thus to generate a logic-inverter response;

a second BCH decoder for shortened BCH codewords connected for decoding successive ones of said shortened BCH codewords supplied in said logic-inverter response and for correcting insofar as possible any erroneous bits within data packets contained within respective ones of these successive ones of said shortened BCH codewords, said second decoder for shortened BCH codewords configured for supplying said respective data packets as possibly corrected together with respective indications as to whether each said data packet supplied from said second decoder for shortened BCH codewords is free from any detectable errors; and a selector for selectively reproducing in a selector response therefrom one of each pair of data packets concurrently supplied thereto from said first decoder for shortened BCH codewords and from said second decoder for shortened BCH codewords respectively, said selector conditioned by each indication that one of said data packets being supplied from said first decoder for shortened BCH codewords is free from any detectable error for reproducing in said selector response therefrom that said data packet being supplied from said first decoder, said selector conditioned by each indication that one of said data packets being supplied from said second decoder for shortened BCH codewords is free from any detectable errors for reproducing in said selector response therefrom that said data packet being supplied from said second decoder.

7. Receiver apparatus as set forth in claim 5, wherein said BCH decoding apparatus comprises:

a first BCH decoder for shortened BCH codewords connected for lengthening successive ones of said shortened BCH codewords by prepending each of them with a respective sequence of ZEROes, for decoding said shortened BCH codewords prepended by respective sequences of ZEROes, and for correcting insofar as possible any erroneous bits within data packets conveyed by respective ones of these successive ones of said shortened BCH codewords prepended by respective sequences of ZEROes, said first BCH decoder configured for supplying said respective data packets as possibly corrected together with respective indications as to whether each said data packet supplied from said first BCH decoder is free from detectable error;

a second BCH decoder for shortened BCH codewords connected for lengthening successive ones of said shortened BCH codewords by prepending each of them with a respective sequence of ONEs, for decoding said shortened BCH codewords prepended by respective sequences of ONEs, and for correcting insofar as possible any erroneous bits within data packets conveyed by respective ones of these successive ones of said shortened BCH codewords prepended by respective sequences of ONEs, said second BCH decoder configured for supplying said respective data packets as possibly corrected together with respective indications as to whether each said data packet supplied from said second BCH decoder is free from detectable error;

a logic inverter connected for ONE's complementing all the bits of each of said data packets recovered by said second BCH decoder, thus to generate a respective logic-inverter response; and a selector for selectively reproducing in a selector response therefrom one of each pair of data packets concurrently supplied thereto from said first decoder for shortened BCH codewords and from said logic inverter respectively, said selector conditioned by each indication that one of said data packets being supplied from said first decoder for shortened BCH codewords is free from any detectable error for reproducing in said selector response therefrom that said data packet being supplied from said first decoder, said selector conditioned by each indication that one of said data packets being supplied from said second decoder for shortened BCH codewords is free from any detectable errors for reproducing in said selector response therefrom the logic-inverter response to that said data packet supplied from said second decoder for shortened BCH codewords.

8. Receiver apparatus for digital television signals that transmit via a carrier wave of electromagnetic energy successive shortened Reed-Solomon (RS) codewords encoding respective lateral-data packets, selected ones of which shortened RS codewords have had their bits ONEs' complemented, said receiver apparatus comprising:

a tuner for converting a selected carrier wave of electromagnetic energy modulated in accordance with a digital television signal to a baseband digital television signal;

a decoder for decoding forward-error-correction coding of bits of said baseband digital television signal, thus to recover byte-interleaved shortened RS codewords, selected ones of which shortened RS codewords were transmitted after having had their bits ONEs' complemented;

a byte de-interleaver for de-interleaving said byte-interleaved shortened RS codewords, thus to recover successive shortened RS codewords, selected ones of which were transmitted after having had their bits ONEs' complemented;

RS decoding apparatus configured for determining whether each of said successive shortened RS codewords was transmitted after said having had its bits ONEs' complemented, attempting to decode each of said successive shortened RS codewords to reproduce with possible corrections of any erroneous bytes therein a respective lateral-data packet coded within each of said successive shortened RS codewords whether or not that said successive shortened RS codeword had the bits thereof ONEs' complemented before its transmission, and determining which ones of said respective lateral-data packets as so reproduced are correct for being free of any detectable byte errors in bytes thereof, wherein said RS decoding apparatus is particularly configured for attempting to decode each of said successive shortened RS codewords, both as if it were transmitted after having had its bits ONEs' complemented and if it were transmitted without having had its bits ONEs' complemented, and for determining from any successful result of attempting to decode each of said successive shortened RS codewords, whether it were transmitted after having had its bits ONEs' complemented or were transmitted without having had its bits ONEs' complemented; and further receiving apparatus for utilizing ones of said lateral-data packets as so reproduced by said RS decoding apparatus, including at least those that are determined to be correct.

9. Receiver apparatus as set forth in claim 8, wherein said RS decoding apparatus comprises:

a first RS decoder for shortened RS codewords connected for lengthening successive ones of said shortened RS codewords by prepending each of them with a respective sequence of ZEROes, for decoding said shortened RS codewords prepended by respective sequences of ZEROes, and for correcting insofar as possible any erroneous bits within data packets conveyed by respective ones of these successive ones of said shortened RS codewords prepended by respective sequences of ZEROes, said first RS decoder configured for supplying said respective data packets as possibly corrected together with respective indications as to whether each said data packet supplied from said first RS decoder is free from detectable error;

a second RS decoder for shortened RS codewords connected for lengthening successive ones of said shortened RS codewords by prepending each of them with a respective sequence of ONEs, for decoding said shortened RS codewords prepended by respective sequences of ONEs, and for correcting insofar as possible any erroneous bits within data packets conveyed by respective ones of these successive ones of said shortened RS codewords prepended by respective sequences of ONEs, said second RS decoder configured for supplying said respective data packets as possibly corrected together with respective indications as to whether each said data packet supplied from said second RS decoder is free from detectable error;

a logic inverter connected for ONE's complementing all the bits of each of said data packets recovered by said second RS decoder, thus to generate a respective logic-inverter response; and a selector for selectively reproducing in a selector response therefrom one of each pair of data packets concurrently supplied thereto from said first decoder for shortened RS codewords and from said logic inverter respectively, said selector conditioned by each indication that one of said data packets being supplied from said first decoder for shortened RS codewords is free from any detectable error for reproducing in said selector response therefrom that said data packet being supplied from said first decoder, said selector conditioned by each indication that one of said data packets being supplied from said second decoder for shortened RS codewords is free from any detectable errors for reproducing in said selector response therefrom the logic-inverter response to that said data packet supplied from said second decoder for shortened RS codewords.

10. Receiver apparatus as set forth in claim 8, wherein said RS decoding apparatus comprises a first RS decoder connected for decoding successive ones of said shortened RS codewords recovered by said byte de-interleaver and for correcting insofar as possible any erroneous bytes in lateral-data packets contained within respective ones of said successive ones of said shortened RS codewords recovered by said byte de-interleaver, said first RS decoder configured for supplying said respective lateral-data packets as possibly corrected together with respective indications as to whether each said lateral-data packet supplied from said first RS decoder is free from detectable error in bytes thereof;

a logic inverter connected for ONE's complementing each bit of said successive shortened RS codewords recovered by said byte de-interleaver, thus to generate a logic-inverter response;

a second RS decoder connected for decoding successive ones of said shortened RS codewords supplied in said logic-inverter response and for correcting insofar as possible any erroneous bytes in lateral-data packets contained within respective ones of those successive ones of said shortened RS codewords supplied in said logic-inverter response, said second RS decoder configured for supplying said respective packets of randomized data as possibly corrected together with respective indications as to whether each said packet of randomized data supplied from said second RS decoder is free from any detectable error in bytes thereof;

a selector for selectively reproducing in a selector response therefrom one of each pair of lateral-data packets concurrently supplied thereto from said first RS decoder and from said second RS decoder respectively, said selector conditioned by each indication that one of said lateral-data packets being supplied from said first RS decoder is free from any detectable error in its bytes for reproducing in said selector response therefrom that said lateral-data packet being supplied from said first RS decoder, said selector conditioned by each indication that one of said lateral-data packets being supplied from said second RS decoder is free from any detectable error in its bytes for reproducing in said selector response therefrom that said lateral-data packet being supplied from said second RS decoder.

11. Receiver apparatus as set forth in claim 8, wherein said RS decoding apparatus comprises:

a first RS decoder connected for decoding successive ones of said shortened RS codewords recovered by said byte de-interleaver and for correcting insofar as possible any erroneous bytes in lateral-data packets contained within respective ones of said successive ones of said shortened RS codewords recovered by said byte de-interleaver, said first RS decoder configured for supplying said respective lateral-data packets as possibly corrected together with respective indications as to whether each said lateral-data packet supplied from said first RS decoder is free from detectable error in bytes thereof;

a logic inverter connected for ONE's complementing each bit of said successive shortened RS codewords recovered by said byte de-interleaver, thus to generate a logic-inverter response;

a second RS decoder connected for decoding successive ones of said shortened RS codewords supplied in said logic-inverter response and for correcting insofar as possible any erroneous bytes in lateral-data packets contained within respective ones of these successive ones of said shortened RS codewords supplied in said logic-inverter response, said second RS decoder configured for supplying said respective lateral-data packets as possibly corrected together with respective indications as to whether each said lateral-data packet supplied from said first RS decoder is free from detectable error in bytes thereof;

apparatus for analyzing the respective headers of each pair of lateral-data packets concurrently supplied thereto from said first RS decoder and from said second RS decoder respectively, for supplying indications of when selected bits in the header of the lateral-data packets being supplied thereto from said first RS decoder have at least mostly standard values prescribed for those bits, and for supplying indications of when selected bits in the header of the lateral-data packets being supplied thereto from said second RS decoder have at least mostly said standard values prescribed for those bits; and a selector for selectively reproducing in a selector response therefrom one of each pair of lateral-data packets concurrently supplied thereto from said first RS decoder and from said second RS decoder respectively, said selector conditioned for reproducing in said selector response therefrom that said lateral-data packet being currently supplied thereto from said first RS decoder responsive to each indication that said lateral-data packet being currently supplied from said first RS decoder is free from detectable error in its bytes or to each indication that selected bits in the header of that said lateral-data packet being currently supplied from said first RS decoder have at least mostly standard values prescribed for those bits, said selector conditioned for reproducing in said selector response therefrom that said lateral-data packet being currently supplied thereto from said second RS decoder responsive to each indication that said data packet being currently supplied from said second RS decoder is free from detectable error in its bytes or to each indication that selected bits in the header of said lateral-data packet being currently supplied from said second RS decoder have at least mostly standard values prescribed for those bits.

12. Receiver apparatus as set forth in claim 8, further comprising:

exclusive-ORing apparatus for exclusive ORing the hard data bit of each soft-decision from said byte de-interleaver response with the bits expressing the level of confidence in that hard data bit, thus to generate bits expressive of an absolute value of the level of lack-of-confidence in that hard data bit;

apparatus for selecting the largest absolute value of the level of lack-of-confidence in the eight hard data bits of each byte of said of successive shortened RS codewords to be ascribed to that byte as the absolute value of the level of lack-of-confidence in that byte; and a threshold detector for selecting a prescribed number of largest absolute values of the levels of lack-of-confidence in the bytes of each of said successive shortened RS codewords, thus to locate probable byte errors in each of said successive shortened RS codewords; in which said receiver apparatus said attempting by said RS decoding apparatus to decode each of said successive shortened RS codewords includes an attempt to perform erasure decoding with erasures of its bytes most probable to be in error as located by said threshold detector.

13. Receiver apparatus as set forth in claim 12, wherein said further receiving apparatus comprises:

an extended-byte-organized memory for temporarily storing bytes of two hundred fifty-five successive ones of said lateral-data packets reproduced by said RS decoding apparatus together with respective byte extensions descriptive of the absolute values of the levels of lack-of-confidence in the byte that is extended, the byte extensions for bytes of each said lateral-data packet reproduced by said RS decoding apparatus that is determined to be correct having the lowest possible level of lack-of-confidence therein ascribed to them, the byte extensions for bytes of said lateral-data packets reproduced by said RS decoding apparatus that are determined not to be correct having ascribed to them respective levels of lack-of-confidence from said apparatus for selecting the largest absolute value of the level of lack-of-confidence in the eight hard data bits of each byte of said successive shortened RS codewords to be ascribed to that byte as the absolute value of the level of lack-of-confidence in that byte, said extended-byte-organized memory configured for having the extended bytes of said successive lateral-data packets written to successive rows of extended-byte storage locations therein for temporary storage, said extended-byte-organized memory configured for having extended bytes read from successive columns of said extended-byte storage locations therein for decoding of transverse Reed-Solomon (TRS) coding;

a TRS decoder for full-length Reed-Solomon codewords read from respective columns of extended-byte storage locations in said extended-byte-organized memory, said TRS decoder configured for decoding each of said full-length RS codewords having its bytes most probable to be in error located depending on absolute values of the levels of lack-of-confidence in them as expressed in their respective extensions, said TRS decoder configured for supplying a respective transverse-data packet responsive to each said full-length RS codeword read from said extended-byte-organized memory;

a byte-organized memory having byte storage locations therein for temporarily storing bytes of transverse-data packets as written from said TRS decoder to columns of said byte storage locations therein respectively, said byte-organized memory configured for reading bytes temporarily stored in rows of said byte storage locations therein to supply lateral-data packets that have been subjected to further correction by said TRS decoder; and apparatus for utilizing ones of said lateral-data packets that have been subjected to further correction by said TRS decoder.

14. Receiver apparatus as set forth in claim 13, wherein said apparatus for utilizing ones of said lateral-data packets that have been subjected to further correction by said TRS decoder comprises:

a data de-randomizer connected for de-randomizing data from said lateral-data packets that have been subjected to further correction by said TRS decoder, thus to generate respective packets of de-randomized data;

an IP-packet parsing unit for parsing successive internet-protocol (IP) packets transported by successive ones of said packets of de-randomized data;

a CRC decoder for decoding cyclic redundant coding (CRC) of said successive IP packets as parsed by said IP-packet parsing unit, thus to generate indications as to whether or not each of said successive IP packets is apt to be correct; and apparatus for utilizing ones of said successive IP packets indicated as being apt to be correct.

15. Receiver apparatus as set forth in claim 8, wherein said RS decoding apparatus includes an RS codeword memory and is configured to perform the following steps of a method for decoding soft-decisions concerning bits of shortened RS codewords thus to recover lateral-data packets:

separating the hard data bit of each of said soft-decisions concerning bits of shortened RS codewords from the bits regarding the level of confidence that hard bit is correct;

exclusive-ORing the each hard bit as so separated with the bits regarding the level of confidence that hard bit is correct to generate bits defining an absolute value of a level of lack of confidence that said hard bit as so separated is correct;

ascertaining the largest level of lack of confidence that the eight bits in each byte of said shortened RS codewords have, which is ascribed to that byte in its entirety as a respective level of lack of confidence as to that byte being correct;

determining a number of the bytes in each shortened RS codeword that have the highest levels of lack of confidence associated therewith;

temporarily storing in said RS codeword memory the bytes of each successive shortened RS codeword resulting from said de-interleaving of said byte-interleaved shortened RS codewords, together with respective byte extensions expressing the respective levels of lack of confidence as to each of those bytes being correct, and together with respective further byte extensions flagging the bytes in each shortened RS codeword that have the highest levels of lack of confidence associated therewith;

attempting initially to decode each successive shortened RS codeword temporarily stored in said RS codeword memory as though it were transmitted as a TRUE shortened RS codeword;

if said step of initially attempting to decode a shortened RS codeword as though it were transmitted as a TRUE shortened RS codeword results in recovery of a lateral-data packet free of discernible byte error, forwarding that said lateral-data packet to said further receiving apparatus for utilizing ones of said lateral-data packets;

if said step of initially attempting to decode a shortened RS codeword as though it were transmitted as a TRUE shortened RS codeword does not result in recovery of a lateral-data packet free of discernible byte error, subsequently attempting to decode that said shortened RS codeword as though it were transmitted as a bit-complemented shortened RS codeword; and if said step of subsequently attempting to decode that said shortened RS codeword as though it were transmitted as a bit-complemented shortened RS codeword results in recovery of a lateral-data packet free of discernible byte error, forwarding that said lateral-data packet to said further receiving apparatus for utilizing ones of said lateral-data packets.

16. Receiver apparatus as set forth in claim 15, wherein each said step of subsequently attempting to decode that said shortened RS codeword as though it were transmitted as a bit-complemented shortened RS codeword is performed by respective substeps of:
   bit-complementing that said shortened RS codeword as temporarily stored in said memory; and
   attempting to decode the resulting bit-complemented shortened RS codeword as though it is a TRUE shortened RS codeword.

17. Receiver apparatus as set forth in claim 15, wherein said method for decoding soft-decisions concerning bits of shortened RS codewords thus to recover lateral-data packets further comprises the following steps, if said step of subsequently attempting to decode a shortened RS codeword recovers a lateral-data packet having discernible byte error:
   selecting bits from the header of the lateral-data packet encoded within that said shortened RS codeword having discernible byte error that should have prescribed known values;
   exclusive-ORing each of said selected bits with its respective prescribed known value;
   if and only if most of the results from the just previous steps of exclusive-ORing are mostly ZEROes, forwarding said lateral-data packet having discernible byte error to said further receiving apparatus for utilizing ones of said lateral-data packets.

18. Receiver apparatus as set forth in claim 17, wherein said apparatus for utilizing ones of said lateral-data packets that have been subjected to further correction by said TRS decoder comprises:
   a data de-randomizer connected for de-randomizing data from said lateral-data packets that have been subjected to further correction by said TRS decoder, thus to generate respective packets of de-randomized data;
   an IP-packet parsing unit for parsing successive internet-protocol (IP) packets transported by successive ones of said packets of de-randomized data;
   a CRC decoder for decoding cyclic redundant coding (CRC) of said successive IP packets as parsed by said IP-packet parsing unit, thus to generate indications as to whether or not each of said successive IP packets is apt to be correct; and
   apparatus for utilizing ones of said successive IP packets indicated as being apt to be correct.

19. Receiver apparatus as set forth in claim 15, further comprising:
   exclusive-ORing apparatus for exclusive ORing the hard data bit of each soft-decision from said byte de-interleaver response with the bits expressing the level of confidence in that hard data bit, thus to generate bits expressive of an absolute value of the level of lack-of-confidence in that hard data bit;
   apparatus for selecting the largest absolute value of the level of lack-of-confidence in the eight hard data bits of each byte of said of successive shortened RS codewords to be ascribed to that byte as the absolute value of the level of lack-of-confidence in that byte; and
   a threshold detector for selecting a prescribed number of largest absolute values of the levels of lack-of-confidence in the bytes of each of said successive shortened RS codewords, thus to locate probable byte errors in each of said successive shortened RS codewords; in which said receiver apparatus each said attempting to decode a shortened RS codeword includes an attempt to perform erasure decoding with erasures of its bytes most probable to be in error as located by said threshold detector.

20. Receiver apparatus as set forth in claim 19, wherein said further receiving apparatus comprises:
   an extended-byte-organized memory for temporarily storing bytes of two hundred fifty-five successive ones of said lateral-data packets reproduced by said RS decoding apparatus together with respective byte extensions descriptive of the absolute values of the levels of lack-of-confidence in the byte that is extended, the byte extensions for bytes of each said lateral-data packet reproduced by said RS decoding apparatus that is determined to be correct having the lowest possible level of lack-of-confidence therein ascribed to them, the byte extensions for bytes of said lateral-data packets reproduced by said RS decoding apparatus that are determined not to be correct having ascribed to them respective levels of lack-of-confidence from said apparatus for selecting the largest absolute value of the level of lack-of-confidence in the eight hard data bits of each byte of said successive shortened RS codewords to be ascribed to that byte as the absolute value of the level of lack-of-confidence in that byte, said extended-byte-organized memory configured for having the extended bytes of said successive lateral-data packets written to successive rows of extended-byte storage locations therein for temporary storage, said extended-byte-organized memory configured for having extended bytes read from successive columns of said extended-byte storage locations therein for decoding of transverse Reed-Solomon (TRS) coding;
   a TRS decoder for full-length Reed-Solomon codewords read from respective columns of extended-byte storage locations in said extended-byte-organized memory, said TRS decoder configured for decoding each of said full-length RS codewords having its bytes most probable to be in error located depending on absolute values of the levels of lack-of-confidence in them as expressed in their respective extensions, said TRS decoder configured for supplying a respective transverse-data packet responsive to each said full-length RS codeword read from said extended-byte-organized memory;
   a byte-organized memory having byte storage locations therein for temporarily storing bytes of transverse-data packets as written from said TRS decoder to columns of said byte storage locations therein respectively, said byte-organized memory configured for reading bytes temporarily stored in rows of said byte storage locations therein to supply lateral-data packets that have been subjected to further correction by said TRS decoder; and apparatus for utilizing ones of said lateral-data packets that have been subjected to further correction by said TRS decoder.

21. Receiver apparatus as set forth in claim 20, wherein said apparatus for utilizing ones of said lateral-data packets that have been subjected to further correction by said TRS decoder comprises:

a data de-randomizer connected for de-randomizing data from said lateral-data packets that have been subjected to further correction by said TRS decoder, thus to generate respective packets of de-randomized data;

an IP-packet parsing unit for parsing successive internet-protocol (IP) packets transported by successive ones of said packets of de-randomized data;

a CRC decoder for decoding cyclic redundant coding (CRC) of said successive IP packets as parsed by said IP-packet parsing unit, thus to generate indications as to whether or not each of said successive IP packets is apt to be correct; and apparatus for utilizing ones of said successive IP packets indicated as being apt to be correct.

\* \* \* \* \*